United States Patent
Yamaguchi et al.

(10) Patent No.: US 11,502,479 B2
(45) Date of Patent: Nov. 15, 2022

(54) OPTICAL DEVICE, LIGHT-SOURCE DEVICE, DETECTOR, AND ELECTRONIC DEVICE

(71) Applicants: Toshiya Yamaguchi, Kanagawa (JP); Masami Seto, Osaka (JP)

(72) Inventors: Toshiya Yamaguchi, Kanagawa (JP); Masami Seto, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 258 days.

(21) Appl. No.: 16/893,705

(22) Filed: Jun. 5, 2020

(65) Prior Publication Data

US 2020/0403373 A1 Dec. 24, 2020

(30) Foreign Application Priority Data

Jun. 19, 2019 (JP) .............................. JP2019-114074

(51) Int. Cl.
| | |
|---|---|
| *H01S 5/02326* | (2021.01) |
| *H01S 5/042* | (2006.01) |
| *G01S 7/481* | (2006.01) |
| *H01S 5/42* | (2006.01) |
| *H01S 5/02253* | (2021.01) |

(52) U.S. Cl.
CPC ........ *H01S 5/02326* (2021.01); *G01S 7/4815* (2013.01); *H01S 5/02253* (2021.01); *H01S 5/042* (2013.01); *H01S 5/423* (2013.01)

(58) Field of Classification Search
CPC .. H01S 5/02326; H01S 5/02253; H01S 5/042; H01S 5/423; G01S 7/4815
See application file for complete search history.

(56) References Cited

U.S. PATENT DOCUMENTS

| | | | | |
|---|---|---|---|---|
| 2005/0263841 | A1* | 12/2005 | Fincato | G02B 6/424 257/433 |
| 2007/0058904 | A1* | 3/2007 | Ban | G02B 6/4204 385/52 |
| 2007/0126010 | A1* | 6/2007 | Chua | H01L 31/02327 257/E31.127 |
| 2014/0211302 | A1 | 7/2014 | Hatashita et al. | |
| 2016/0043528 | A1* | 2/2016 | Adachi | G02B 3/0056 359/741 |
| 2020/0166768 | A1* | 5/2020 | Yoneda | H01S 5/423 |

FOREIGN PATENT DOCUMENTS

| | | | |
|---|---|---|---|
| EP | 3093934 A1 * | 11/2016 | ......... B23K 26/0648 |
| JP | 2014-145868 | 8/2014 | |
| JP | 2014-192166 | 10/2014 | |

* cited by examiner

*Primary Examiner* — Yuanda Zhang
(74) *Attorney, Agent, or Firm* — IPUSA, PLLC

(57) ABSTRACT

An optical device and a light-source device. The optical device includes a first substrate having a first plane and elements, and a second substrate having a second face that faces the first plane. The elements are disposed on the first substrate to emit or receive light in a direction intersecting with the first plane. The second substrate includes lenses disposed to correspond to the elements, and the second substrate extends in a first direction parallel to the second face to contact the first plane. The second substrate has a joint used to determine spacing between the first substrate and the second substrate, and the joint contacts the first substrate with an area smaller than a maximum size of cross-sectional area parallel to the second face of the joint. The light-source device includes the optical device and a driver to drive the optical device.

10 Claims, 50 Drawing Sheets

FIG. 5
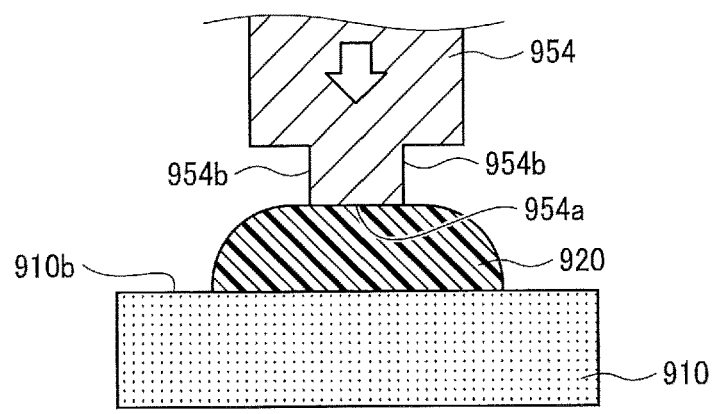
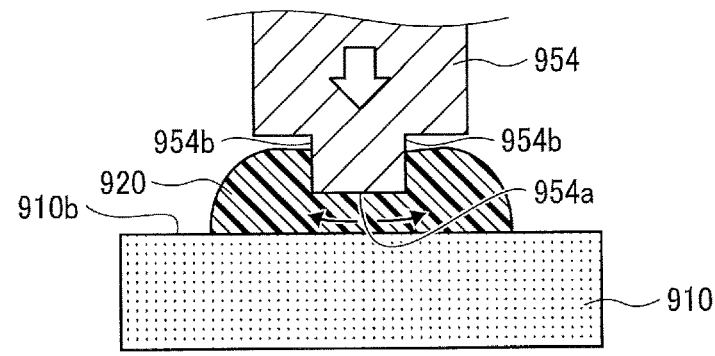
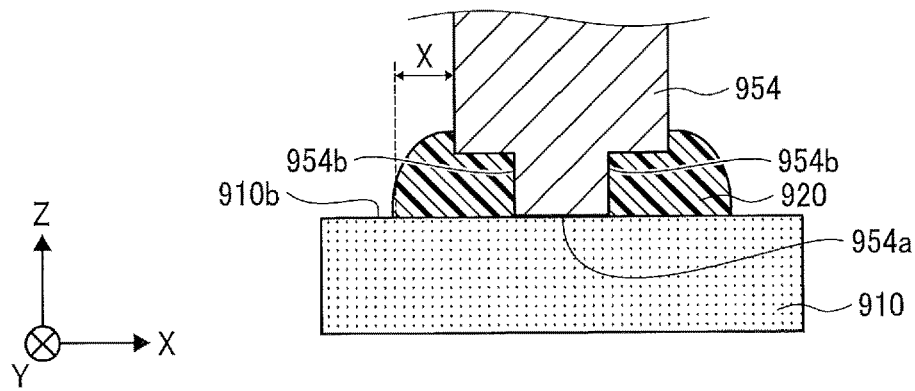

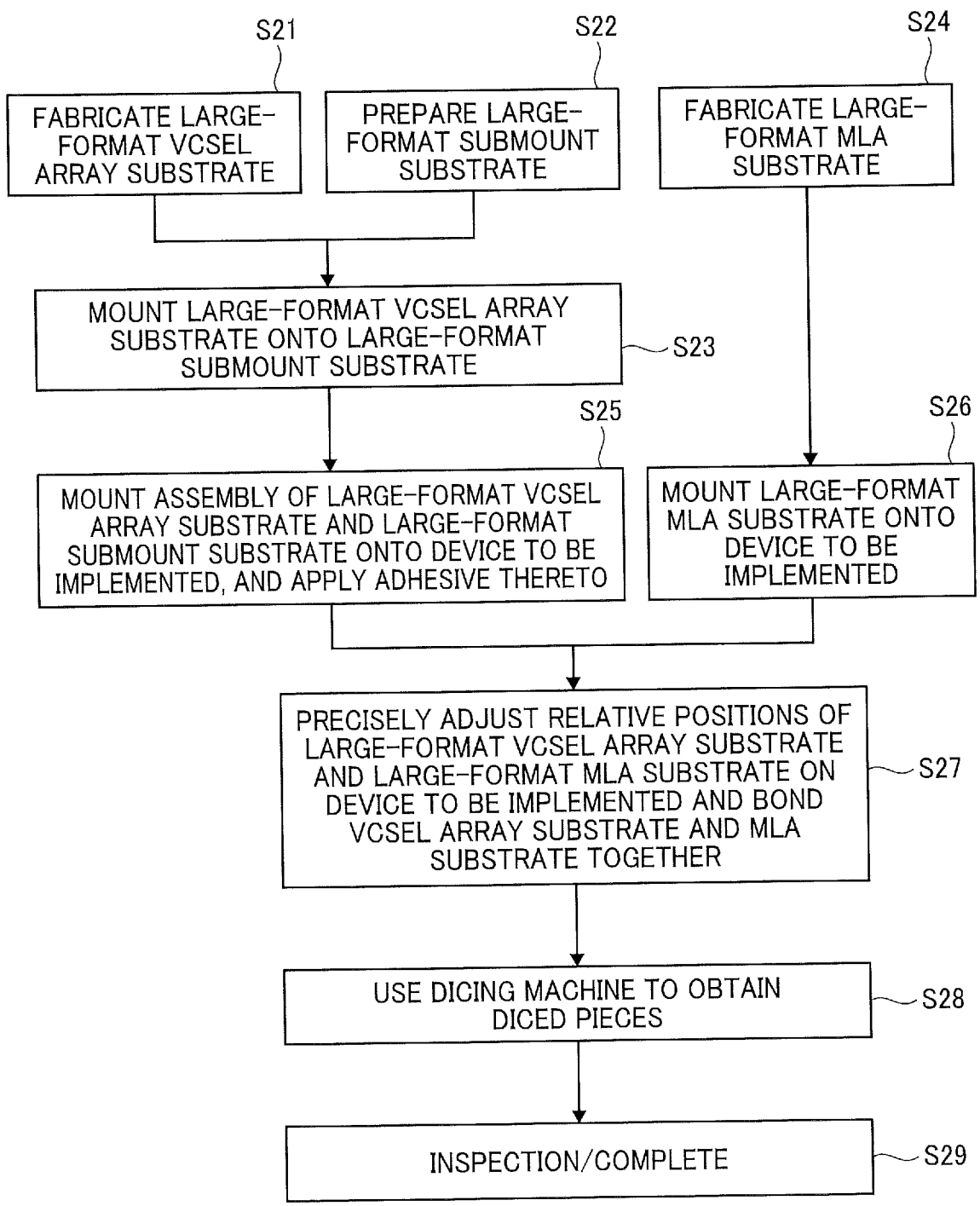

OPTICAL DEVICE, LIGHT-SOURCE DEVICE, DETECTOR, AND ELECTRONIC DEVICE

CROSS-REFERENCE TO RELATED APPLICATION

This patent application is based on and claims priority pursuant to 35 U.S.C. §119(a) to Japanese Patent Application No. 2019-114074, filed on Jun. 19, 2019, in the Japan Patent Office, the entire disclosure of which is hereby incorporated by reference herein.

BACKGROUND

Technical Field

Embodiments of the present disclosure relate to an optical device, a light-source device, a detector, and an electronic device.

Background Art

In the known processes of manufacturing an on-vehicle ignition system including a vertical cavity-surface emitting laser (VCSEL) device, at least a pair of substrates are bonded and fixed together in a direct manner using adhesive such as an ultraviolet (UV)-curable resin and the relative positions of these substrates are adjusted.

SUMMARY

Embodiments of the present disclosure described herein provide an optical device and a light-source device. The optical device includes a first substrate having a first plane and a plurality of elements, the elements being disposed on the first substrate to emit or receive light in a direction intersecting with the first plane, and a second substrate having a second face that faces the first plane. The second substrate is provided with a plurality of lenses disposed to correspond to the elements, and the second substrate extends in a first direction parallel to the second face to contact the first plane. The second substrate has a joint used to determine spacing between the first substrate and the second substrate, and the joint contacts the first substrate with an area smaller than a maximum size of cross-sectional area parallel to the second face of the joint. The light-source device includes the optical device and a driver configured to drive the optical device, and each one of the elements is an element to emit light.

BRIEF DESCRIPTION OF THE DRAWINGS

A more complete appreciation of embodiments and the many attendant advantages thereof will be readily obtained as the same becomes better understood by reference to the following detailed description when considered in connection with the accompanying drawings.

FIG. 5 is a sectional view indicative of how adhesive behaves when a spacer according to a fourth example is adopted.

FIG. 30 is a flowchart of the processes of a method of manufacturing an optical device, according to the second embodiment of the present disclosure.

Figure 1A:
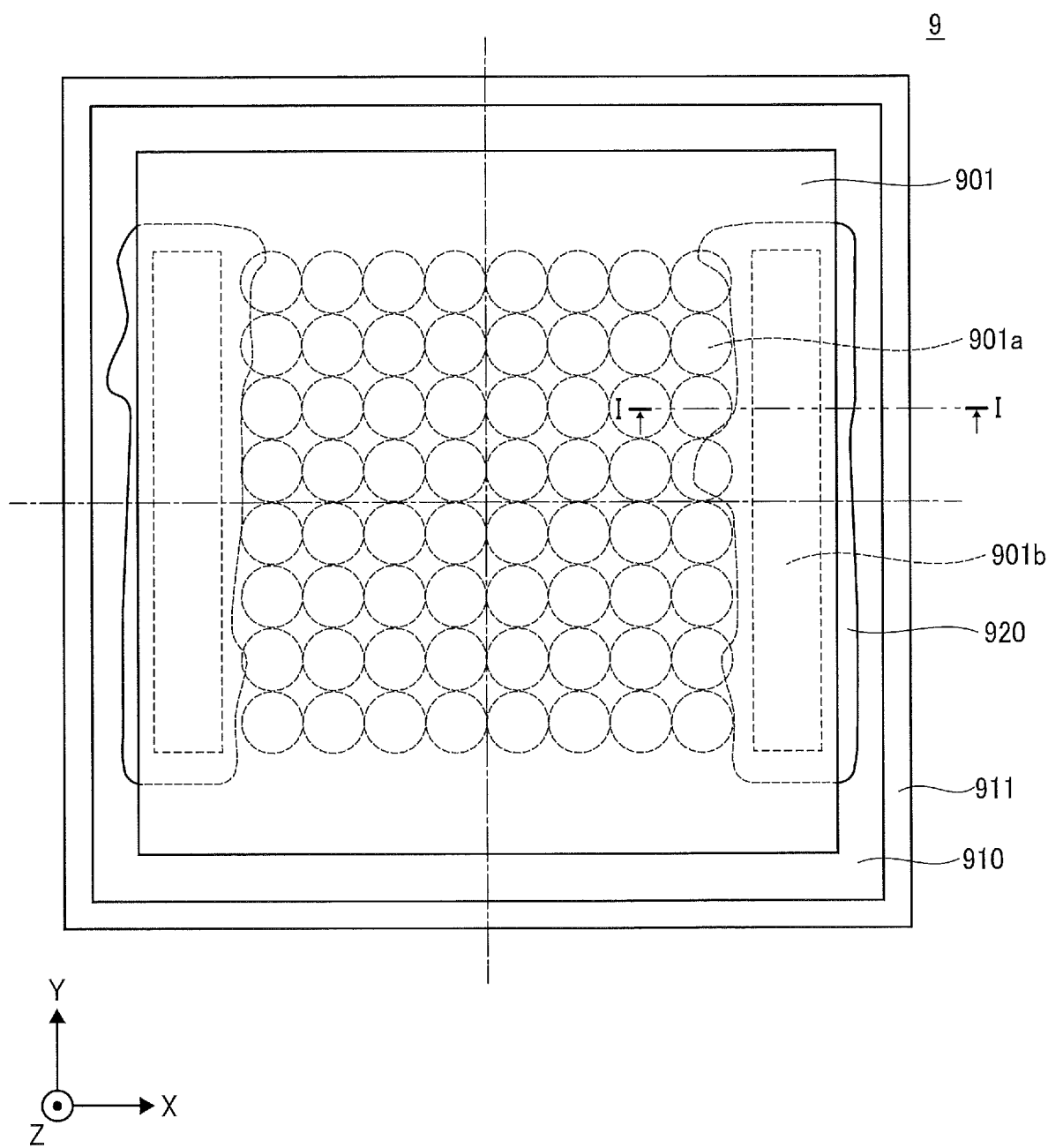
FIG. 1A is a top view of an optical device according to a control sample of embodiments of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

Embodiments of the present disclosure are described below in detail with reference to the accompanying drawings. Note that in the description and the drawings of the embodiments of the present disclosure, like reference signs are given to elements with substantially the same functional configuration. Accordingly, overlapping descriptions are omitted where appropriate. In the following description of the present disclosure, it is assumed that the direction in which an optical device emits light is the Z-axis direction, and that the two directions orthogonal to each other on a plane perpendicular to the Z-axis direction using a right-hand system are the X-axis direction and the Y-axis direction. Moreover, it is assumed that the +Z-axis direction is on the upper side. However, no limitation is indicated thereby, and such an optical device or the like may be used under upside-down conditions, or may be arranged at any desired angle.

Firstly, the gist of the present disclosure is described below with reference to control samples.

The role of each microlens is to control the angle of radiation of the laser beam that is emitted from a vertical cavity-surface emitting laser (VCSEL) device. In order to achieve such functions, the relative positions of the VCSEL device and the microlenses need to be adjusted to minimize the positional displacement between the center of the light-emitting point of the VCSEL device and the center of each microlens. Moreover, as a matter of course, the distance between the light-emitting point of the VCSEL device and each lens needs to be matched with a design value. For example, when the distance between a VCSEL array substrate on which a plurality of VCSEL devices are arrayed and a microlens array (MLA) substrate on which a plurality of microlenses are arrayed takes a value greater than a design value, there are some cases in which a laser beam that is emitted from a different VCSEL device is incident on a microlens that is arranged for a particular corresponding VCSEL device and stray light emerges. On the contrary, when the distance between the VCSEL array substrate and the MLA substrate takes a value smaller than a design value, there are some cases in which the angle of radiation of the laser beam that has passed a microlens becomes wider than necessary. When the distance between the VCSEL array substrate and the MLA substrate is uneven, the angle of radiation tends to differ for every VCSEL device. In particular, when the VCSEL array substrate and the MLA substrate are bonded together in a state of wafer, the control of distance tends to be difficult.

In order to handle such a situation, an MLA substrate may be provided with some spacers each of which has even height and the VCSEL array substrate and the MLA substrate may be bonded together through those spacers.

FIG. 1A is a top view of an optical device 9 according to a control sample of embodiments of the present disclosure.

Figure 1B:
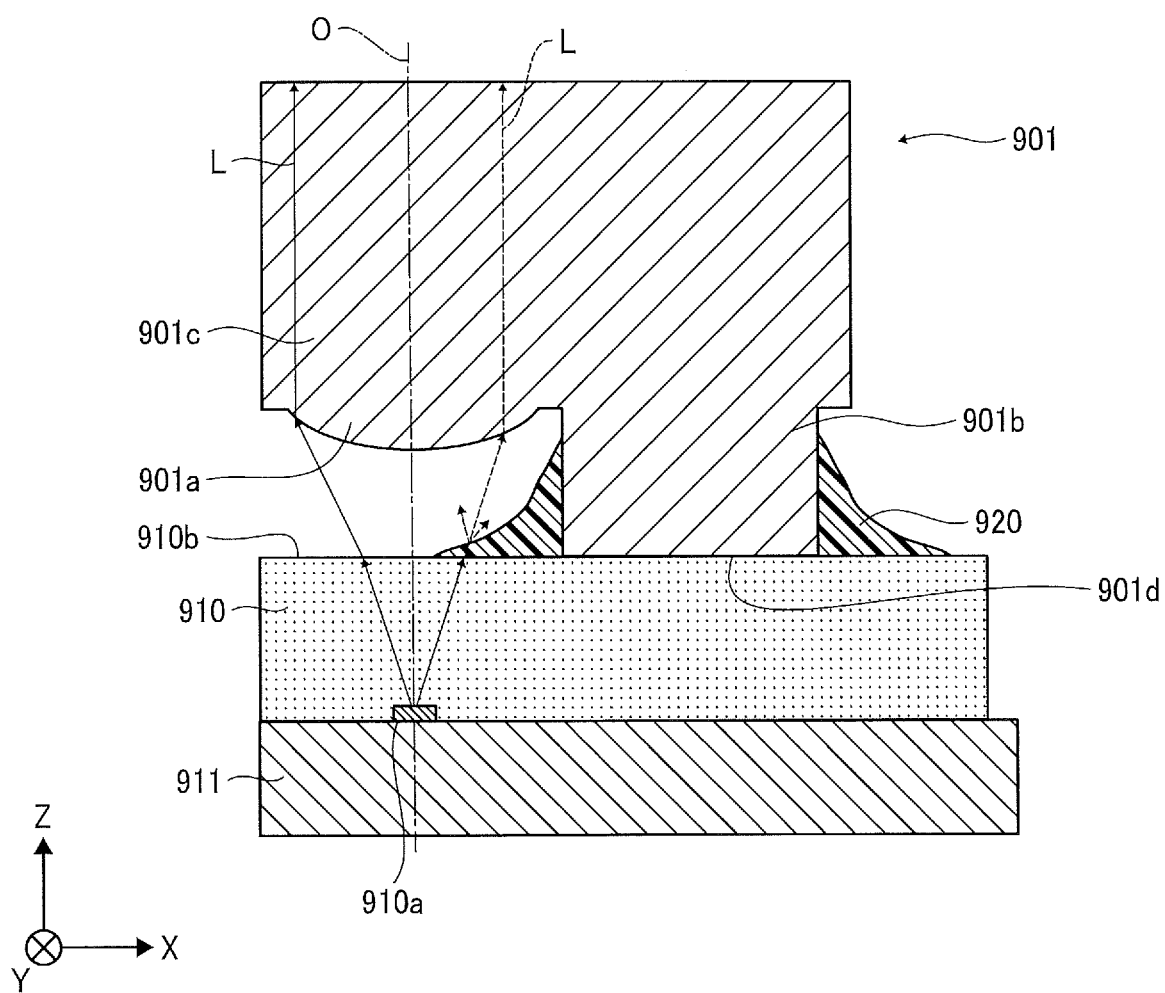
FIG. 1B is a sectional view of an optical device according to a control sample of embodiments of the present disclosure.

FIG. 1B is a sectional view of the optical device 9 according to the present control sample of embodiments of the present disclosure.

More specifically, FIG. 1B is a diagram illustrating a cross-sectional view along line I-I of FIG. 1A.

The optical device 9 according to the control sample as illustrated in FIG. 1A and FIG. 1B includes a microlens array (MLA) substrate 901 provided with a base 901c, a plurality of microlenses 901a, and a pair of spacers 901b. Each of the spacers 901b is shaped like a rectangular parallelepiped that extends in the Y-axis direction. The pair of spacers 901b are arranged on both sides of the MLA that is composed of the microlenses 901a in the X-axis directions. A VCSEL array substrate 910 is arranged on a submount substrate 911. The VCSEL array substrate 910 includes a plurality of VCSEL devices 910a. Moreover, a bottom face 901d of each of the spacers 901b contacts a top face 910b of the VCSEL array substrate 910. The pair of spacers 901b are fixed to the VCSEL array substrate 910 by adhesive 920.

With the optical device 9 according to the present control sample, the distance between the VCSEL array substrate 910 and the MLA substrate 901 can be stabilized due to the spacers 90 1b. However, when the VCSEL array substrate 910 and the MLA substrate 901 are bonded together, the spacers 901b squeeze the adhesive 920, and the shape of the squeezed-out adhesive 920 may be distorted. When the MLA substrate 901 is bonded onto the VCSEL array substrate 910 with inclination, the adhesive 920 sticks out to one side in a greater amount than to the other side of the joint, and the amount of the spread of the adhesive 920 is unbalanced. In order to achieve downsizing, it is desired that the distance between the light-emitting area and the bonding area be narrow. However, when the adhesive 920 that is squeezed out from the spacers 901b is spread out to the light-emitting unit of the VCSEL device 910a or the lens unit of the MLA substrate 901, the optical properties deteriorate. For example, as illustrated in FIG. 1B, the adhesive 920 may partly block the route of the laser beams L that are emitted from the VCSEL device 910a. In such cases, the laser beams L may be reflected or absorbed by the adhesive 920.

For this reason, the shape of the adhesive that is used to fix spacers onto a VCSEL array substrate needs to be stabilized. In the embodiments of the present disclosure, the spacers are configured to have a specific shape. As a result, the relative positions of the VCSEL array substrate and the MLA substrate is precisely determined in a favorable and stable manner, and the shape of the adhesive is stabilized.

The shape of the spacers is described below.

Figure 2:
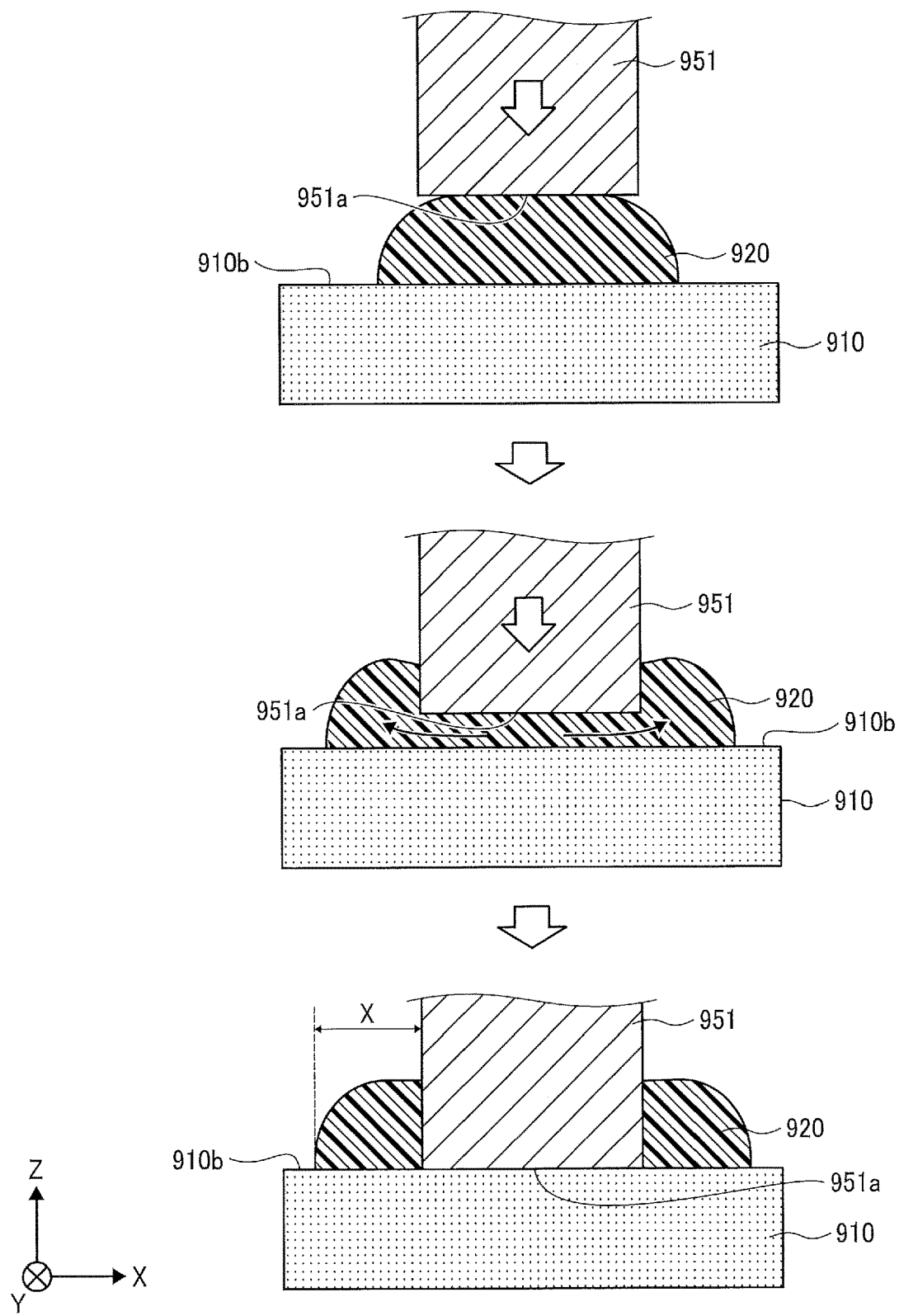
FIG. 2 is a sectional view indicative of how adhesive behaves when a spacer according to a first example is adopted.

FIG. 2 is a sectional view indicative of how the adhesive 920 behaves when the spacer 951 according to the first example is adopted.

Figure 3:
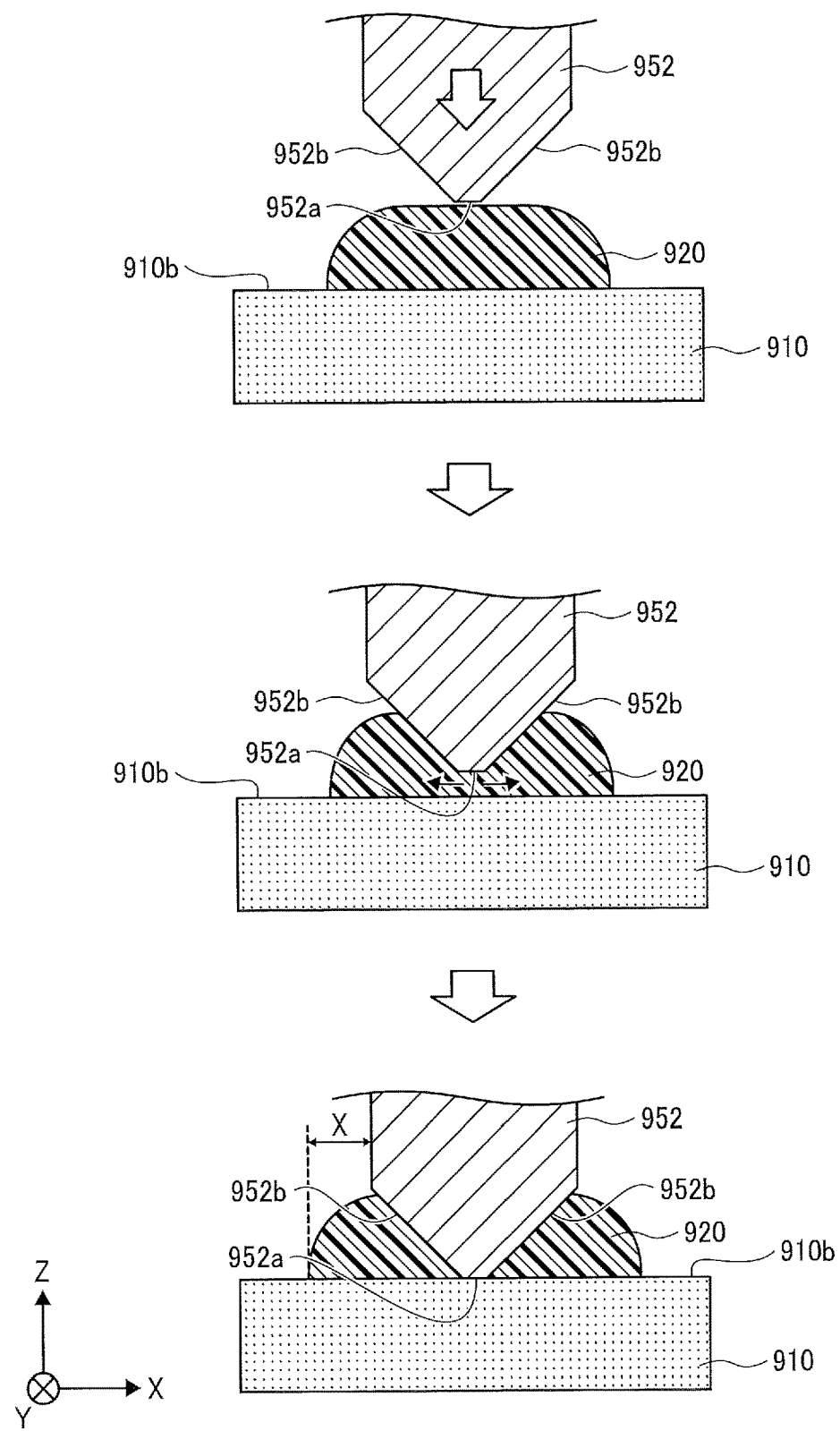
FIG. 3 is a sectional view indicative of how adhesive behaves when a spacer according to a second example is adopted.

FIG. 3 is a sectional view indicative of how the adhesive 920 behaves when the spacer 952 according to the second example is adopted.

Figure 4:
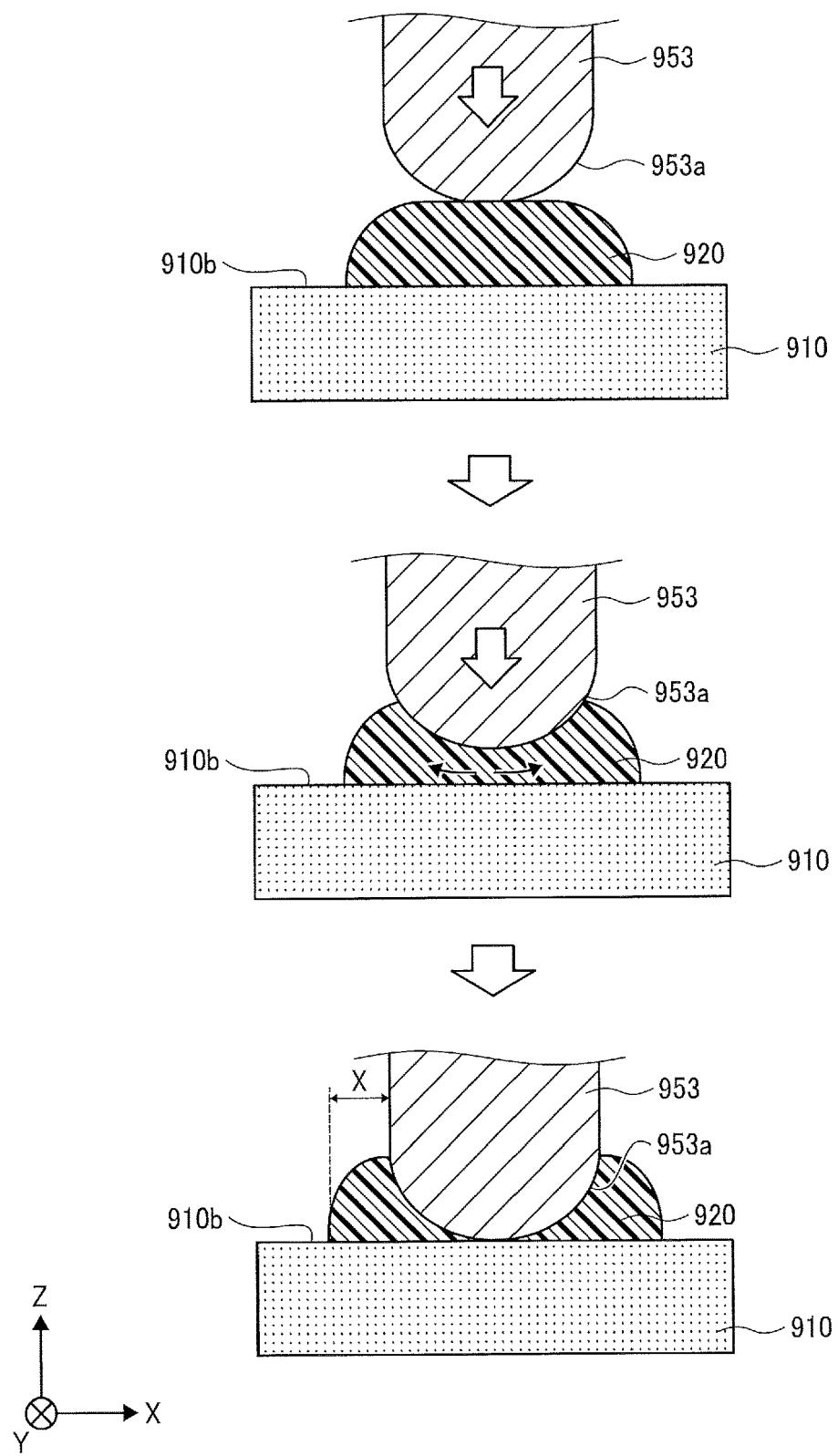
FIG. 4 is a sectional view indicative of how adhesive behaves when a spacer according to a third example is adopted.

FIG. 4 is a sectional view indicative of how the adhesive 920 behaves when the spacer 953 according to the third example is adopted.

FIG. 5 is a sectional view indicative of how the adhesive 920 behaves when the spacer 954 according to the fourth example is adopted.

As illustrated in FIG. 2, a spacer 951 according to the first example has a rectangular shape in cross section. When the spacer 951 is adopted and the spacer 951 is pressed against the VCSEL array substrate 910, a bottom face 951a of the spacer 951 contacts the adhesive 920, and then the adhesive 920 sticks out to the surrounding area of the spacer 951. When the bottom face 951a of the spacer 951 contacts the top face 910b of the VCSEL array substrate 910, the adhesive 920 is squeezed out to both sides of the spacer 951, and the adhesive 920 does not remain between the spacer 951 and the VCSEL array substrate 910.

As illustrated in FIG. 3, the bottom end of the rectangular shape of the spacer 952 according to the second example is chamfered, and the spacer 952 has a shape in cross section where an oblique face 952b that is connected to a bottom face 952a is formed. When the spacer 952 is adopted and the spacer 952 is pressed against the VCSEL array substrate 910, an bottom face 952a of the spacer 952 contacts the adhesive 920, and then the adhesive 920 sticks out to the surrounding area of the spacer 952 along an oblique face 952b. When the bottom face 952a of the spacer 952 contacts the top face 910b of the VCSEL array substrate 910, some of the adhesive 920 is squeezed out to both sides of the spacer 952, and the rest of the adhesive 920 remains between the spacer 952 and the VCSEL array substrate 910.

As illustrated in FIG. 4, the spacer 953 according to the third example has a shape in cross section where an curved face 953a is formed, at the bottom end of the rectangular shape. When the spacer 953 is adopted and the spacer 953 is pressed against the VCSEL array substrate 910, a front end of a curved face 953a of the spacer 953 contacts the adhesive 920, and then the adhesive 920 sticks out to the surrounding area of the spacer 953 along the curved face 953a. When the front end of the curved face 953a of the spacer 953 contacts the top face 910b of the VCSEL array substrate 910, some of the adhesive 920 is squeezed out to both sides of the spacer 953, and the rest of the adhesive 920 remains between the spacer 953 and the VCSEL array substrate 910.

As illustrated in FIG. 5, the spacer 954 according to the fourth example has a shape in cross section where a step is formed at the bottom end of the rectangular shape and a side face 954b that is connected to a bottom face 954a is formed. When the spacer 954 is adopted and the spacer 954 is pressed against the VCSEL array substrate 910, a bottom face 954a of the spacer 954 contacts the adhesive 920, and then the adhesive 920 sticks out to the surrounding area of the spacer 954 along a side face 954b. When the bottom face 954a of the spacer 954 contacts the top face 910b of the VCSEL array substrate 910, some of the adhesive 920 is squeezed out to both sides of the spacer 954, and the rest of the adhesive 920 remains between the spacer 954 and the VCSEL array substrate 910.

Assuming that the shapes of the spacers 951 to 954 are same except the bottom ends and the materials for and the amount of the adopted adhesive 920 are the same, the distance X from the spacer 951 to the end of the adhesive 920, which is squeezed out to an external area, becomes the longest in a planar view when the spacer 951 is adopted. In other words, the amount of the squeezed-out excess of the adhesive 920 can be controlled when one of the spacers 952 to 954 are adopted than when the spacer 951 is adopted. When the sizes of the spacers 951 to 954 are greater in the Y-axis direction, the amount of squeezed-out excess of the adhesive 920 tends to vary more easily. When one of the spacers 952 to 954 is adopted, the speed with which the adhesive 920 spreads can be reduced to prevent the amount of the squeezed-out excess from varying.

As will be described later, there are some cases in which the MLA substrate 901 is inclined with reference to the VCSEL array substrate 910 when their bonding processes start. In order to deal with such a situation, imbalanced spread of the adhesive 920 can be prevented by adopting one of the spacers 952 to 954.

Figure 6:
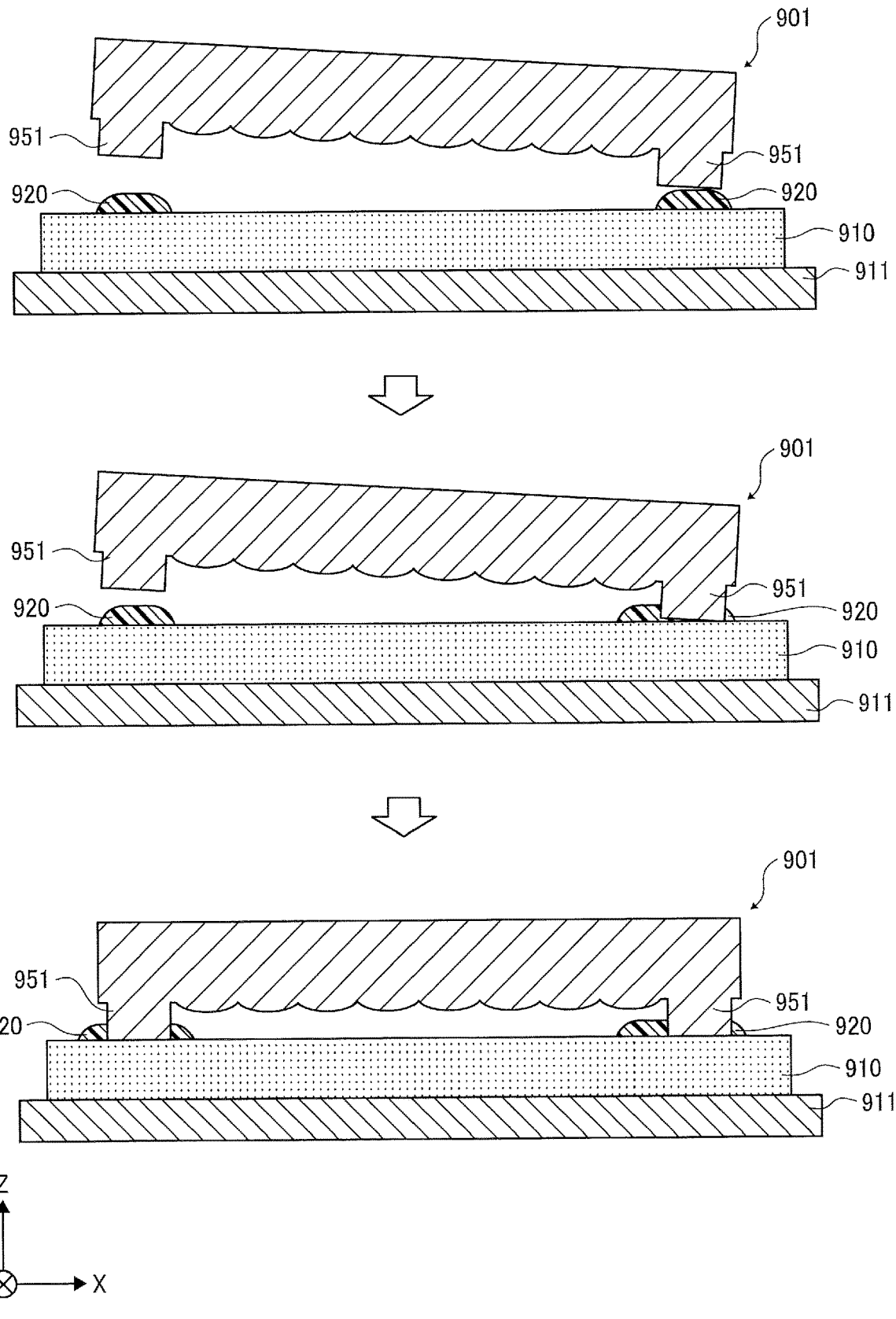
FIG. 6 is a sectional view indicative of how adhesive behaves when a spacer according to a first example is adopted and a MLA substrate is bonded onto a VCSEL array substrate with inclination.

FIG. 6 is a sectional view indicative of how the adhesive 920 behaves when the spacer 951 according to the first example is adopted and the MLA substrate 901 is bonded onto the VCSEL array substrate 910 with inclination.

Figure 7:
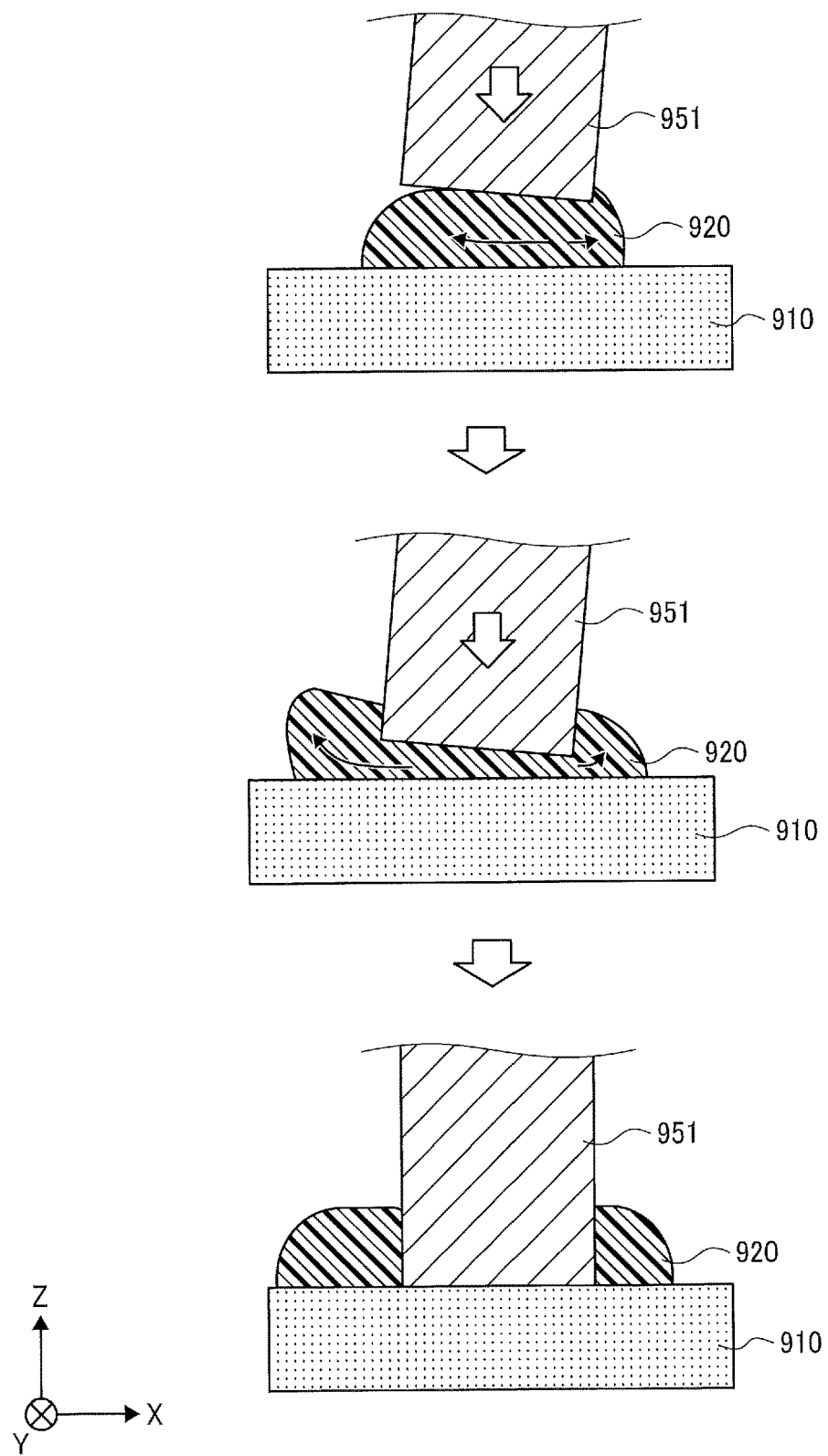
FIG. 7 is a partially magnified view of the sectional view of FIG. 6.

FIG. 7 is a partially magnified view of the sectional view of FIG. 6.

Figure 8:
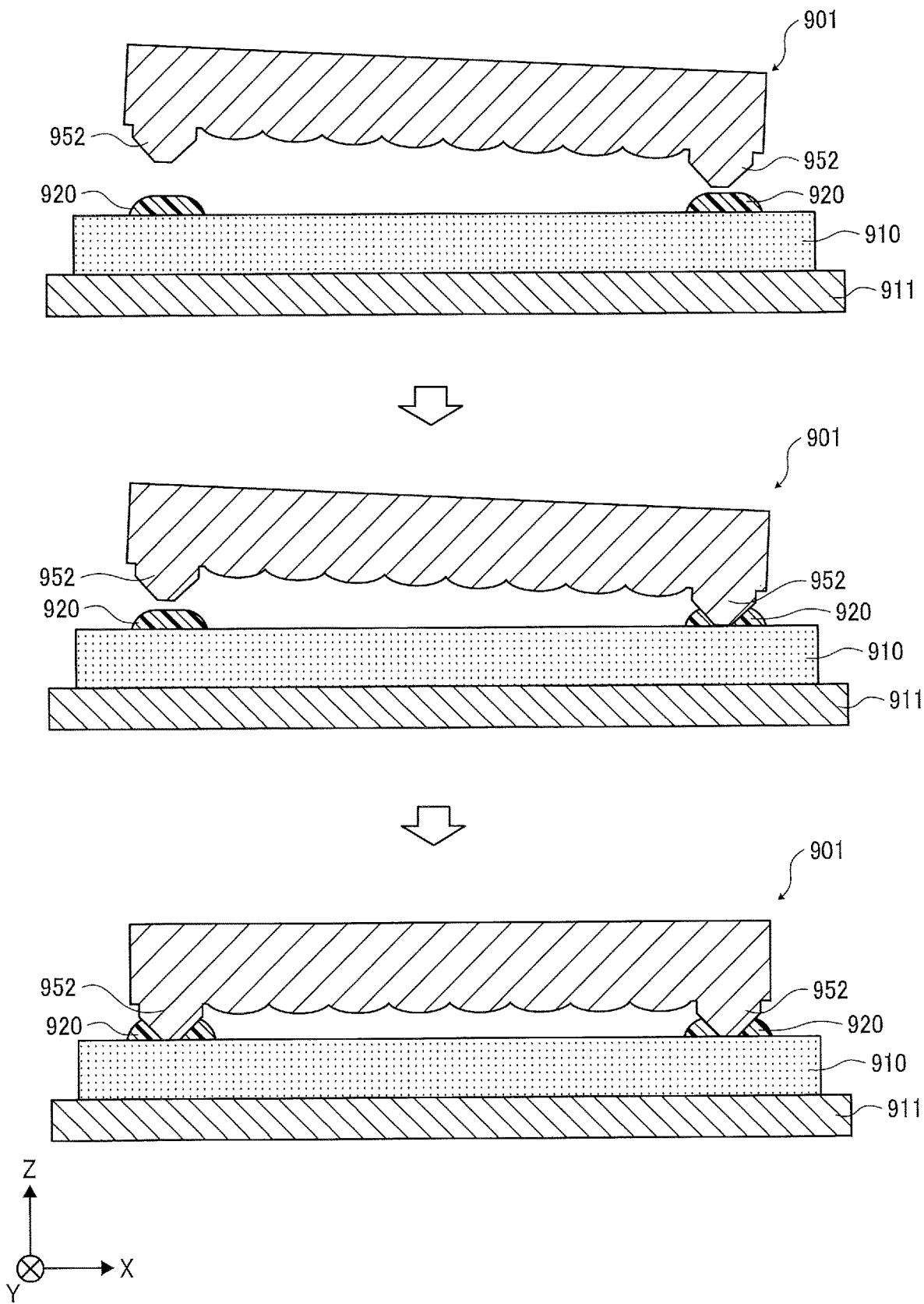
FIG. 8 is a sectional view indicative of how adhesive behaves when a spacer according to a second example is adopted and a MLA substrate is bonded onto a VCSEL array substrate with inclination.

FIG. 8 is a sectional view indicative of how the adhesive 920 behaves when the spacer 952 according to the second example is adopted and the MLA substrate 901 is bonded onto the VCSEL array substrate 910 with inclination.

Figure 9:
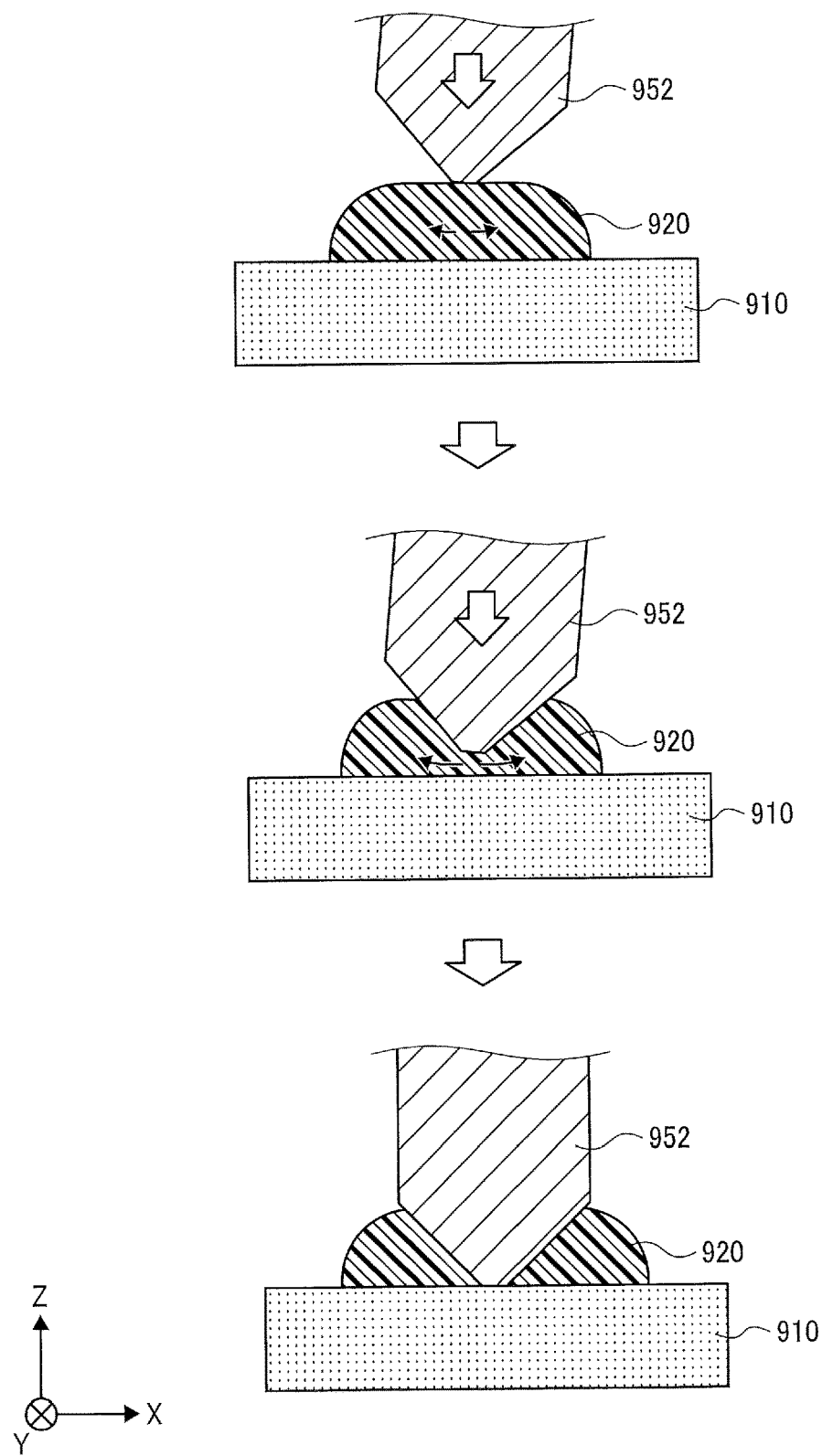
FIG. 9 is a partially magnified view of the sectional view of FIG. 8.

FIG. 9 is a partially magnified view of the sectional view of FIG. 8.

Figure 10:
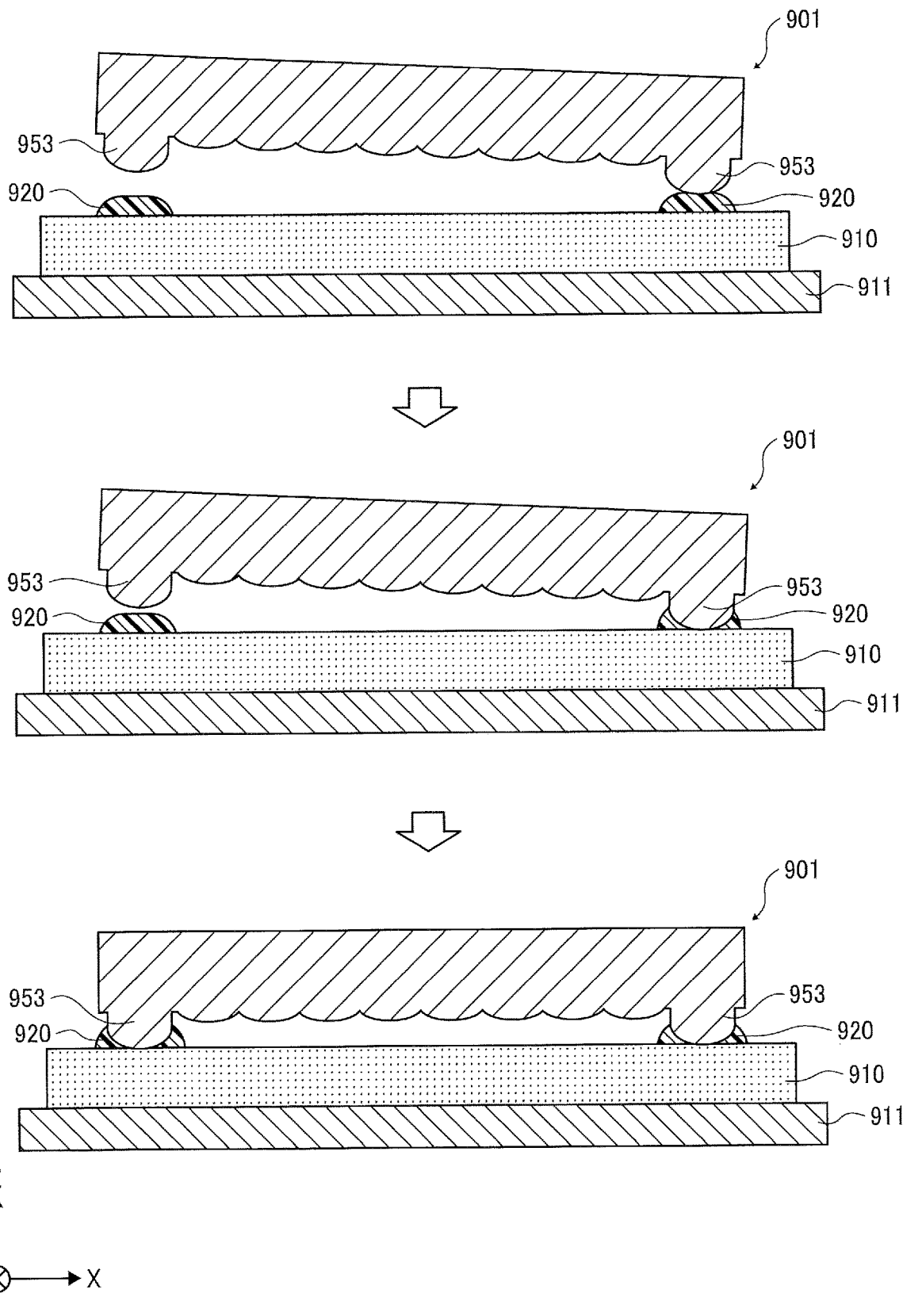
FIG. 10 is a sectional view indicative of how adhesive behaves when a spacer according to a third example is adopted and a MLA substrate is bonded onto a VCSEL array substrate with inclination.

FIG. 10 is a sectional view indicative of how the adhesive 920 behaves when the spacer 953 according to the third example is adopted and the MLA substrate 901 is bonded onto the VCSEL array substrate 910 with inclination.

Figure 11:
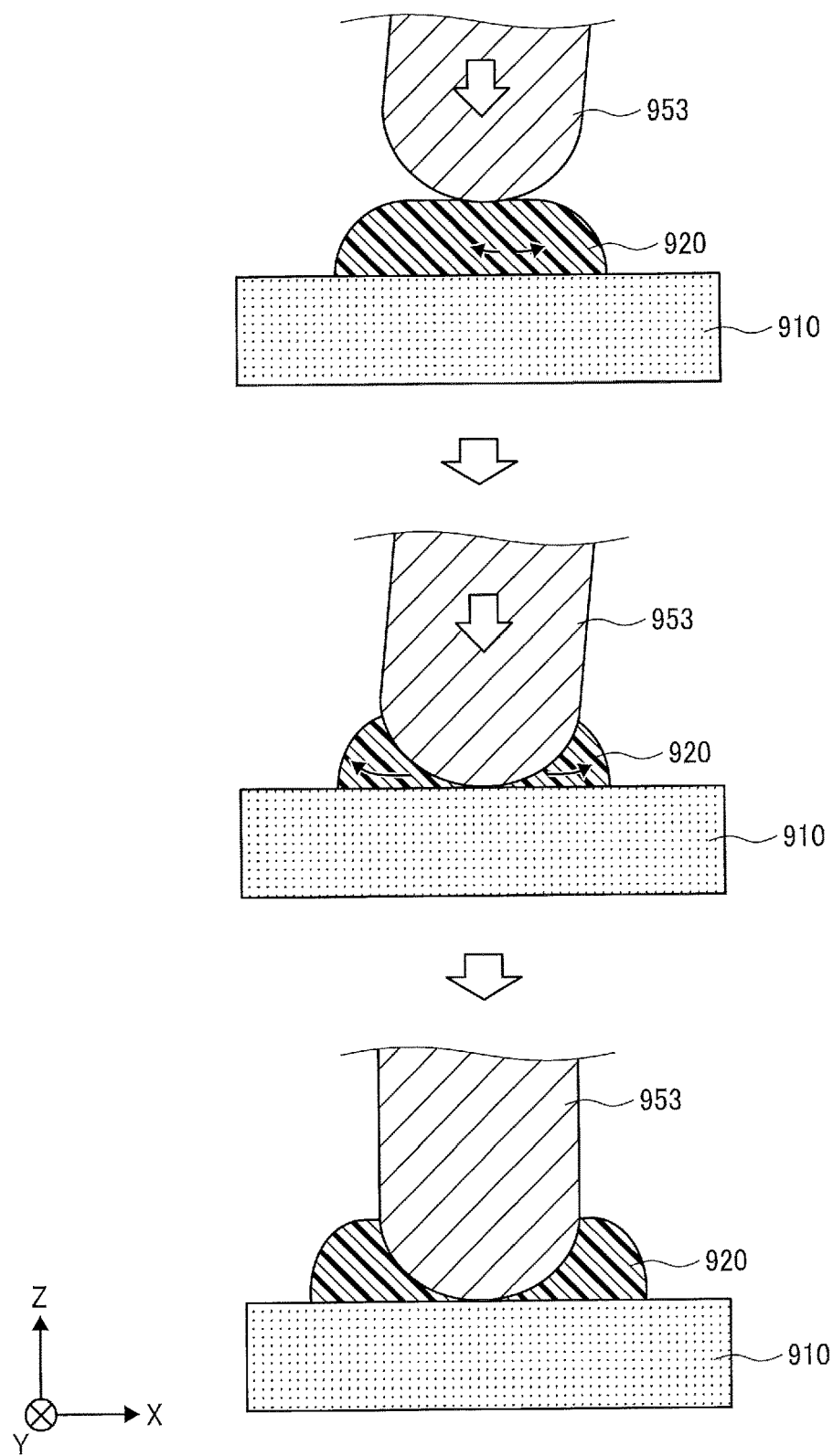
FIG. 11 is a partially magnified view of the sectional view of FIG. 10.

FIG. 11 is a partially magnified view of the sectional view of FIG. 10.

Figure 12:
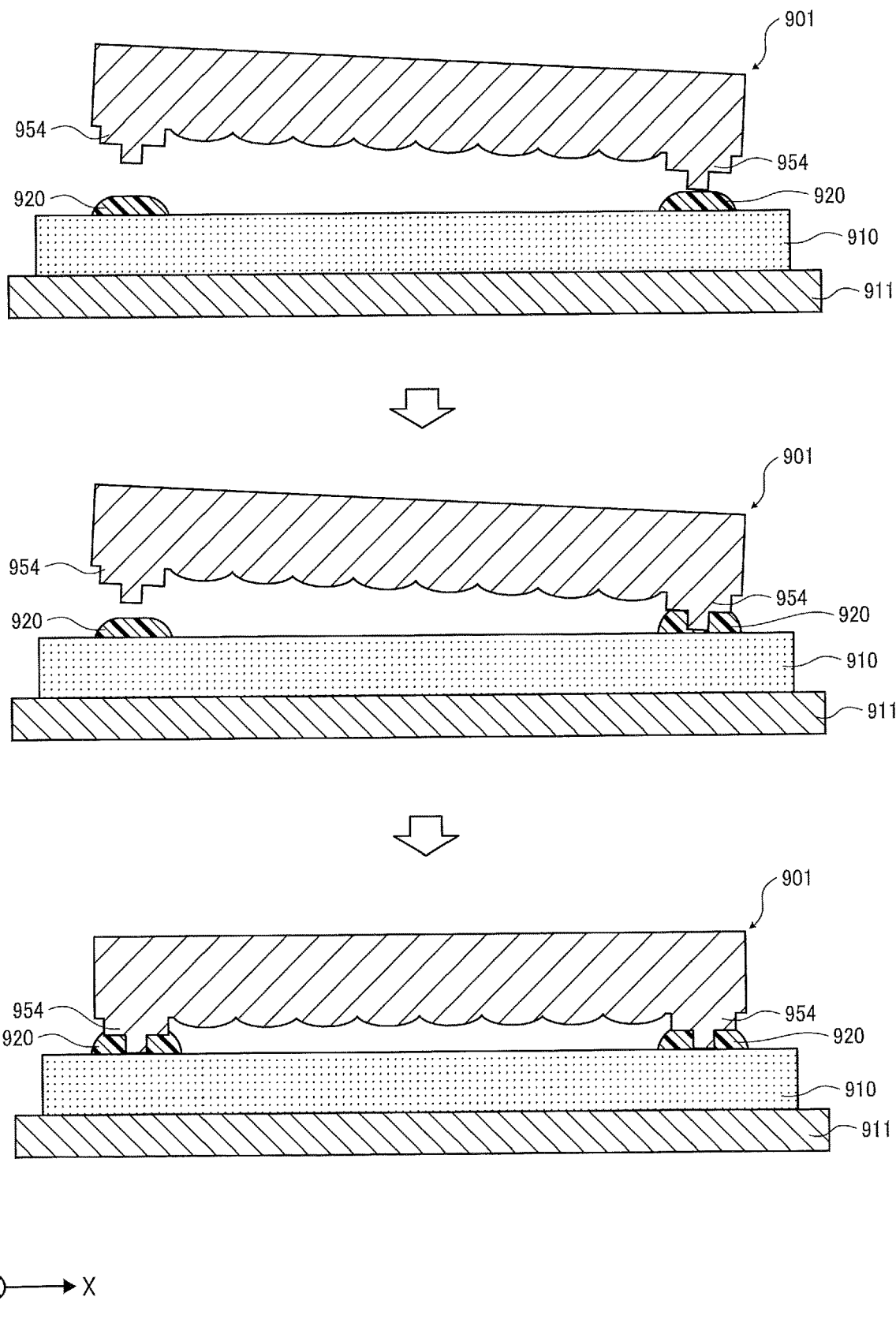
FIG. 12 is a sectional view indicative of how adhesive behaves when a spacer according to a fourth example is adopted and a MLA substrate is bonded onto a VCSEL array substrate with inclination.

FIG. 12 is a sectional view indicative of how the adhesive 920 behaves when the spacer 954 according to the fourth example is adopted and the MLA substrate 901 is bonded onto the VCSEL array substrate 910 with inclination.

Figure 13:
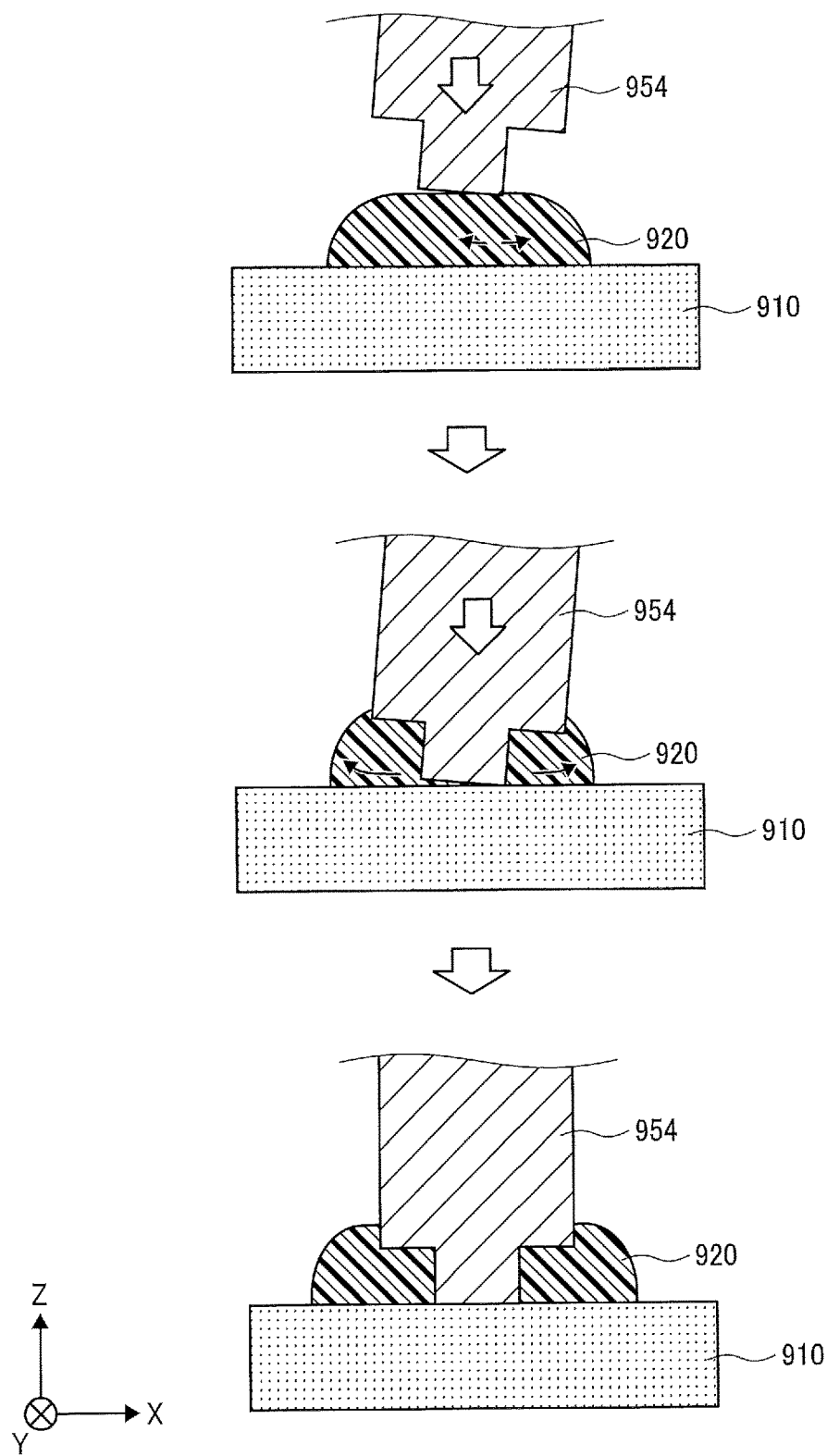
FIG. 13 is a partially magnified view of the sectional view of FIG. 12.

FIG. 13 is a partially magnified view of the sectional view of FIG. 12.

As illustrated in FIG. 6 and FIG. 7, when the spacer 951 is adopted and the MLA substrate 901 is bonded onto the VCSEL array substrate 910 with inclination, a front end of the spacer 951 contacts the adhesive 920 at a position significantly deviating from the center of the adhesive 920, and the adhesive 920 sticks out. For this reason, the adhesive 920 sticks out to one side in a greater amount than to the other side.

By contrast, when the spacer 952 is adopted and the MLA substrate 901 is bonded onto the VCSEL array substrate 910 with inclination, as illustrated in FIG. 8 and FIG. 9, a front end of the spacer 952 contacts the adhesive 920 approximately at the center. Accordingly, imbalanced spread of the adhesive 920 can be prevented. As illustrated in FIG. 10 and FIG. 11, the same thing can be said for cases in which the spacer 953 is adopted. As illustrated in FIG. 12 and FIG. 13, the same thing can be said for cases in which the spacer 954 is adopted.

Some example cases in which the amount of squeezed-out excess of the adhesive 962 when the spacers 951 to 953 are adopted are described below. In such example cases described below, it is assumed that two different kinds of adhesive with varying viscosity are used.

Figure 14A:
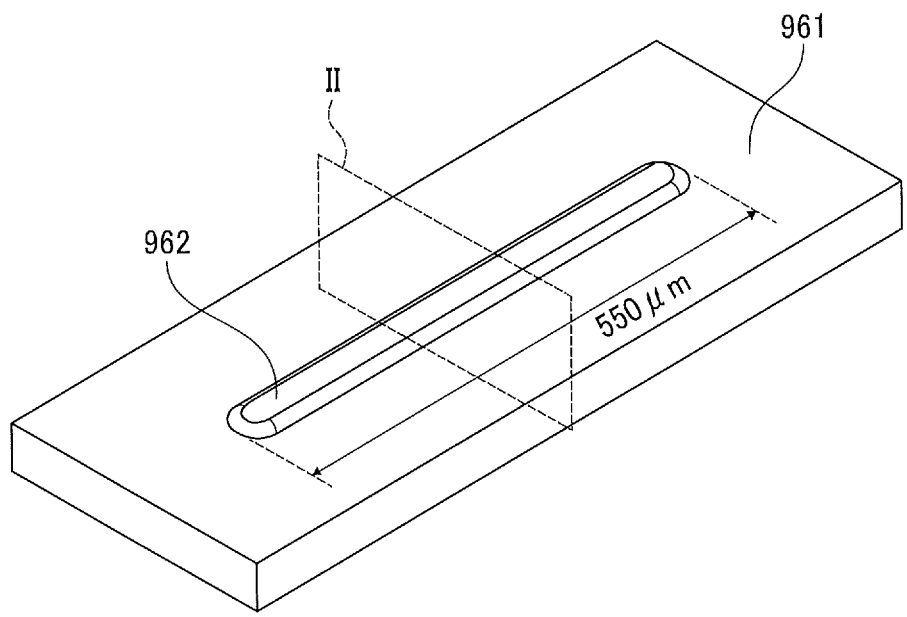
FIG. 14A is a perspective view of a model.

FIG. 14A is a perspective view of a model.

Figure 14B:
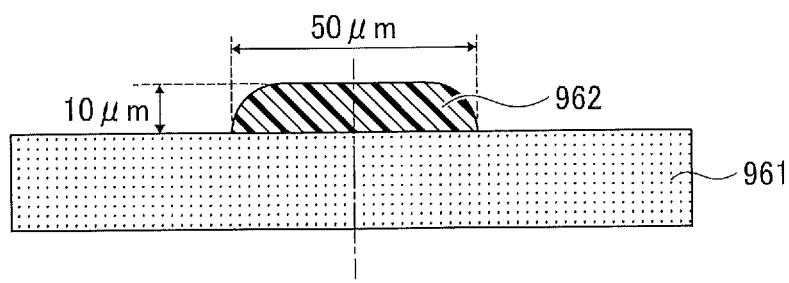
FIG. 14B is a sectional view of a model.

FIG. 14B is a sectional view of a model.

FIG. 14B is a sectional view indicated by a broken line II of FIG. 14A. In this model, the adhesive 962 is arranged on a planar adherend 961 in a straight line. The length, the width, and the height of the adhesive 962 are 550 micrometers (μm), 50 μm, and 10 μm, respectively.

Firstly, the amount of squeezed-out excess when the viscosity of the adhesive 962 is high is described.

Figure 15A:
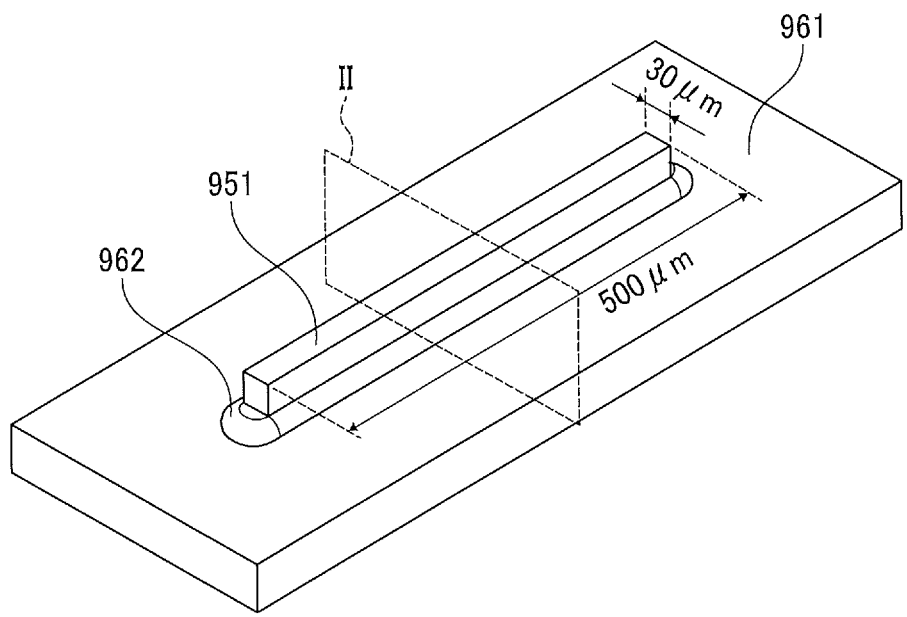
FIG. 15A is a perspective view indicative of a squeezed-out excess of adhesive of high viscosity when a spacer according to a first example is adopted.

FIG. 15A is a perspective view indicative of a squeezed-out excess of the adhesive 962 of high viscosity when the spacer 951 is adopted.

Figure 15B:
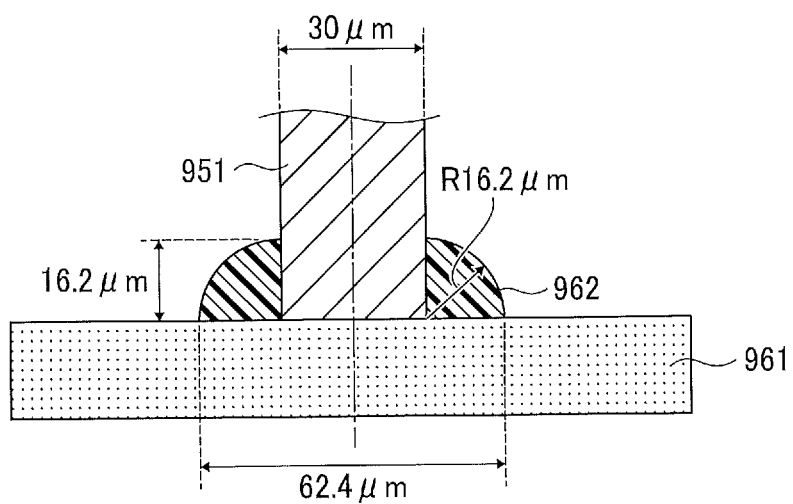
FIG. 15B is a sectional view indicative of a squeezed-out excess of adhesive of high viscosity when a spacer according to a first example is adopted.

FIG. 15B is a sectional view indicative of a squeezed-out excess of the adhesive 962 of high viscosity when the spacer 951 is adopted.

FIG. 15B is a sectional view indicated by a broken line II of FIG. 15A. In the present example, the length and width of the spacer 951 is 500 μm and 30 μm, respectively. When the spacer 951 is adopted, the adhesive 962 spreads in a convex shape in the range of 62.4 μm having the spacer 951 in the center. In other words, the adhesive 962 is squeezed out to both sides by 16.2 µm each. The radius of curvature of the adhesive 962 becomes 16.2 µm, and the maximum height of the adhesive 962 is 16.2 µm.

Figure 16A:
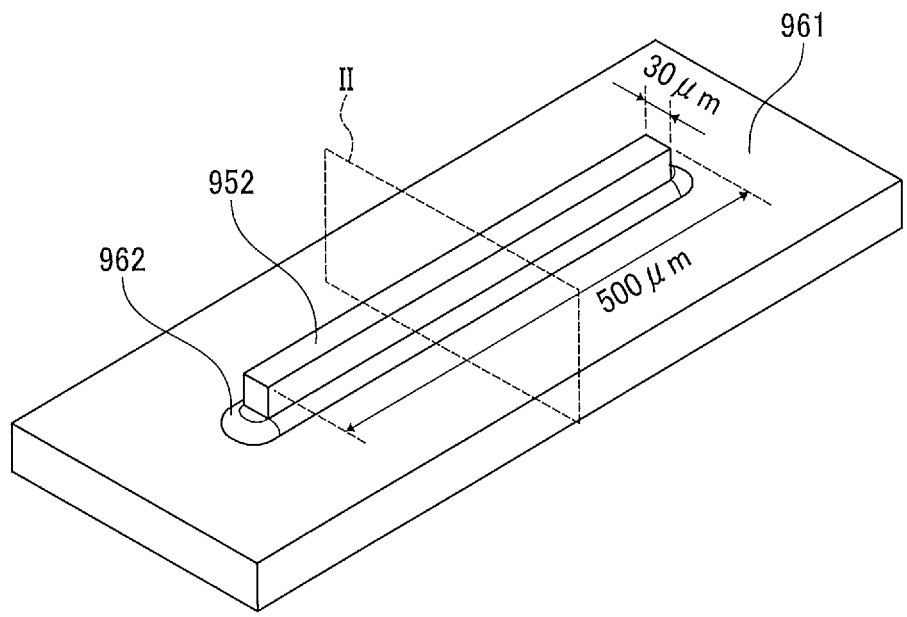
FIG. 16A is a perspective view indicative of a squeezed-out excess of adhesive of high viscosity when a spacer according to a second example is adopted.

FIG. 16A is a perspective view indicative of a squeezed-out excess of the adhesive 962 of high viscosity when the spacer 952 is adopted.

Figure 16B:
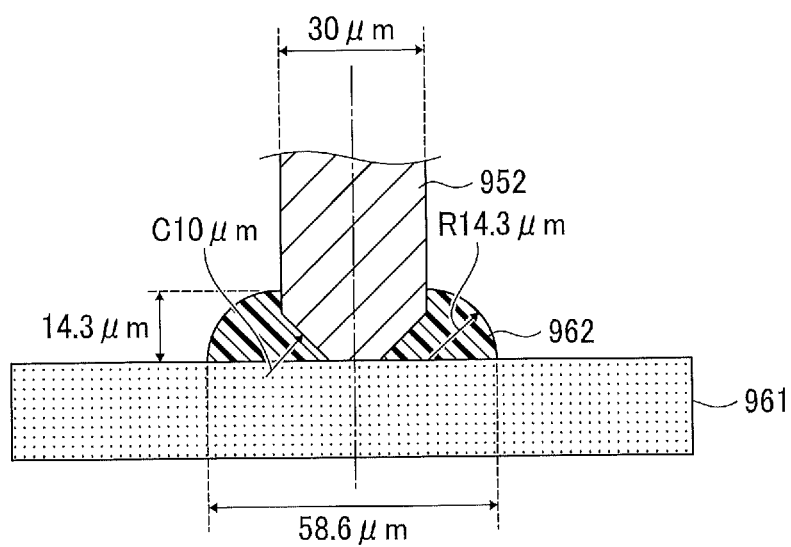
FIG. 16B is a sectional view indicative of a squeezed-out excess of adhesive of high viscosity when a spacer according to a second example is adopted.

FIG. 16B is a sectional view indicative of a squeezed-out excess of the adhesive 962 of high viscosity when the spacer 952 is adopted.

FIG. 16B is a sectional view indicated by a broken line II of FIG. 16A. In the present example, the length and width of the spacer 952 is 500 µm and 30 µm, respectively. The bottom end of the spacer 952 is chamfered by 10 µm at the angle of 45 degrees. When the spacer 952 is adopted, the adhesive 962 spreads in a convex shape in the range of 58.6 µm having the spacer 952 in the center. In other words, the adhesive 962 is squeezed out to both sides by 14.3 µm each. The radius of curvature of the adhesive 962 becomes 14.3 µm, and the maximum height of the adhesive 962 is 14.3 µm. As described above, when the spacer 952 is adopted, the amount of squeezed-out excess can be reduced on both sides by 1.9 µm than when the spacer 951 is adopted.

Figure 17A:
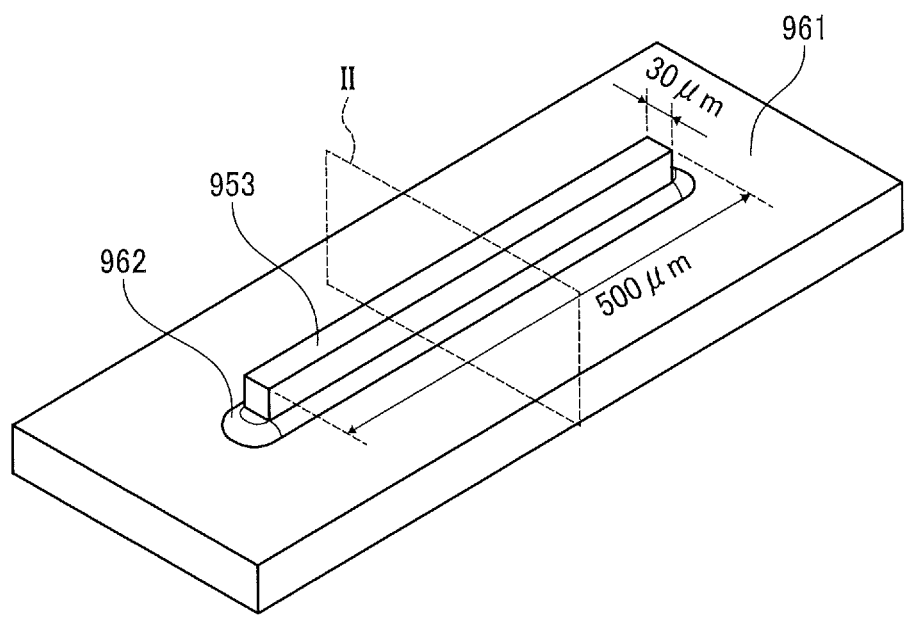
FIG. 17A is a perspective view indicative of a squeezed-out excess of adhesive of high viscosity when a spacer according to a third example is adopted.

FIG. 17A is a perspective view indicative of a squeezed-out excess of the adhesive 962 of high viscosity when the spacer 953 is adopted.

Figure 17B:
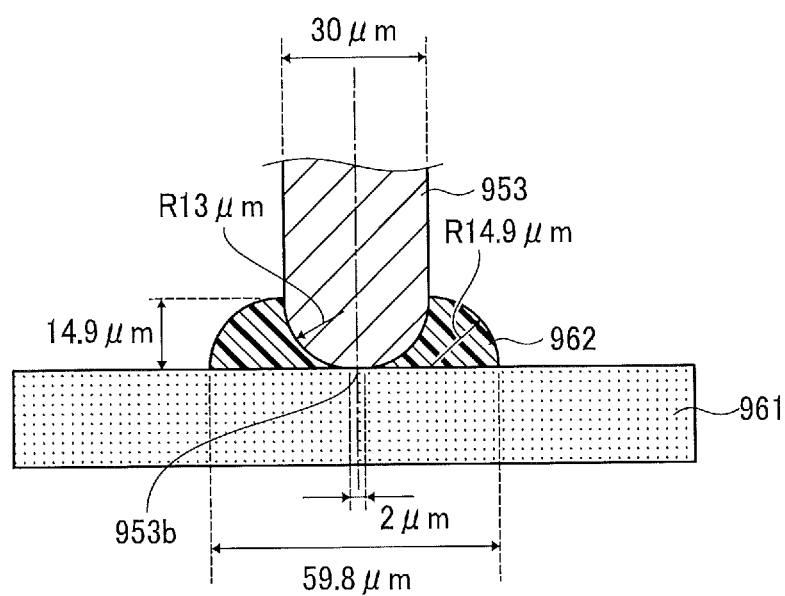
FIG. 17B is a sectional view indicative of a squeezed-out excess of adhesive of high viscosity when a spacer according to a third example is adopted.

FIG. 17B is a sectional view indicative of a squeezed-out excess of the adhesive 962 of high viscosity when the spacer 953 is adopted.

FIG. 17B is a sectional view indicated by a broken line II of FIG. 17A. In the present example, the length and width of the spacer 953 is 500 µm and 30 µm, respectively. The radius of curvature of curved face of the bottom end is 13 µm, and a planar face 953b is arranged at the apex of the curved face with the width of 2 µm. When the spacer 953 is adopted, the adhesive 962 spreads in a convex shape in the range of 59.8 µm having the spacer 953 in the center. In other words, the adhesive 962 is squeezed out to both sides by 14.9 µm each. The radius of curvature of the adhesive 962 becomes 14.9 µm, and the maximum height of the adhesive 962 is 14.9 µm. As described above, when the spacer 953 is adopted, the amount of squeezed-out excess can be reduced on both sides by 1.3 µm than when the spacer 951 is adopted.

Secondly, the amount of squeezed-out excess when the viscosity of the adhesive 962 is low is described.

Figure 18A:
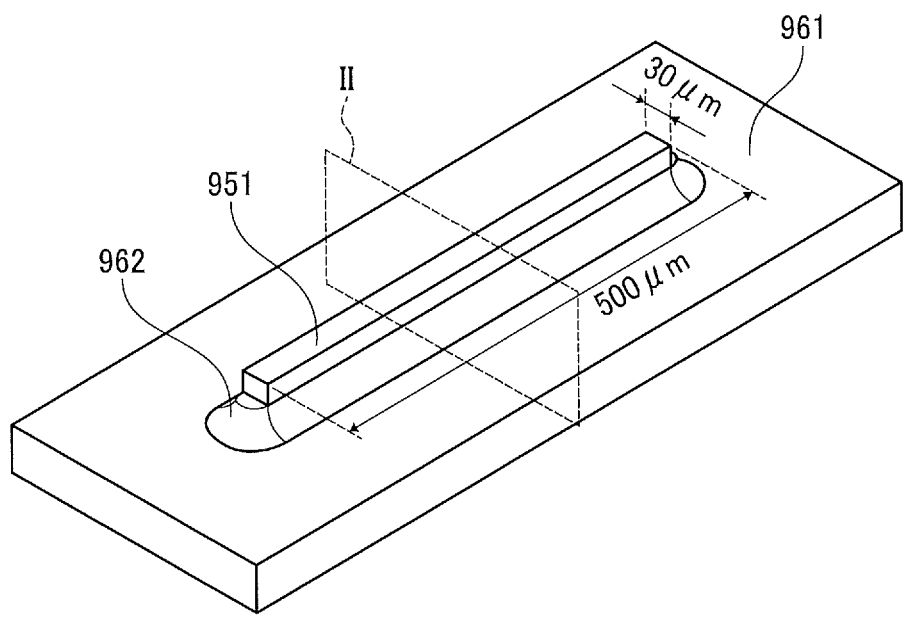
FIG. 18A is a perspective view indicative of a squeezed-out excess of adhesive of low viscosity when a spacer according to a first example is adopted.

FIG. 18A is a perspective view indicative of a squeezed-out excess of the adhesive 962 of low viscosity when the spacer 951 is adopted.

Figure 18B:
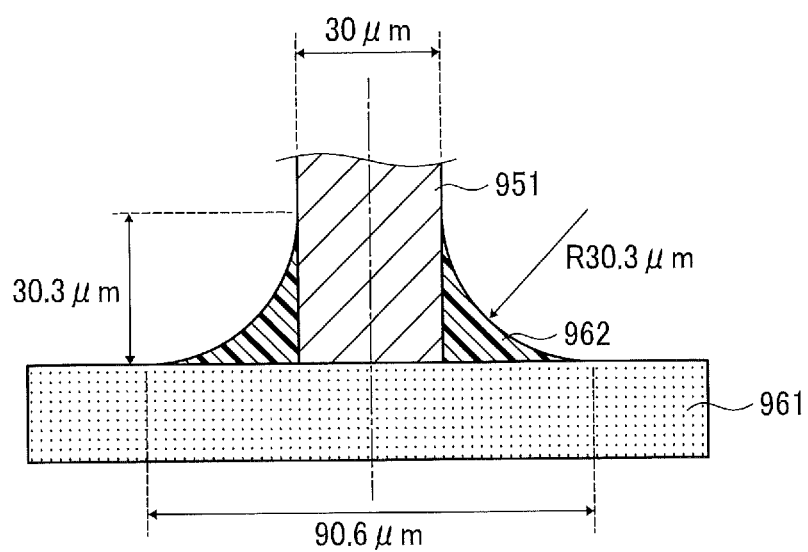
FIG. 18B is a sectional view indicative of a squeezed-out excess of adhesive of low viscosity when a spacer according to a first example is adopted.

FIG. 18B is a sectional view indicative of a squeezed-out excess of the adhesive 962 of low viscosity when the spacer 951 is adopted.

FIG. 18B is a sectional view indicated by a broken line II of FIG. 18A. When the spacer 951 is adopted, the adhesive 962 spreads in a concave shape in the range of 90.6 µm having the spacer 951 in the center. In other words, the adhesive 962 is squeezed out to both sides by 30.3 µm each. The radius of curvature of the adhesive 962 becomes 30.3 µm, and the maximum height of the adhesive 962 is 30.3 µm.

Figure 19A:
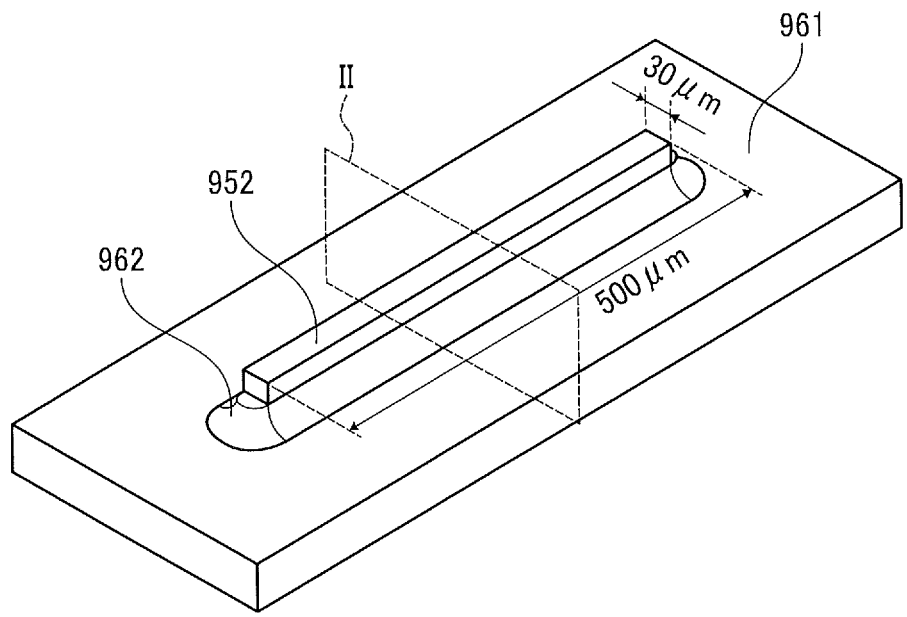
FIG. 19A is a perspective view indicative of a squeezed-out excess of adhesive of low viscosity when a spacer according to a second example is adopted.

FIG. 19A is a perspective view indicative of a squeezed-out excess of the adhesive 962 of low viscosity when the spacer 952 is adopted.

Figure 19B:
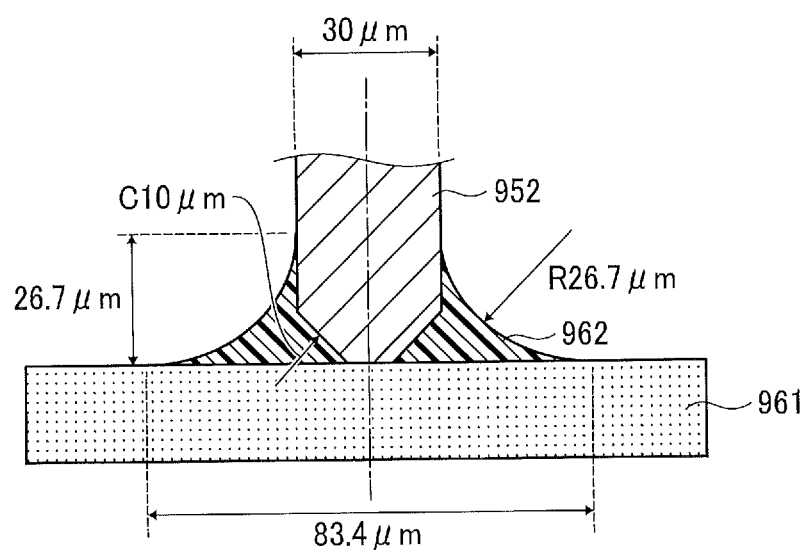
FIG. 19B is a sectional view indicative of a squeezed-out excess of adhesive of low viscosity when a spacer according to a second example is adopted.

FIG. 19B is a sectional view indicative of a squeezed-out excess of the adhesive 962 of low viscosity when the spacer 952 is adopted.

FIG. 19B is a sectional view indicated by a broken line II of FIG. 19A. When the spacer 952 is adopted, the adhesive 962 spreads in a concave shape in the range of 83.4 µm having the spacer 952 in the center. In other words, the adhesive 962 is squeezed out to both sides by 26.7 µm each. The radius of curvature of the adhesive 962 becomes 26.7 µm, and the maximum height of the adhesive 962 is 26.7 µm. As described above, when the spacer 952 is adopted, the amount of squeezed-out excess can be reduced on both sides by 3.6 µm than when the spacer 951 is adopted.

Figure 20A:
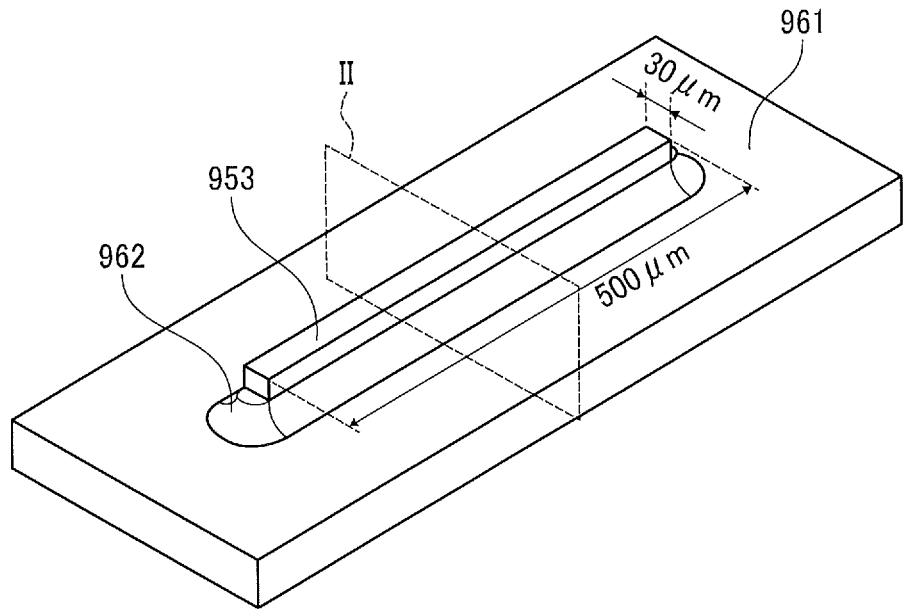
FIG. 20A is a perspective view indicative of a squeezed-out excess of adhesive of low viscosity when a spacer according to a third example is adopted.

FIG. 20A is a perspective view indicative of a squeezed-out excess of the adhesive 962 of low viscosity when the spacer 953 is adopted.

Figure 20B:
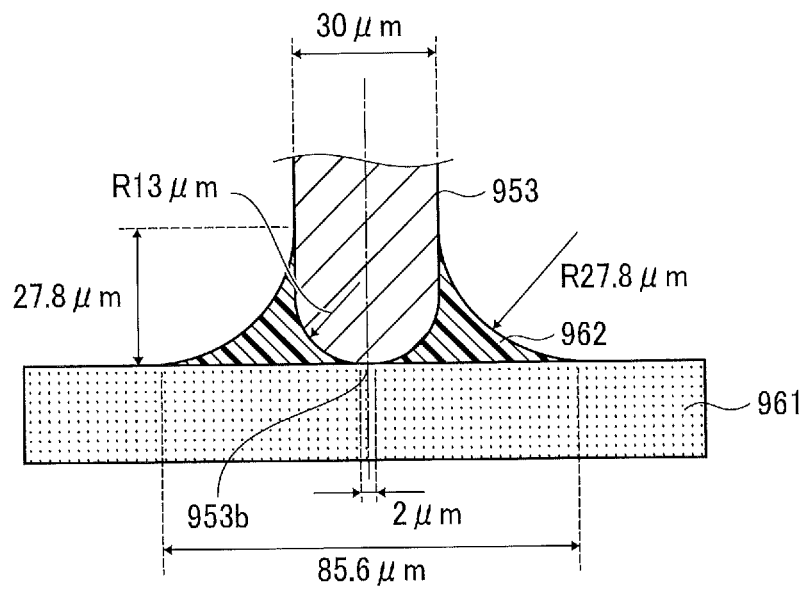
FIG. 20B is a sectional view indicative of a squeezed-out excess of adhesive of low viscosity when a spacer according to a third example is adopted.

FIG. 20B is a sectional view indicative of a squeezed-out excess of the adhesive 962 of low viscosity when the spacer 953 is adopted.

FIG. 20B is a sectional view indicated by a broken line II of FIG. 20A. When the spacer 953 is adopted, the adhesive 962 spreads in a concave shape in the range of 85.6 µm having the spacer 953 in the center. In other words, the adhesive 962 is squeezed out to both sides by 27.8 µm each. The radius of curvature of the adhesive 962 becomes 27.8 µm, and the maximum height of the adhesive 962 is 27.8 µm. As described above, when the spacer 953 is adopted, the amount of squeezed-out excess can be reduced on both sides by 2.5 µm than when the spacer 951 is adopted.

Assuming that the speed of positioning is even when the spacers 951 to 954 are bonded, the spacer 951 squeezes a greater amount of adhesive than the other spacers, and the speed with which the adhesive 962 is squeezed out in the horizontal directions increases. For this reason, in actuality, the difference in the amount of squeezed-out excess is greater than the calculated values as described above.

When the spacers 952 to 954 are adopted, the adhesive 962 enters the reduced portion with reference to the spacer 951. For this reason, the amount of squeezed-out excess in the horizontal directions can be reduced to zero depending on the amount of the adhesive 962 and the shapes of the spacers 952 to 954.

First Embodiment

A first embodiment of the present disclosure is described below. The first embodiment of the present disclosure relates to an optical device 1.

Figure 21A:
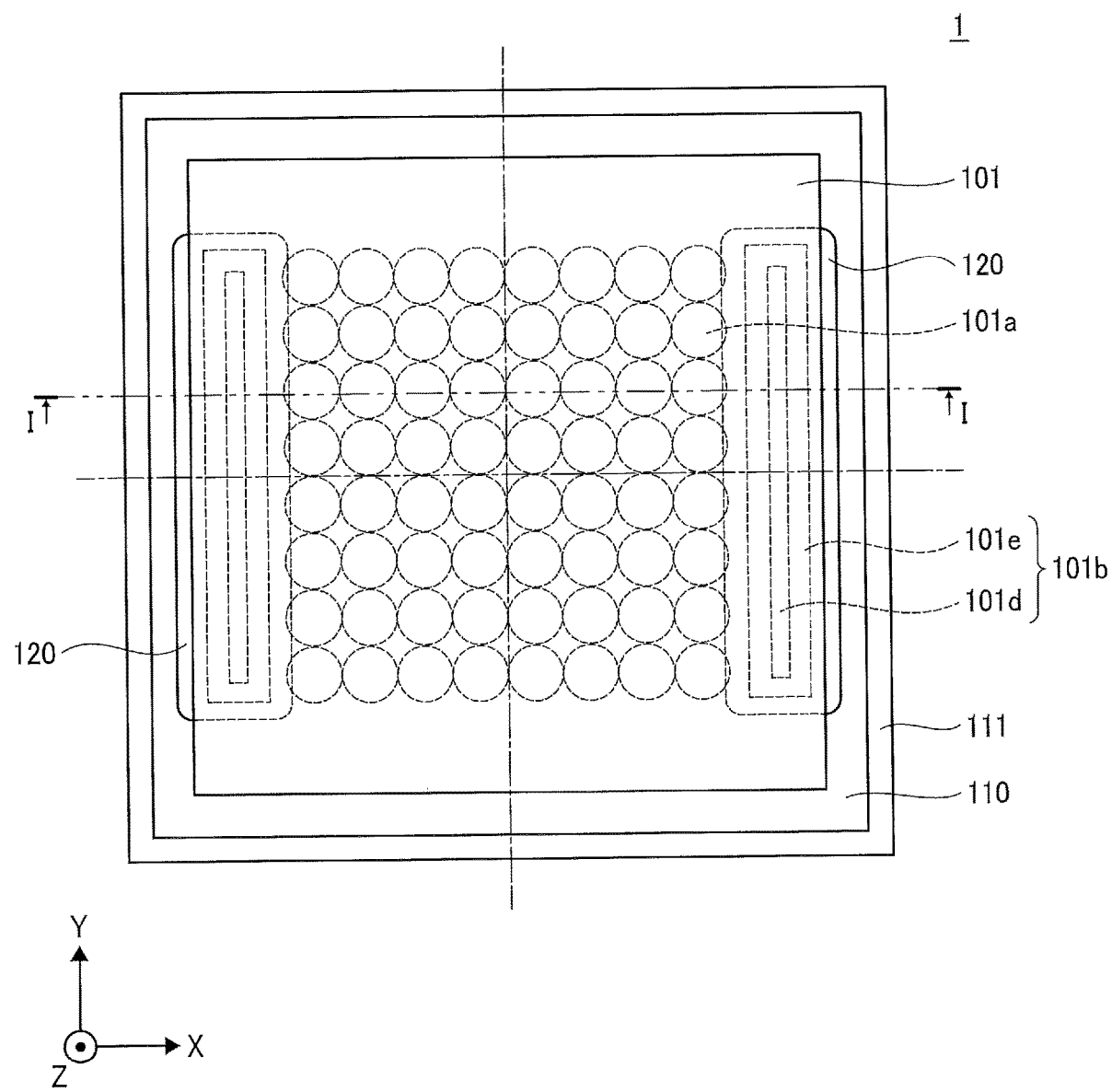
FIG. 21A is a top view of an optical device according to a first embodiment of the present disclosure.

FIG. 21A is a top view of an optical device 1 according to a first embodiment of the present disclosure.

Figure 21B:
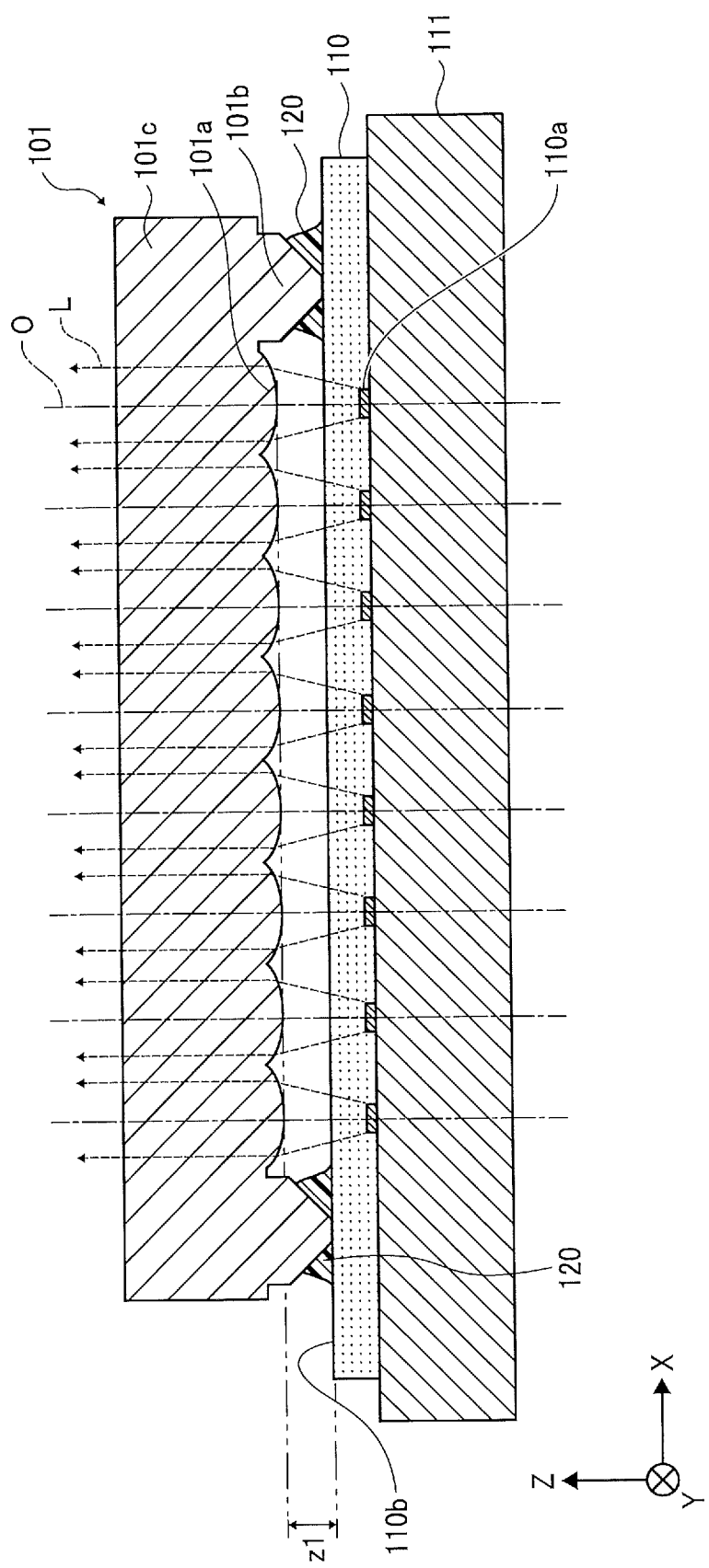
FIG. 21B is a sectional view of an optical device according to the first embodiment of the present disclosure.

FIG. 21B is a sectional view of the optical device 1 according to the first embodiment of the present disclosure.

Figure 21C:
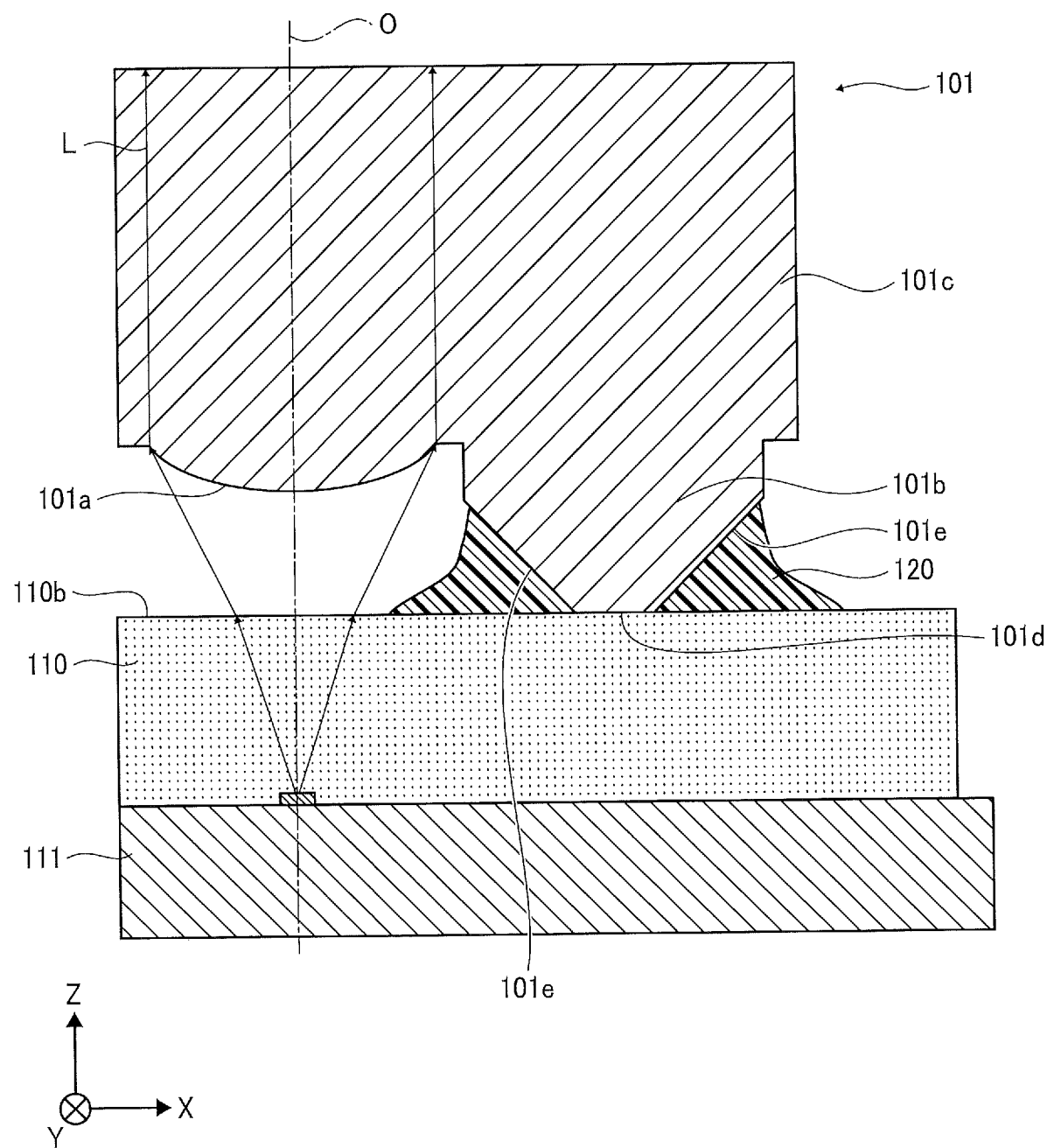
FIG. 21C is a partially magnified view of the sectional view of FIG. 21B.

FIG. 21C is a partially magnified view of the sectional view of FIG. 21B.

Figure 22A:
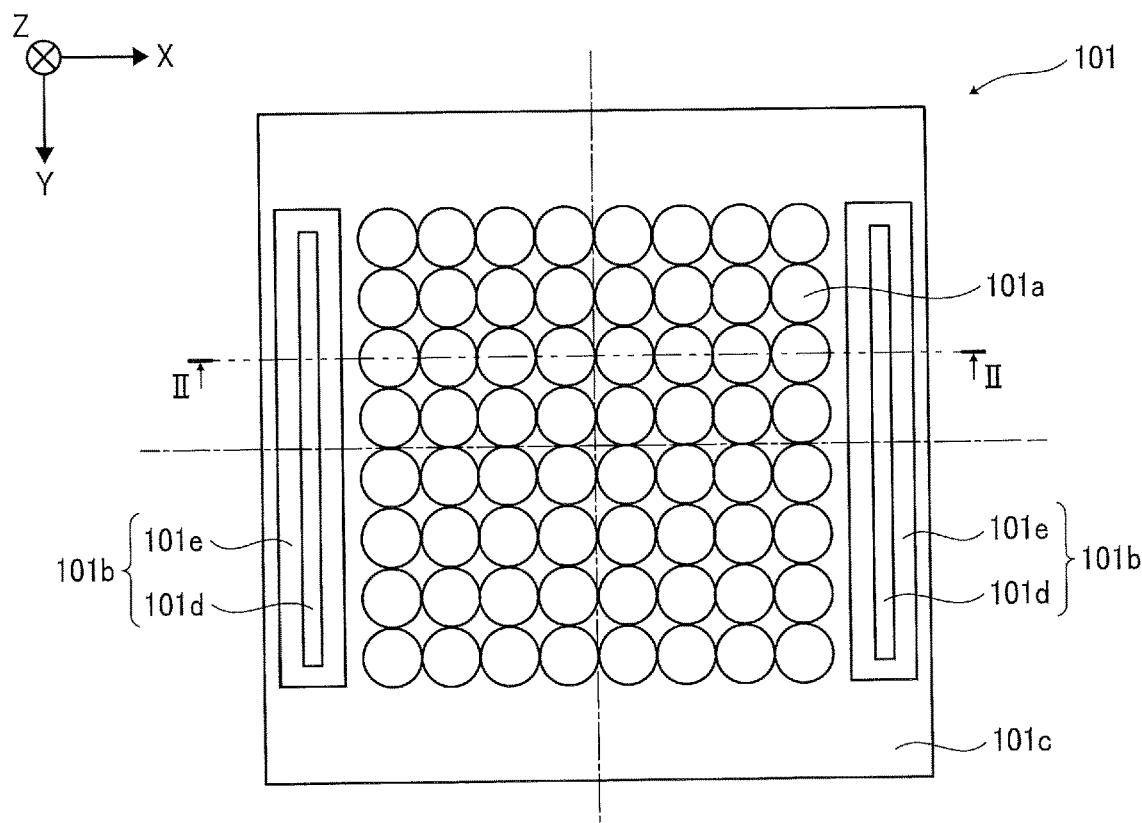
FIG. 22A is a bottom view of an MLA substrate according to the first embodiment of the present disclosure.

FIG. 22A is a bottom view of the MLA substrate 101 according to the first embodiment of the present disclosure.

Figure 22B:
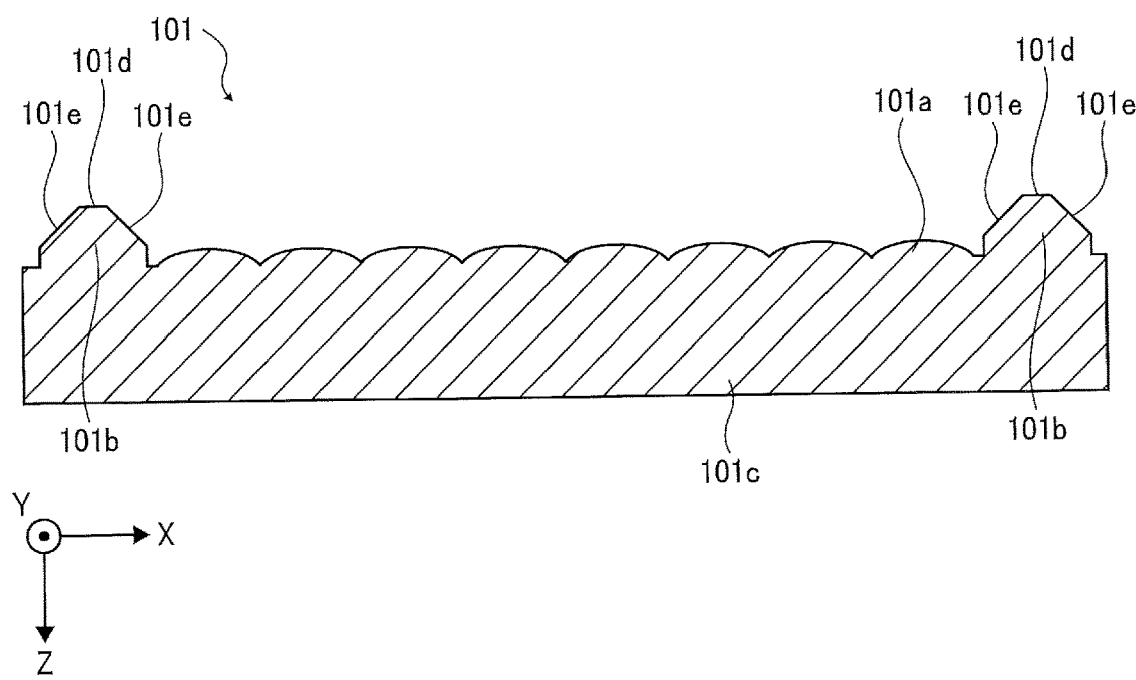
FIG. 22B is a sectional view of an MLA substrate according to the first embodiment of the present disclosure.

FIG. 22B is a sectional view of the MLA substrate 101 according to the first embodiment of the present disclosure.

FIG. 21B is a diagram illustrating a cross-sectional view along line I-I of FIG. 21A.

FIG. 22B is a diagram illustrating a cross-sectional view along line II-II of FIG. 22A.

As illustrated in FIG. 21A to FIG. 21C, FIG. 22A, and FIG. 22B, the optical device 1 according to the first embodiment of the present disclosure is a laser-beam source module including the VCSEL array substrate 110 and the MLA substrate 101. The VCSEL array substrate 110 includes a plurality of VCSEL devices 110a that are arranged on a top face 110b. The MLA substrate 101 includes a base 101c, a plurality of microlenses 101a, a spacer 101b that extends in the Y-axis direction. The microlenses 101a are arranged in a planar fashion so as to correspond to the array of the VCSEL devices 110a. Each one of the microlenses 101a is disposed such that the optical axis "O" of the relevant one of the microlenses 101a matches the central optical axis of the laser beam L that the facing one of the VCSEL 10a emits. The distance z1 between the VCSEL array substrate 110 and the MLA substrate 101 is adjusted such that the focal point of each of the microlenses 101a is aligned with the center of the light-emitting point of each of the VCSEL devices 110a. In other words, the microlenses 101a face the VCSEL devices 110a, which serve as the light source, and are arranged in line with the optical axes of the VCSEL devices 110a. Due to this configuration, each one of the microlenses 101a can emit the laser beam L, which is emitted from the facing one of the VCSEL devices 110a, as a collimated beam. The VCSEL array substrate 110 is an example of a first substrate, and the MLA substrate 101 is an example of a second substrate. The top face 110b is an example of a first face, and the face of the base 101c on which the microlenses 101a are arranged is an example of a second face. Each of the VCSEL devices 110a is an example of a photo-electric element, and the spacer 101b is an example of a joint. The Y-axis direction is an example of a first direction. Note also that the microlenses 101a are not limited to collimator lenses, but may be any other kinds of lenses as long as long as they have a function to change the direction in which the light travels such as a function to concentrate or diverge the light, and to deflect the light.

The spacers 101b are arranged on both sides of the MLA that is composed of the microlenses 101a in the X-axis directions. The length of the spacers 101b in the Y-axis direction is longer than the length of each one of the microlens array that is composed of the multiple microlenses 101a in the Y-axis direction. The spacers 101b has a certain height that is higher than the height of each one of the microlenses 101a, with reference to the face of the MLA substrate 101 on which the microlenses 101a are arranged. For example, the sum of the distance z1 and the height of each one of the microlenses 101a is approximately equal to the height of the spacers 101b with reference to the face of the MLA substrate 101 on which the microlenses 101a are arranged. In a similar manner to the spacer 952 as described above, the bottom end of the rectangular shape of each of the spacers 101b is chamfered, and each of the spacers 101b has a shape in cross section where an oblique face 101e that is connected to a bottom face 101d is formed. In other words, each one of the spacers 101b includes the bottom face 101d that contacts the top face 110b, and the oblique face 101e that is on a side closer to the face of the MLA substrate 101, on which the microlenses 101a are arranged, than the bottom face 101d, and is apart from the top face 110b. In other words, the face of each of the spacers 101b viewable from the VCSEL array substrate 110 side includes the bottom face 101d that contacts the top face 110b, and the oblique face 101e that is recessed towards the face of the MLA substrate 101, on which the microlenses 101a are arranged, with reference to the bottom face 101d. As described above, each of the spacers 101b has an oblique shape in which the sectional size on the MLA substrate 101 side is greater than the sectional size on the bonding interface side. The bottom face 101d is an example of a first part, and the oblique face 101e is an example of a second part.

The size of the microlenses 101a can be adjusted according to, for example, the specification related to the size and optical properties (such as focal length, a spot diameter, and brightness) of the VCSEL devices 110a and the tolerance.

The MLA substrate 101 is made of a transparent material for the laser beams L that are emitted from the VCSEL devices 110a. For example, it is desired that the material of the MLA substrate 101 be glass in view of, for example, the heat generated by the laser beams L. In particular, it is desired that the MLA substrate 101 be made of B7 glass so as to reduce the difference in expansion rate Between the MLA substrate 101 and the VCSEL array substrate 110. The spacer 101b can be molded integrally with the base 101c and the microlenses 101a. In other words, the spacers 101b may be made of the same material as the MLA substrate 101.

The VCSEL array substrate 110 is described below in detail.

Figure 23:
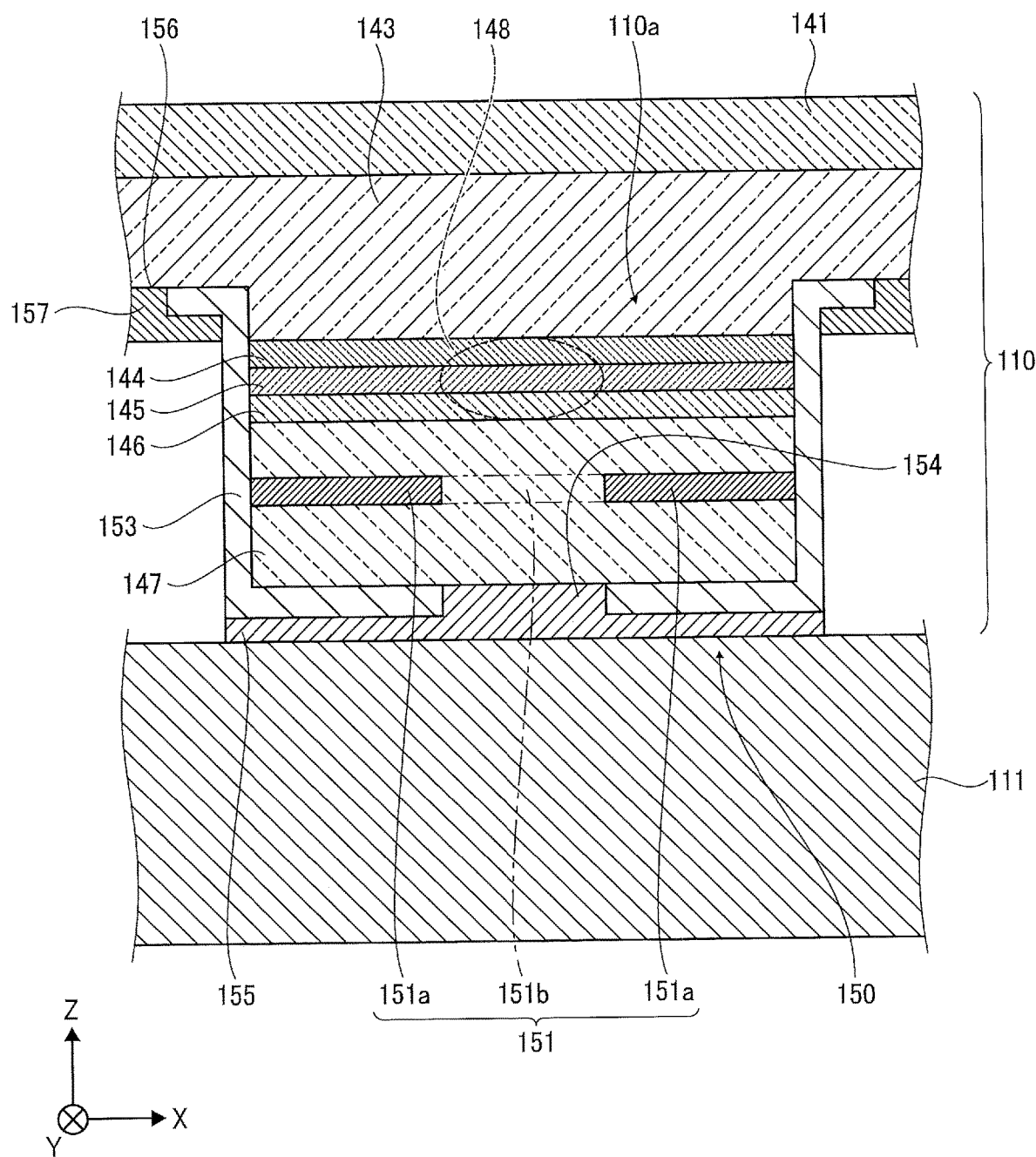
FIG. 23 is a sectional view of a VCSEL array substrate according to the first embodiment of the present disclosure.

FIG. 23 is a sectional view of the VCSEL array substrate 110 according to the first embodiment of the present disclosure.

As illustrated in FIG. 23, the multiple VCSEL devices 110a are arrayed on the face of the VCSEL array substrate 110 on the submount substrate 111 side. The multiple VCSEL devices 110a are made on the substrate 141 such as an n-GaAs substrate in a monolithic manner, and all the multiple VCSEL devices 110a have the same membrane configuration. Each one of the VCSEL devices 110a is, for example, a surface-emitting laser device whose oscillation wavelength is in the range around 940 nanometers (nm) (about +30 nm around 940 mm).

Each one of the VCSEL devices 110a includes, for example, a n-distributed Bragg reflector (DBR) 143 on the substrate 141 such as an n-GaAs substrate, a spacer layer 144, an active layer 145, a spacer layer 146, a p-DBR 147, and a to-be-selected oxidized layer 151. The to-be-selected oxidized layer 151 includes an oxidized area 151a and a non-oxidized area 151b. The refractive index of the n-GaAs substrate is about 3.5.

The n-DBR 143 is formed on the substrate 141. The n-DBR 143 is, for example, a semiconducting multilayer reflector consisting of a plurality of n-type semiconductor films that are multilayered. The n-DBR 143 includes, for example, a low refractive index layer that is composed of n-Al0.9Ga0.1As and a high refractive index layer composed of n-$Al_{0.2}Ga_{0.8}As$. The n-DBR 143 includes, for example, thirty pairs of low refractive index layer and high refractive index layer.

Between two layers of the n-DBR 143 that have varying refractive indexes, for example, a gradient-composition layer with the thickness of 20 nm where the composition gradually changes from a side of the composition to the other side of the composition is provided in order to reduce the electrical resistance. Each of the layers of varying refractive indexes is designed to include one-half of the adjacent gradient-composition layer and have the optical thickness of $\lambda/4$ when it is assumed that the oscillation wavelength is $\lambda$. Note that when the optical thickness is $\lambda/4$, the actual thickness of the layer is $D=\lambda/4n$ (where n denotes the refractive index of the medium of that layer).

The spacer layer 144 is formed on the n-DBR 143. For example, the spacer layer 144 is a non-doped AlGaInP layer.

The active layer 145 is formed on the spacer layer 144. The active layer 145 has a triple-bond quantum well structure including, for example, three quantum well layers and four barrier layers. Those quantum well layers are composed of, for example, InGaAs, and those barrier layers are composed of, for example, AlGaAs.

The spacer layer 146 is formed on the active layer 145. For example, the spacer layer 146 is a non-doped AlGaInP layer.

The area that includes the spacer layer 144, the active layer 145, and the spacer layer 146 is referred to as a resonator structure (resonator area), and is designed to include one-half of the adjacent gradient-composition layer and have the optical thickness of one wavelength ($\lambda$). The active layer 145 is disposed in the center of the resonator structure so as to achieve a high stimulated-emission rate. Note that the center of the resonator structure corresponds to a belly of the standing-wave distribution of the electric field.

The p-DBR 147 is formed on the spacer layer 146. The p-DBR 147 is, for example, a semiconducting multilayer reflector consisting of a plurality of p-type semiconductor films that are multilayered. The p-DBR 147 includes, for example, a low refractive index layer that is composed of p-$Al_{0.9}Ga_{0.1}As$ and a high refractive index layer composed of p-$Al_{0.2}Ga_{0.8}As$. The p-DBR 147 includes, for example, twenty pairs of low refractive index layer and high refractive index layer.

Between two layers of the p-DBR 147 that have varying refractive indexes, for example, a gradient-composition layer with the thickness of 20 nm where the composition gradually changes from a side of the composition to the other side of the composition is provided in order to reduce the electrical resistance. Each of the layers of varying refractive indexes is designed to include one-half of the adjacent gradient-composition layer and have the optical thickness of $\lambda/4$ when it is assumed that the oscillation wavelength is $\lambda$.

The to-be-selected oxidized layer 151 that is composed of, for example, p-AlAs is inserted to the p-DBR 147 with the thickness of, for example, 30 nanometers (nm). For example, the position to which to-be-selected oxidized layer 151 is to be inserted may be within the second pair of a high refractive index layer and a low refractive index layer when counted from the spacer layer 146. The to-be-selected oxidized layer 151 may include a layer such as a gradient-composition layer and an intermediate layer on the upper side and underside. In the present embodiment, the term selective oxidized layer collectively includes a layer that is actually oxidized.

The p-DBR 147, the spacer layer 146, the active layer 145, the spacer layer 144, and a part of the n-DBR 143 are removed by etching, and as a result, a plurality of mesas 150 that correspond to the VCSEL devices 110a, respectively, are formed.

An insulating layer 153 is formed to cover each of the mesas 150. For example, SiN, SiON, and $SiO_2$ may be used as materials for the insulating layer 153. An aperture 154 that exposes a part of the p-DBR 147 on the top of each of the mesas 150, and an aperture 156 that exposes a part of the n-DBR 143 at the bottom of the trench between a neighboring pair of mesas 150 are formed on the insulating layer 153.

A p-side electrode 155 that is electrically connected to the p-DBR 147 through the aperture 154 is independently formed on the insulating layer 153 for each one of the mesas 150. For example, a multilayered film in which titanium (Ti), platinum (Pt), and gold (Au) in the order listed from the p-DBR 147 side are stacked on top of each other may be used as the p-side electrode 155.

An n-side electrode 157 that is electrically connected to the n-DBR 143 through an aperture 156 is formed on the insulating layer 153. For example, a multilayered film in which gold-germanium (AuGe) alloy, nickel (Ni), and gold (Au) are stacked on top of each other in the order listed from the n-DBR 143 side may be used as the n-side electrode 157.

An n-contact layer such as n-GaAs layer may be arranged between the n-side electrode 157 and the n-DBR 143, and a p-contact layer such as a p-GaAs layer may be arranged between the p-side electrode 155 and the p-DBR 147.

In the VCSEL array substrate 110, light is emitted at the light-emitting points 148 of the multiple VCSEL devices 110a, and laser beams are emitted from the substrate 141 side.

As described above, the oscillation wavelength of the multiple VCSEL devices 110a is in a 940 nm band (about ±30 nm around 940 mm). Some of the wavelengths that are absorbed by the air of the earth is included in this wavelength range, and if such wavelengths are applied to, for example, a range sensor that uses laser beams to measure distance, a system with low noise can be configured. In this wavelength range, the absorption coefficient of ytterbium (Yb)-doped yttrium aluminum garnet (YAG) solid laser is high, and the Yb-doped YAG solid laser can efficiently be pumped or activated. The indium gallium arsenide (InGaAs) that is used for the quantum well layer of the active layer 145 has compression strain for gallium arsenide (GaAs), and each one of the multiple VCSEL devices 110a has a high differential gain (DG). For this reason, the VCSEL array substrate 110 can oscillate at a low threshold, and the VCSEL array substrate 110 has a high level of efficiency in light transformation. Note also that InGaAs does not include chemically-active Al. For this reason, the very small quantity of oxygen included in a reaction chamber during crystal growth cannot easily be taken in the active layer 145. Accordingly, high reliability can also be achieved.

The refractive index of the n-GaAs substrate is about 3.5. For this reason, when the outside of the substrate 141, which is an exit plane, is airspace, the light that is emitted from the light-emitting point 148 is refracted at the boundary between the substrate 141 and the air (refractive index n=1.0), and the angle of radiation of the laser beam increases. The microlenses 101a are arranged so as to correspond to the multiple VCSEL devices 110a, and the angle of radiation of the laser beam is controlled to a desired angle. As the angle of radiation of the laser beam is controlled, the spot diameter can be shortened when the laser beams that have passed through the microlenses 101a are concentrated onto an object through a condenser lens or the like.

As illustrated in FIG. 21C, a bottom face 101d of each of the spacers 101b contacts the top face 110b of the VCSEL array substrate 110, and the adhesive 120 is arranged around the contacting region. The spacers 101b and the VCSEL array substrate 110 are bonded together by the adhesive 120. At least, the adhesive 120 is arranged between the oblique face 101e and the top face 110b. In a planar view, the adhesive 120 may be squeezed out to an external area of each of the spacers 101b. The adhesive 120 may be spread out to an inner area of each of the microlenses 101a. However, the adhesive 120 does not reach an area of the VCSEL array substrate 110 through which light is emitted. Accordingly, the optical properties are not impaired.

A method of manufacturing the optical device 1 according to the first embodiment of the present disclosure is described below.

Figure 24:
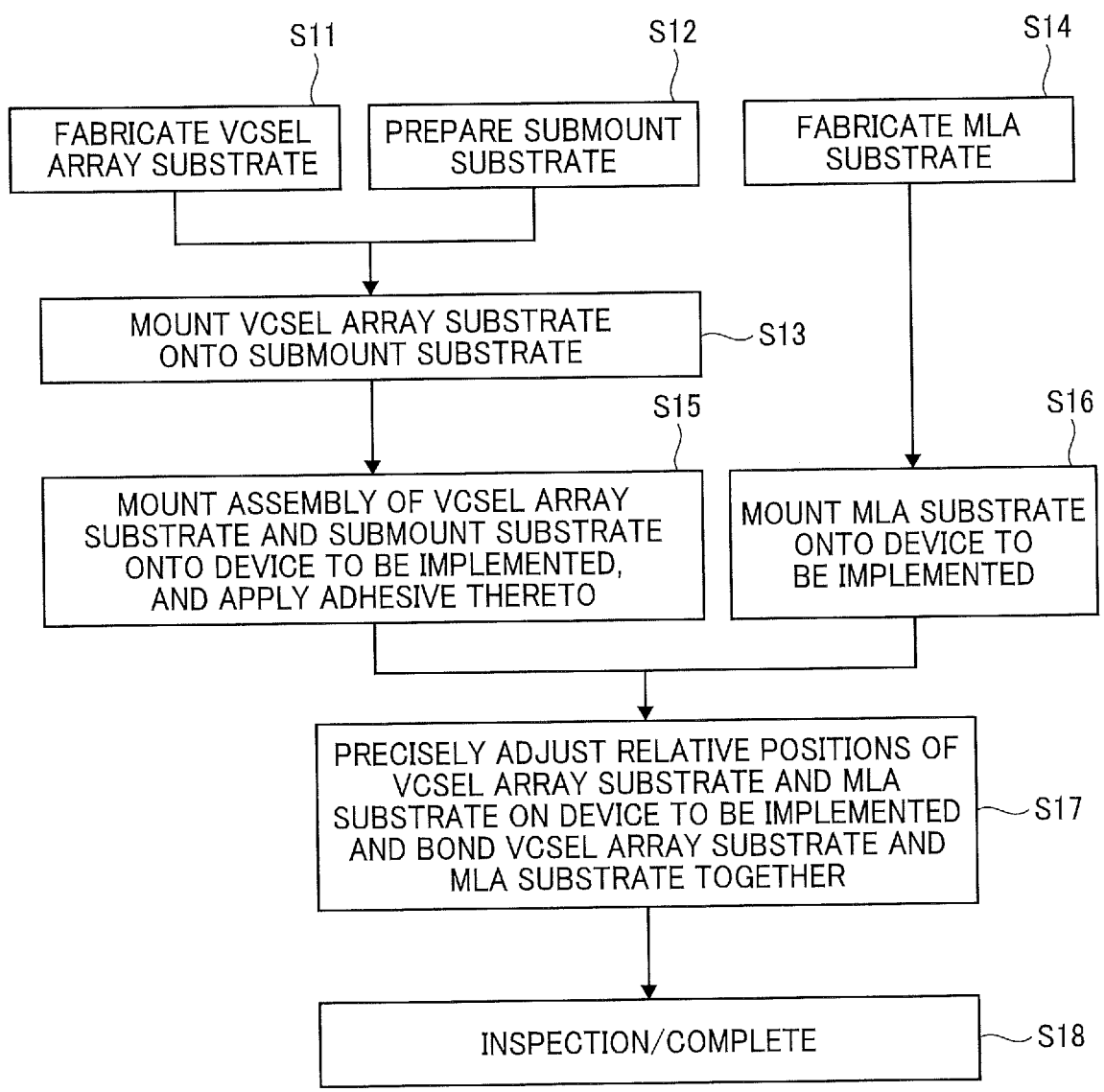
FIG. 24 is a flowchart of the processes of a method of manufacturing an optical device, according to the first embodiment of the present disclosure.

FIG. 24 is a flowchart of a method of manufacturing the optical device 1 according to the first embodiment of the present disclosure.

Firstly, the VCSEL array substrate 110 is made (step S11), and a submount substrate 111 is prepared for the housing (step S12). Then, the VCSEL array substrate 110 is implemented on the submount substrate 111 (step S13). A known method such as soldering may be used for the above implementation.

The MLA substrate 101 is made in a separate manner (step S14). For example, the MLA substrate 101 may be made by glass imprinting or etching. In view of the productivity, glass imprinting is more preferable.

Either one of the making of the MLA substrate 101 and the assembly of the VCSEL array substrate 110 and the submount substrate 111 may be done earlier than the other. Alternatively, the making of the MLA substrate 101 and the assembly of the VCSEL array substrate 110 and the submount substrate 111 may be done at the same time.

Subsequently, the assembly of the VCSEL array substrate 110 and the submount substrate 111 is implemented on a device to be implemented, and the adhesive 120 is applied to such a device to be implemented (step S15).

Figure 25A:
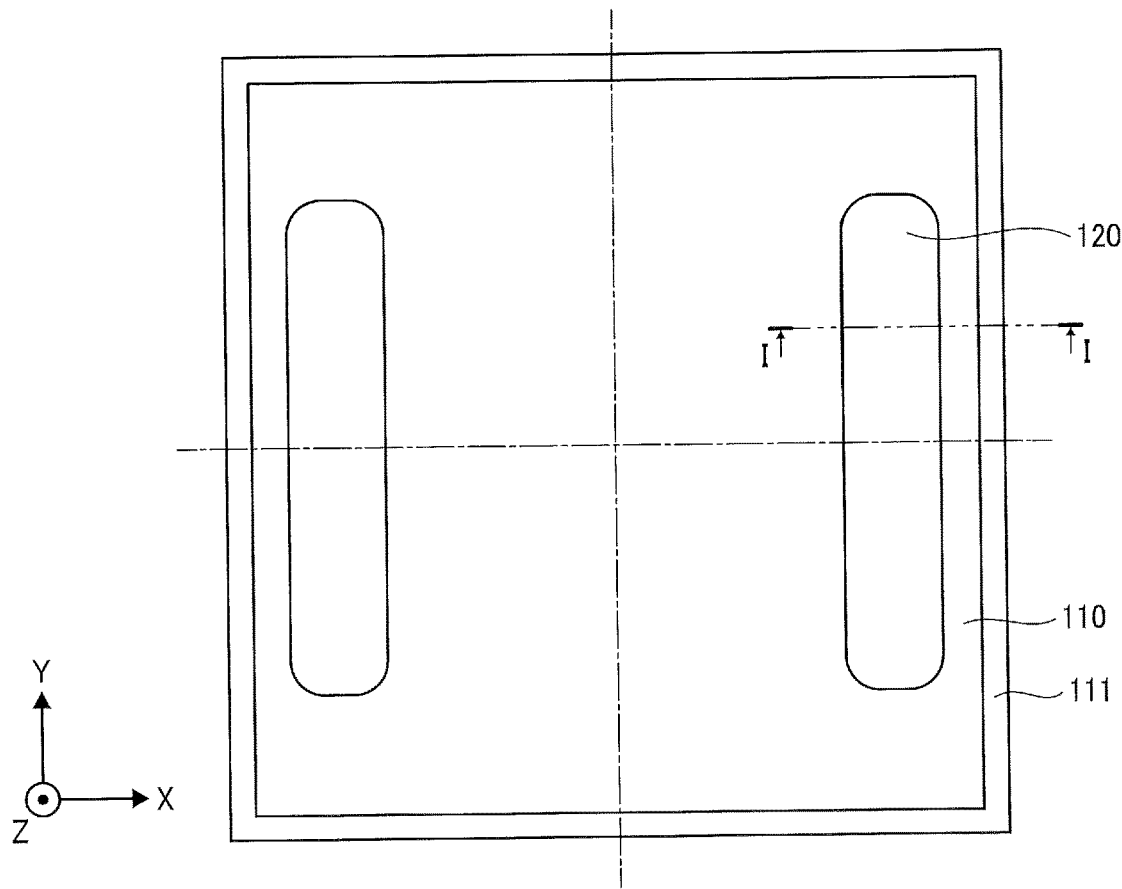
FIG. 25A is a top view of adhesive according to the first embodiment of the present disclosure.

FIG. 25A is a top view of the applied adhesive 120 according to the first embodiment of the present disclosure.

Figure 25B:
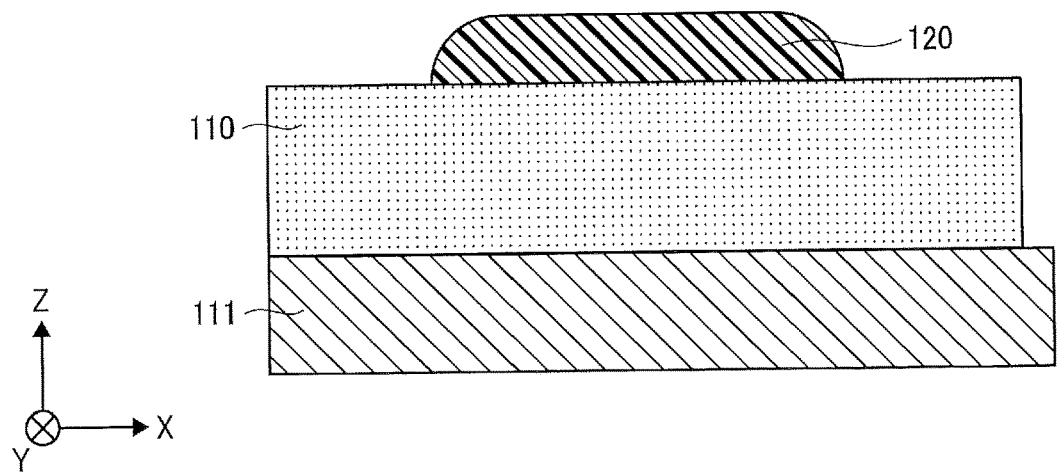
FIG. 25B is a sectional view of adhesive according to the first embodiment of the present disclosure.

FIG. 25B is a sectional view of the applied adhesive 120 according to the first embodiment of the present disclosure.

FIG. 25B is a diagram illustrating a cross-sectional view along line I-I of FIG. 25A. As illustrated in FIG. 25A and FIG. 25B, the adhesive 120 is applied to an area to which the spacers 101b of the VCSEL array substrate 110 is to be bonded. The materials of the adhesive 120 may be selected depending on, for example, the way of bonding and the materials of the VCSEL array substrate 110. For example, screen printing is adopted, and the VCSEL array substrate 110 may be pattern-coated with silver (Ag) paste. The MLA substrate 101 is implemented on a device to be implemented in a separate manner (step S16).

Then, the relative positions of the MLA substrate 101 and the assembly of the VCSEL array substrate 110 and the submount substrate 111 are adjusted with a high degree of precision, and the MLA substrate 101 and the assembly of the VCSEL array substrate 110 and the submount substrate 111 are bonded together (step S17). Finally, the manufacturing of the optical device 1 is complete after the inspection (step S18).

The VCSEL array substrate 110 may be conductively connected to an IC package before or after the bonding processes of the MLA substrate 101. When the VCSEL array substrate 110 is conductively connected to an IC package after the bonding processes of the MLA substrate 101, such an electrical conduction can be implemented by performing, for example, known wire bonding from an edge of the VCSEL array substrate 110.

According to the first embodiment of the present disclosure, the cross section of each of the spacers 101b has an oblique shape at the front end such that the area of the joint will be small. Due to such a configuration, the adhesive 120 stays at an inclined portion, and the amount of the spread of the adhesive 120 can be controlled. As described above, according to the first embodiment of the present disclosure, the adhesive 120 can be prevented from being spread out and reaching the optically-effective regions such as the lens units of the MLA substrate 101 or the light-emitting units of the VCSEL array substrate 110. As the cross-sectional area of the front end of each of the spacers 101b is smaller than that of the root end, the adhesive 120 can be squeezed out to the sides of the spacers 101b in a gradual manner, and the variations in the amount of the spread of the adhesive 120 and the irregularities of the spread of the adhesive 120 in a planar view can be reduced. For this reason, when the distance between the optical area and the bonding area is designed in view of the variations in and the size of the spread of the adhesive 120 at the time of bonding, such distance can be shortened.

Each of the spacers 101b maintains the distance between the multiple VCSEL devices 110a and the multiple microlenses 101a at a constant value. As a result, desired optical properties can be achieved, and the optical device 1 (laser-beam source module) can be downsized.

Alternatively, the microlenses 101a may be arranged on the other side of the VCSEL array substrate 110, instead of being arranged on the face of the MLA substrate 101 on the VCSEL array substrate 110 side. Alternatively, the microlenses 101a may be arranged both on the face of the MLA substrate 101 on the VCSEL array substrate 110 side and on the other side of the VCSEL array substrate 110.

In the VCSEL array substrate 110, the multiple VCSEL devices 110a may be configured to emit light from the other side of the substrate 141. In other words, the multiple VCSEL devices 110a may be configured to emit light from the mesas 150 side.

The number of spacers 101b is not limited to any specific value. The planar shape of each of the spacers 101b may have a shape other than the rectangular shape as long as it has longitudinal sides. In the present embodiment, the optical axis of the VCSEL device and the optical axis of the corresponding microlens are arranged such that those optical axes match. However, no limitation is intended thereby, and it may be arranged such that the laser beams that are emitted from a plurality of VCSEL devices are incident on a single microlens, or the optical axis of the VCSEL device and the optical axis of the corresponding microlens may be arranged such that those optical axes are shifted and made different from each other.

Modification of First Embodiment

A first modification of the first embodiment of the present disclosure is described below. The modification of the first embodiment of the present disclosure is that the shape in cross section of the spacers 101b is different from the first embodiment.

Figure 26A:
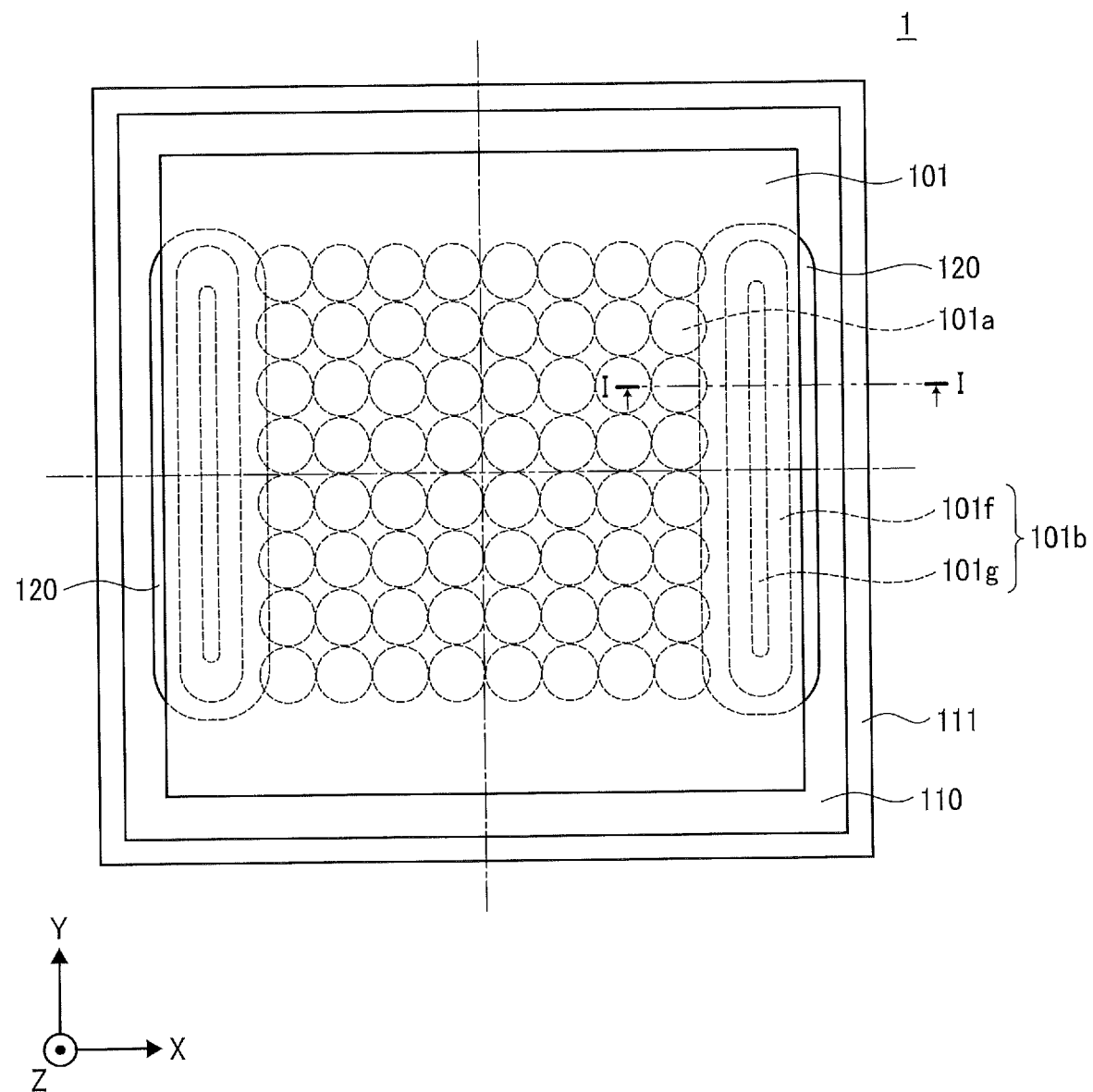
FIG. 26A is a top view of an optical device according to a modification of the first embodiment of the present disclosure.

FIG. 26A is a top view of the optical device 1 according to a modification of the first embodiment of the present disclosure.

Figure 26B:
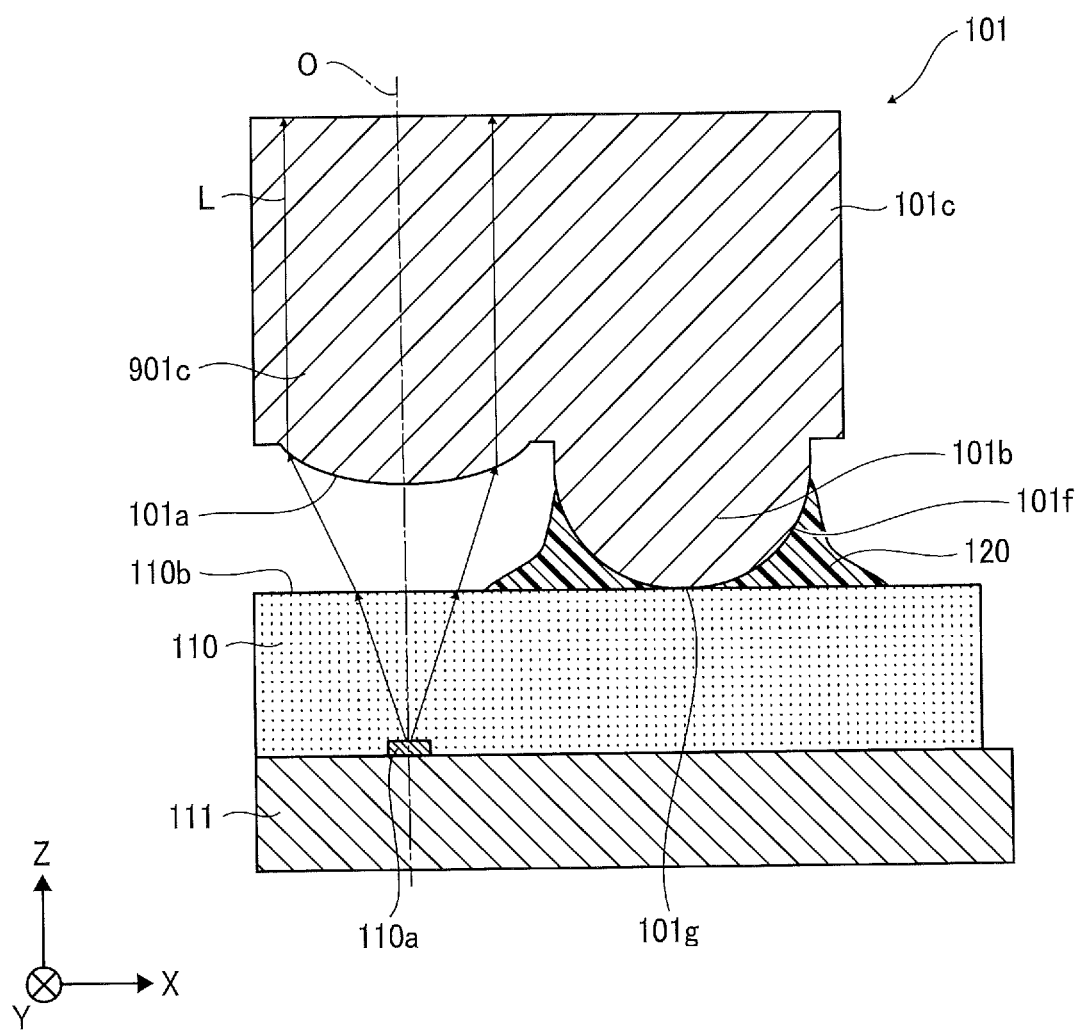
FIG. 26B is a sectional view of an optical device according to a modification of the first embodiment of the present disclosure.

FIG. 26B is a sectional view of the optical device 1 according to a modification of the first embodiment of the present disclosure.

Figure 27A:
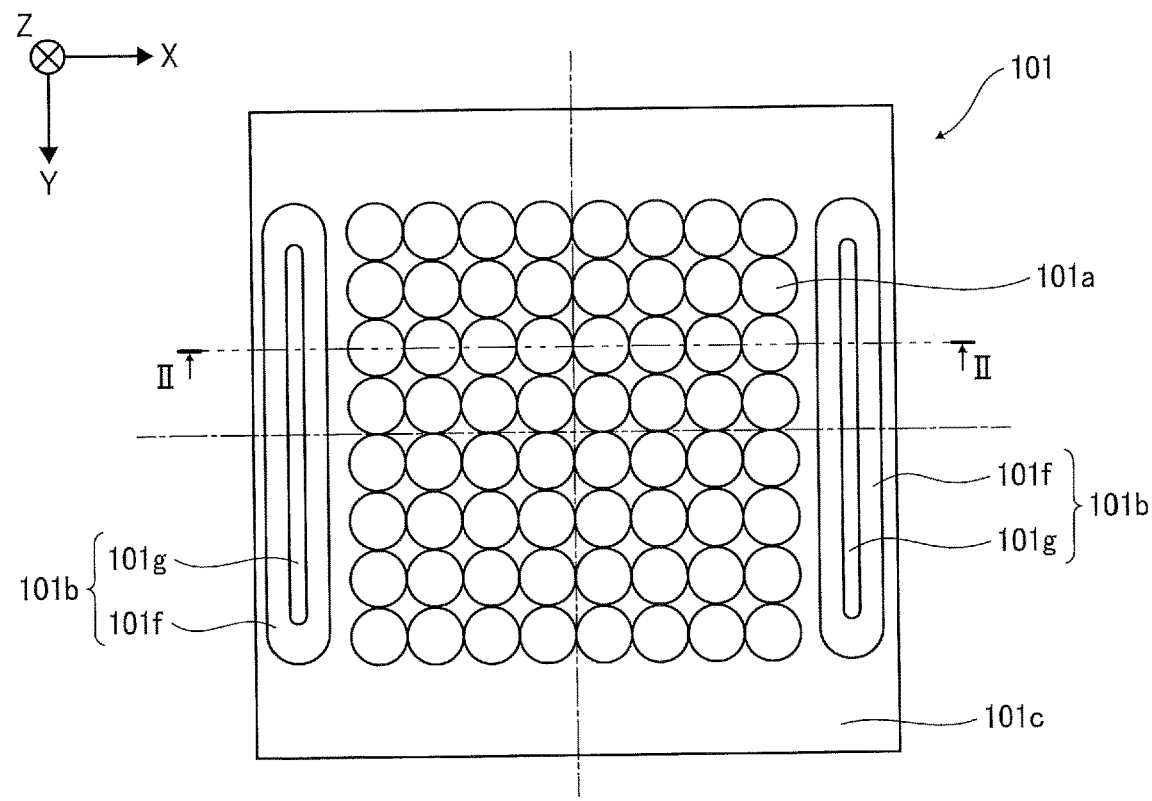
FIG. 27A is a bottom view of an MLA substrate according to a modification of the first embodiment of the present disclosure.

FIG. 27A is a bottom view of the MLA substrate 101 according to the modification of the first embodiment of the present disclosure.

Figure 27B:
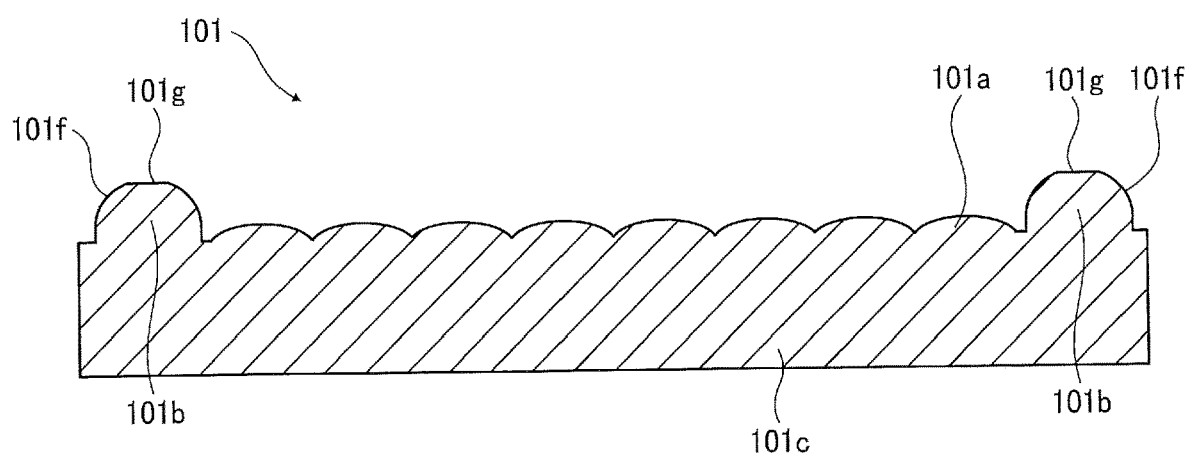
FIG. 27B is a sectional view of an MLA substrate according to a modification of the first embodiment of the present disclosure.

FIG. 27B is a sectional view of the MLA substrate 101 according to a modification of the first embodiment of the present disclosure.

FIG. 26B is a diagram illustrating a cross-sectional view along line I-I of FIG. 26A. FIG. 27B is a diagram illustrating a cross-sectional view along line II-II of FIG. 27A.

As illustrated in FIG. 26A, FIG. 26B, FIG. 27A, and FIG. 27B, in a similar manner to the spacer 953 as described above, each one of the spacers 101b according to the present modification of the first embodiment described above has a shape in cross section where a spherically curved face 101f is formed at the bottom end of the rectangular shape. A planar face 101g is arranged at the apex of the curved face 101f with the width of a few or several micrometers (μm). In other words, each one of the spacers 101b includes the planar face 101g that contacts the top face 110b, and the spherically curved face 101f that is disposed on a side closer to the face of the MLA substrate 101, on which the microlenses 101a are arranged, than the planar face 101g, and thus is apart from the top face 110b. In other words, the face of each of the spacers 101b viewable from the VCSEL array substrate 110 side includes the planar face 101g that contacts the top face 110b, and a curved face 101f that has spherical surface and is recessed towards the face of the MLA substrate 101, on which the microlenses 101a are arranged, with reference to the planar face 101g. As described above, the cross-sectional shape of each of the spacers 101b has a curved shape in which the size on the MLA substrate 101 side is greater than the size on the bonding interface side. The planar face 101g is an example of a first part, and the curved face 101f is an example of a second part.

The other aspects of the configuration according to the present embodiment are equivalent to those of the first embodiment as described above.

Also with such a modification of the first embodiment of the present disclosure, advantageous effects similar to those of the first embodiment as described above can be achieved.

Alternatively, the arrangement of the planar face 101g may be omitted. In such cases, the apex of the curved face 101f is an example of a first part.

Like the spacer 954, each of the spacers 101b may have a shape in cross section where a step is formed at the bottom end of the rectangular shape and a side face that is connected to a bottom face is formed. In such cases, the bottom face is an example of a first part, and the bottom face of the step continuous to the side faces is an example of a second part.

Second Embodiment

A second embodiment of the present disclosure is described below. In the first embodiment of the present disclosure, the optical device 1 is manufactured as the VCSEL array substrate 110 that is chipped and the MLA substrate 101 that is chipped are bonded together. By contrast, in the second embodiment of the present disclosure, a wafer including a plurality of VCSEL array substrates 110 and a wafer including a plurality of MLA substrates 101 are bonded together, and dicing is performed after the bonding. The optical device 2 according to the second embodiment of the present disclosure is manufactured as described above, and is different from the optical device of the first embodiment in regard to the structure.

Figure 28A:
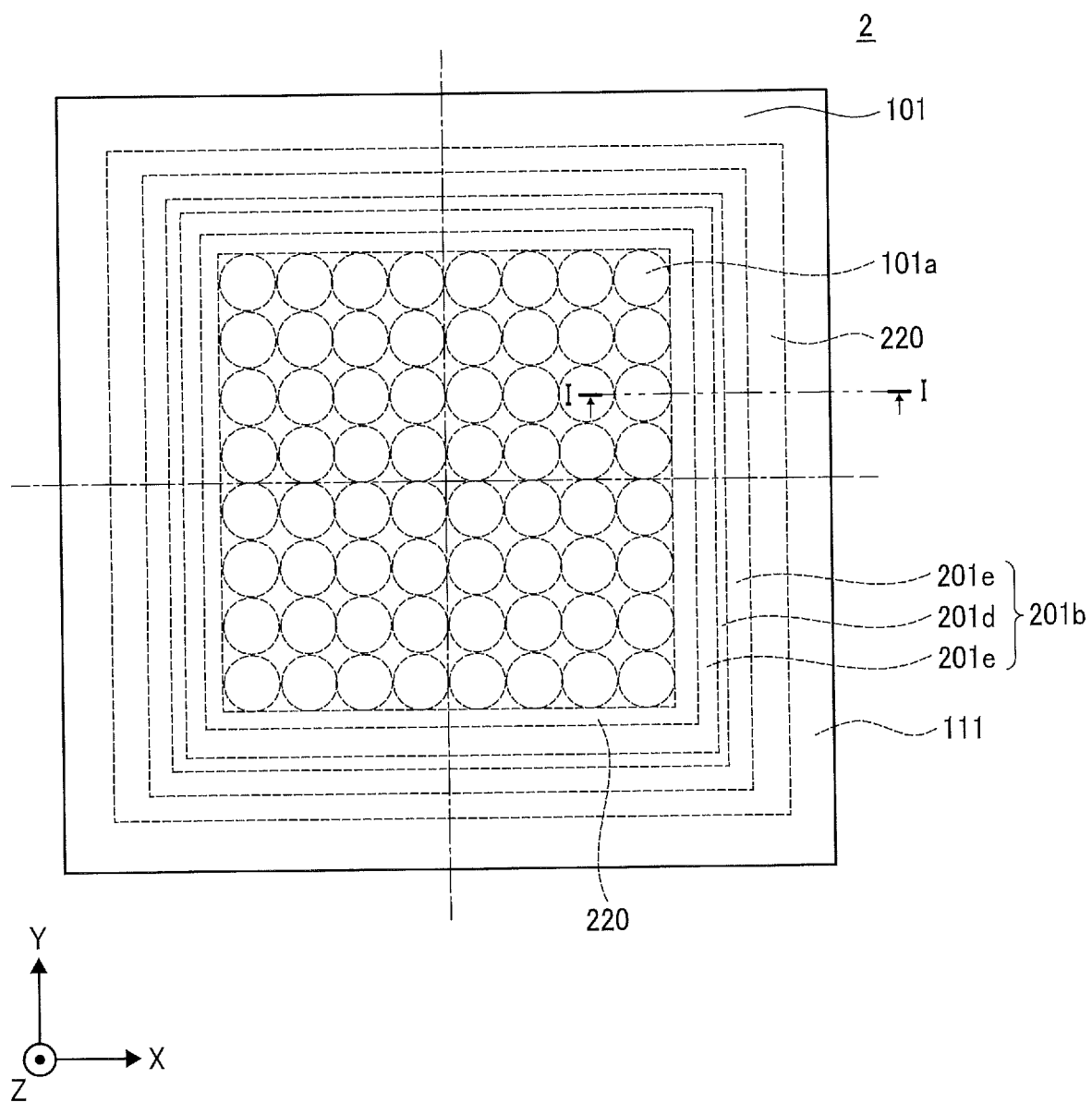
FIG. 28A is a plan view of an optical device according to a second embodiment of the present disclosure.

FIG. 28A is a plan view of the optical device 2 according to the second embodiment of the present disclosure.

Figure 28B:
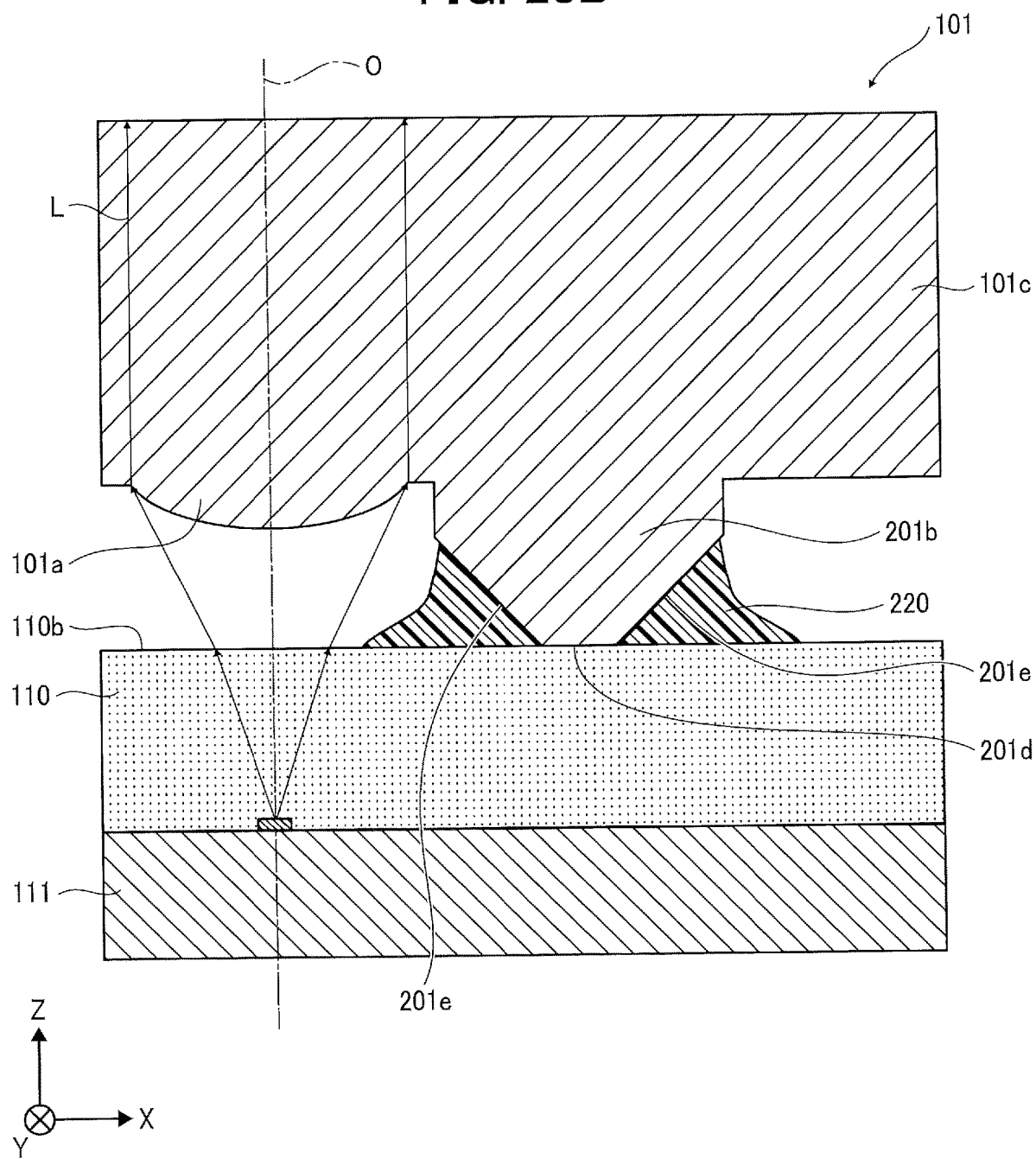
FIG. 28B is a sectional view of an optical device according to the second embodiment of the present disclosure.

FIG. 28B is a sectional view of the optical device 2 according to the second embodiment of the present disclosure.

Figure 29A:
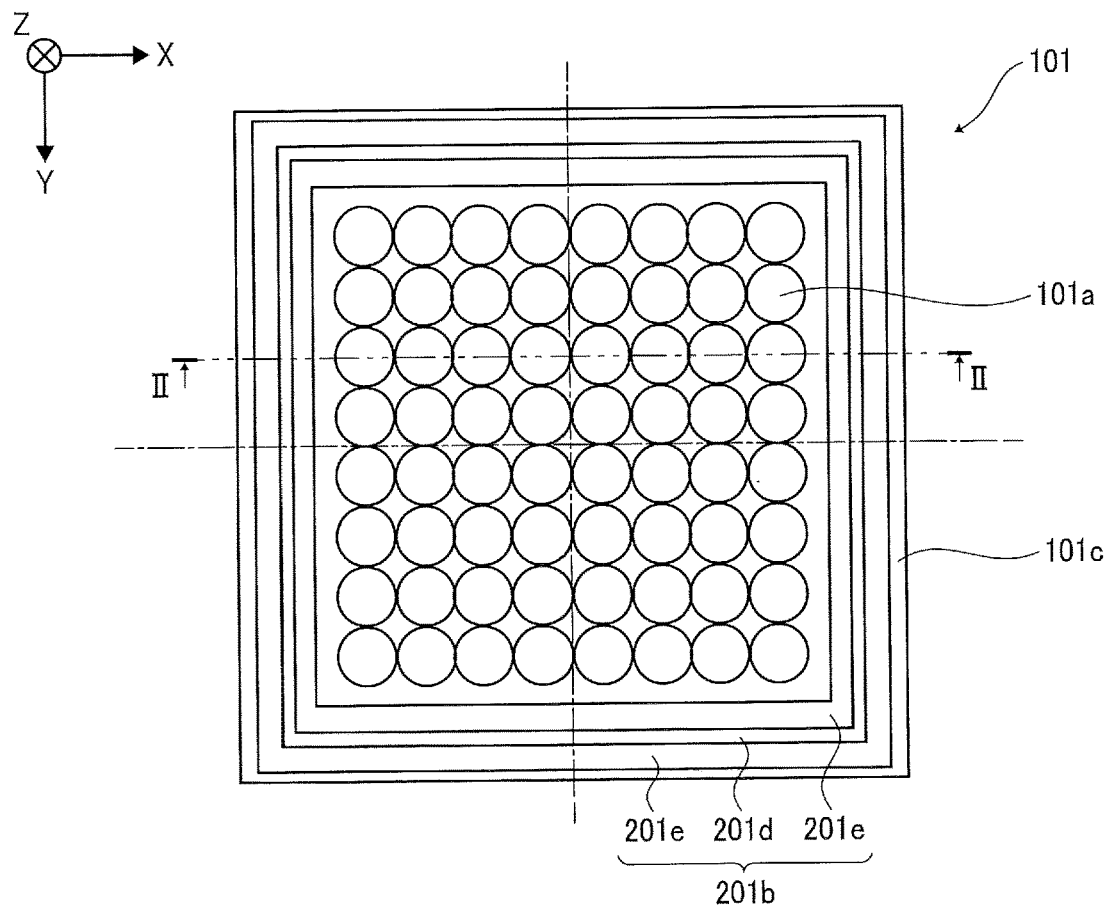
FIG. 29A is a bottom view of an MLA substrate according to the second embodiment of the present disclosure.

FIG. 29A is a bottom view of the MLA substrate 101 according to the second embodiment of the present disclosure.

Figure 29B:
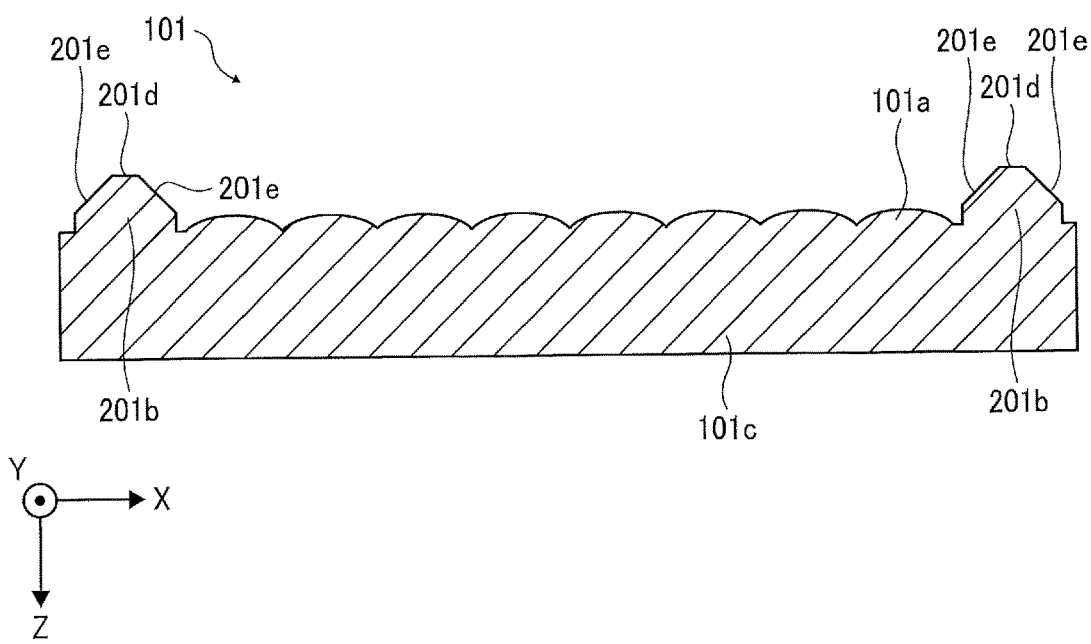
FIG. 29B is a sectional view of an MLA substrate according to the second embodiment of the present disclosure.

FIG. 29B is a sectional view of the MLA substrate 101 according to the second embodiment of the present disclosure.

FIG. 28B is a diagram illustrating a sectional view along line I-I of FIG. 28A.

FIG. 29B is a diagram illustrating a cross-sectional view along line II-II of FIG. 29A.

As illustrated in FIG. 28A, FIG. 28B, FIG. 29A, and FIG. 29B, in the optical device 2 according to the second embodiment of the present disclosure, the spacer 201b is arranged to surround all directions of the MLA. In other words, the spacer 201b includes a pair of elements on both sides of the MLA in the X-axis directions and a pair of elements on both sides of the MLA in the Y-axis directions, and these four elements are joined together. Accordingly, a single spacer 201b is formed in a circular shape. The spacer 201b has a shape in cross section similar to that of the spacer 101b. In other words, the bottom end of the rectangular shape of the spacer 201b according to the second embodiment of the present disclosure is chamfered, and the spacer 201b has a shape in cross section where an oblique face 201e that is connected to a bottom face 201d is formed. The bottom face 201d is an example of a first part, and the oblique face 201e is an example of a second part.

The bottom face 201d of the spacer 201b contacts the top face 110b of the VCSEL array substrate 110, and the adhesive 220 is arranged around the contacting region. In a similar manner to the spacer 201b, the adhesive 220 is arranged in a circular shape in a planar view. The spacers 201b and the VCSEL array substrate 110 are bonded together by the adhesive 220. At least, the adhesive 220 is arranged between the oblique face 201e and the top face 110b. In a planar view, the adhesive 220 may be squeezed out to an external area of each of the spacers 201b.

In a planar view, the frame of the VCSEL array substrate 110 and the frame of the base 101c of the MLA substrate 101 are in line with the frame on the submount substrate 111.

The other aspects of the configuration according to the present embodiment are equivalent to those of the first embodiment as described above.

A method of manufacturing the optical device 2 according to the second embodiment of the present disclosure is described below.

FIG. 30 is a flowchart of a method of manufacturing the optical device 2 according to the second embodiment of the present disclosure.

Figure 31:
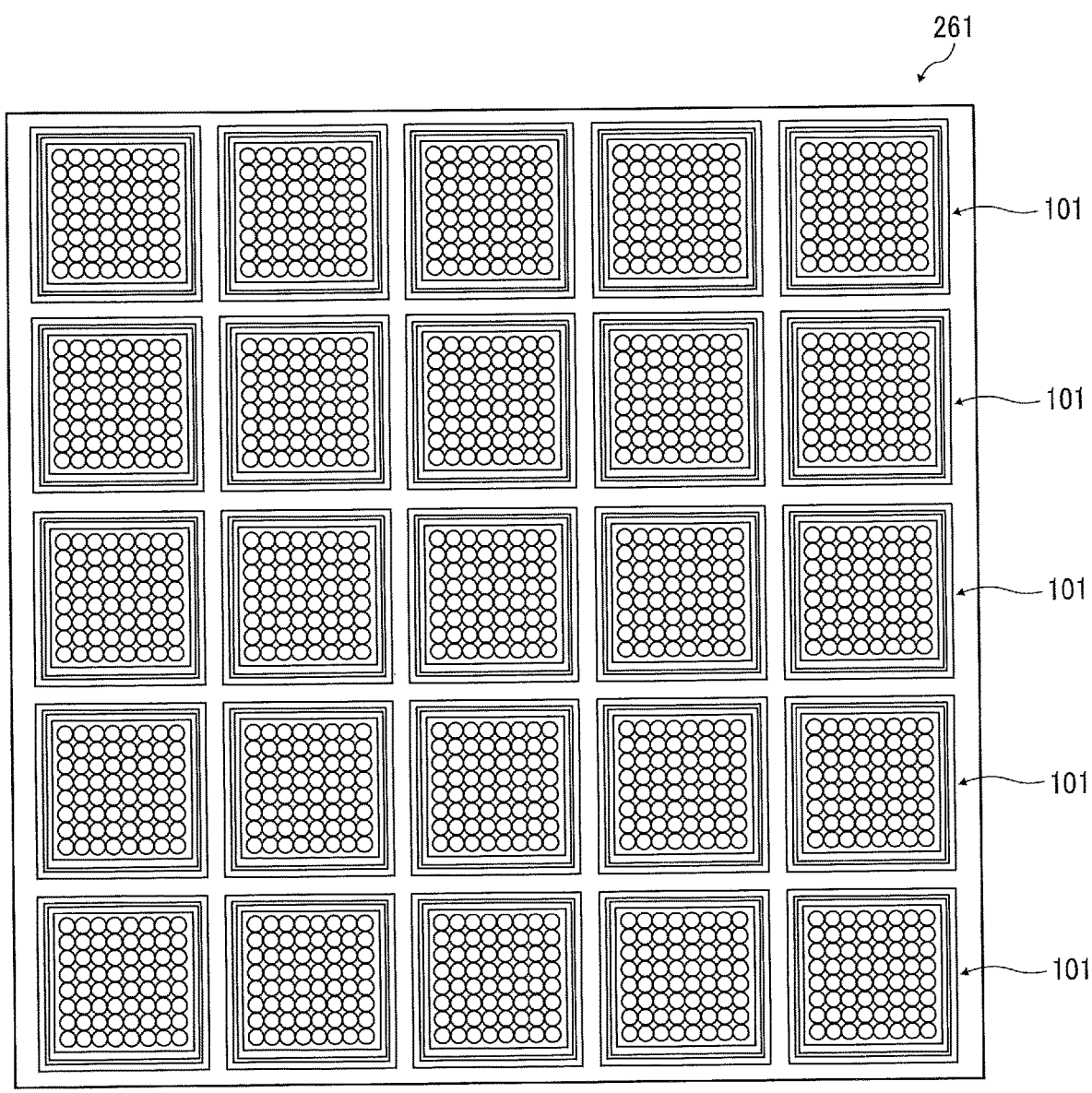
FIG. 31 is a bottom view of an MLA substrate of large format, according to the second embodiment of the present disclosure.

FIG. 31 is a bottom view of an MLA substrate 261 of large format, according to the second embodiment of the present disclosure.

Figure 32A:
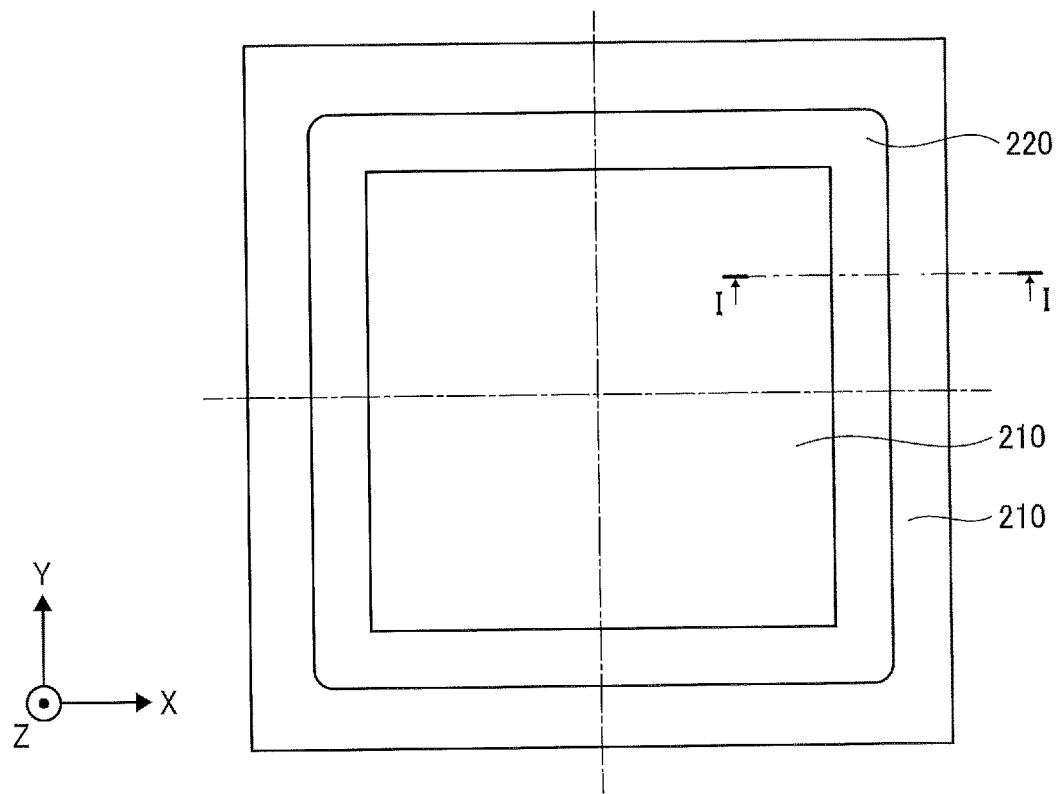
FIG. 32A is a top view of adhesive according to the second embodiment of the present disclosure.

FIG. 32A is a top view of the adhesive 220 according to the second embodiment of the present disclosure.

Figure 32B:
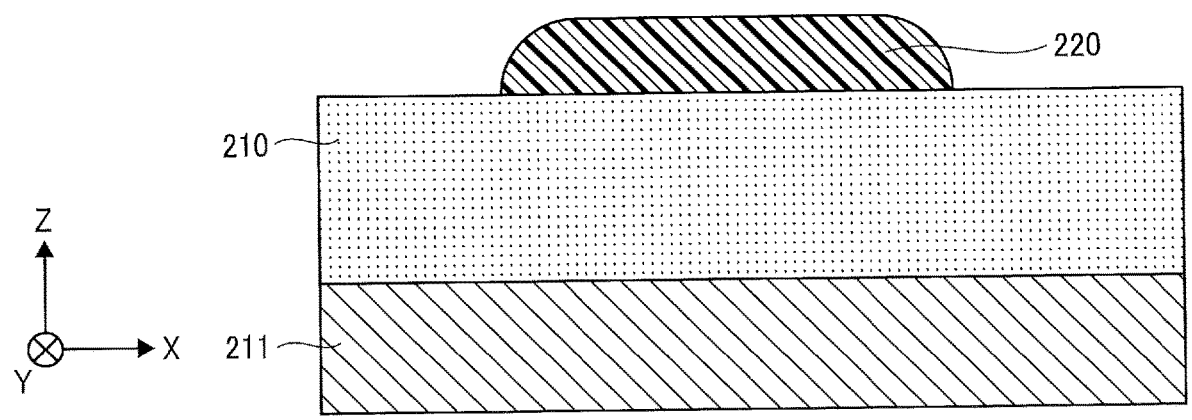
FIG. 32B is a sectional view of adhesive according to the second embodiment of the present disclosure.

FIG. 32B is a sectional view of the adhesive 220 according to the second embodiment of the present disclosure.

FIG. 32B is a diagram illustrating a sectional view along line I-I of FIG. 32A. FIG. 32A illustrates the elements that correspond to a single optical device 2.

Figure 33A:
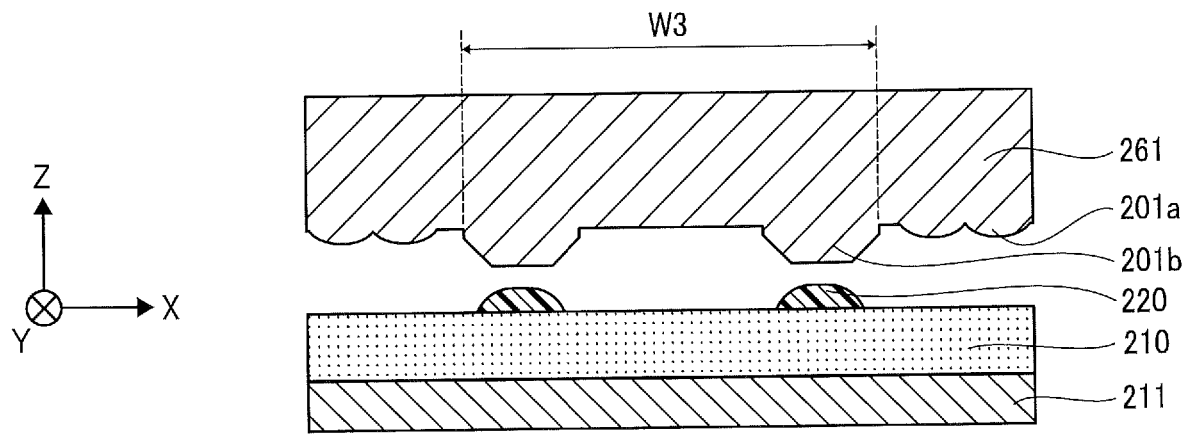
FIG. 33A is a first sectional view illustrating a method of manufacturing an optical device, according to the second embodiment of the present disclosure.
Figure 33B:
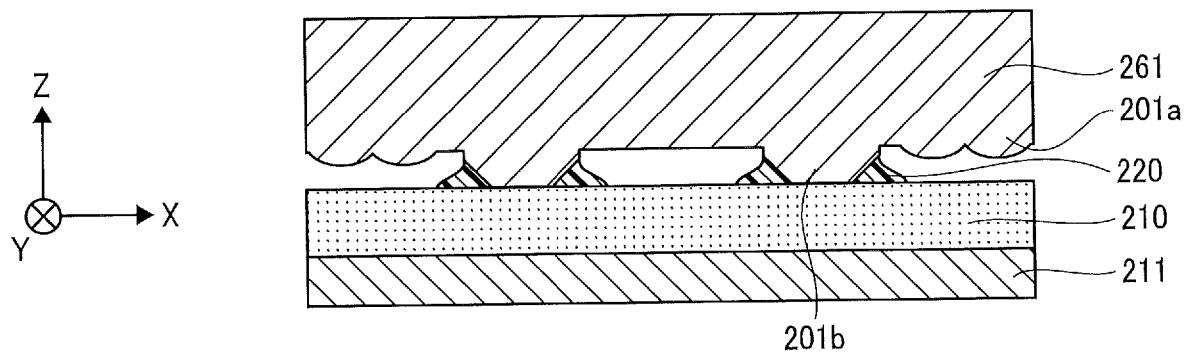
FIG. 33B is a second sectional view illustrating a method of manufacturing an optical device, according to the second embodiment of the present disclosure.
Figure 33C:
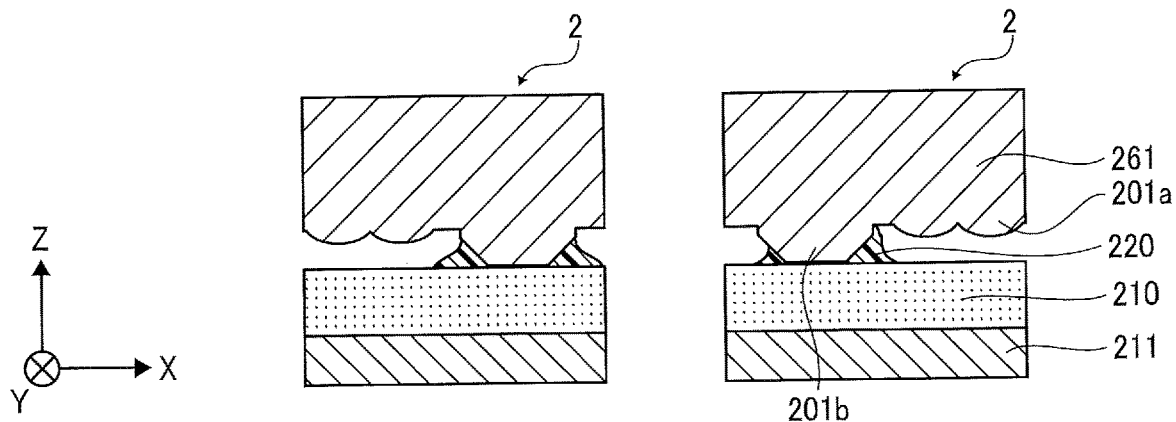
FIG. 33C is a third sectional view illustrating a method of manufacturing an optical device, according to the second embodiment of the present disclosure.

FIG. 33A to FIG. 33C are sectional views illustrating a method of manufacturing the optical device 2 according to the second embodiment of the present disclosure.

Firstly, a VCSEL array substrate 210 of large format (see FIG. 32A and FIG. 32B) is made (step S21), and a submount substrate 211 of large format (see FIG. 32B) is prepared for the housing (step S22). A plurality of VCSEL array substrates 110 that are not-yet chipped are arranged on the VCSEL array substrate 210. The same number of submount substrates 111, which are not-yet chipped, as the multiple VCSEL array substrates 110 included in the VCSEL array substrate 210 are arranged on the submount substrate 211. Then, the VCSEL array substrate 210 is implemented on the submount substrate 211 (step S23). When such implementation is performed, a known method such as soldering may be used.

The MLA substrate 261 of large format is made in a separate manner (step S24). The same number of MLA substrates 101, which are not-yet chipped, as the multiple VCSEL array substrates 110 included in the VCSEL array substrate 210 are arranged on the MLA substrate 261. For example, the MLA substrate 261 may be made by glass imprinting or etching. In view of the productivity, glass imprinting is more preferable.

Either one of the making of the MLA substrate 261 and the assembly of the VCSEL array substrate 210 and the submount substrate 211 may be done earlier than the other. Alternatively, the making of the MLA substrate 261 and the assembly of the VCSEL array substrate 210 and the submount substrate 211 may be done at the same time.

Subsequently, the assembly of the VCSEL array substrate 210 and the submount substrate 211 is implemented on a device to be implemented, and the adhesive 220 is applied to such a device to be implemented (step S25). As illustrated in FIG. 32A and FIG. 32B, the adhesive 220 is applied to an area to which the spacers 101b of the VCSEL array substrate 210 is to be bonded. The adhesive 220 that is adopted in the second embodiment of the present application may be equivalent to the adhesive 120 that is adopted in the first embodiment of the present application ad described above. The MLA substrate 261 is implemented on a device to be implemented in a separate manner (step S26).

Then, as illustrated in FIG. 33A, the relative positions of the MLA substrate 261 and the assembly of the VCSEL array substrate 210 and the submount substrate 211 are adjusted with a high degree of precision, and then, as illustrated in FIG. 33B, the MLA substrate 261 and the assembly of the VCSEL array substrate 210 and the submount substrate 211 are bonded together (step S27). Then, as illustrated in FIG. 33C, a dicing machine is used to cut a composite of the assembly and the MLA substrate 261 into separate pieces (step S28). Finally, the manufacturing of the optical device 2 is complete after the inspection (step S29).

Before the MLA substrate 261 is implemented on the assembly of the VCSEL array substrate 210 and the submount substrate 211, the VCSEL array substrate 210 is conductively connected to an IC package. This is because the VCSEL array substrate 210 is covered with the MLA substrate 261 after the MLA substrate 261 is implemented. Once the VCSEL array substrate 210 is covered with the MLA substrate 261, the VCSEL array substrate 210 becomes physically inaccessible.

Also with the second embodiment of the present disclosure, advantageous effects similar to those of the first embodiment as described above can be achieved. In the second embodiment of the present disclosure, the spacer 201b continuously surrounds the MLA in a planar view. Due to such a configuration, the cutting water that is used for dicing can be prevented from entering an optically-effective region.

Each of the spacers 201b may have a curved face in cross section as in the control sample of the first embodiment of the present disclosure, or may have a step like the spacer 954.

Third Embodiment

A third embodiment of the present disclosure is described below. In the second embodiment, a wafer including a plurality of VCSEL array substrates 110 and a wafer including a plurality of MLA substrates 101 are bonded together, and dicing is performed after the bonding. In such methods, a part of the corners or sides of the MLA substrate 101 in a planar view may be cracked or chipped when dicing is performed. Such a cracking or the like may be referred to as chipping.

Figure 34:
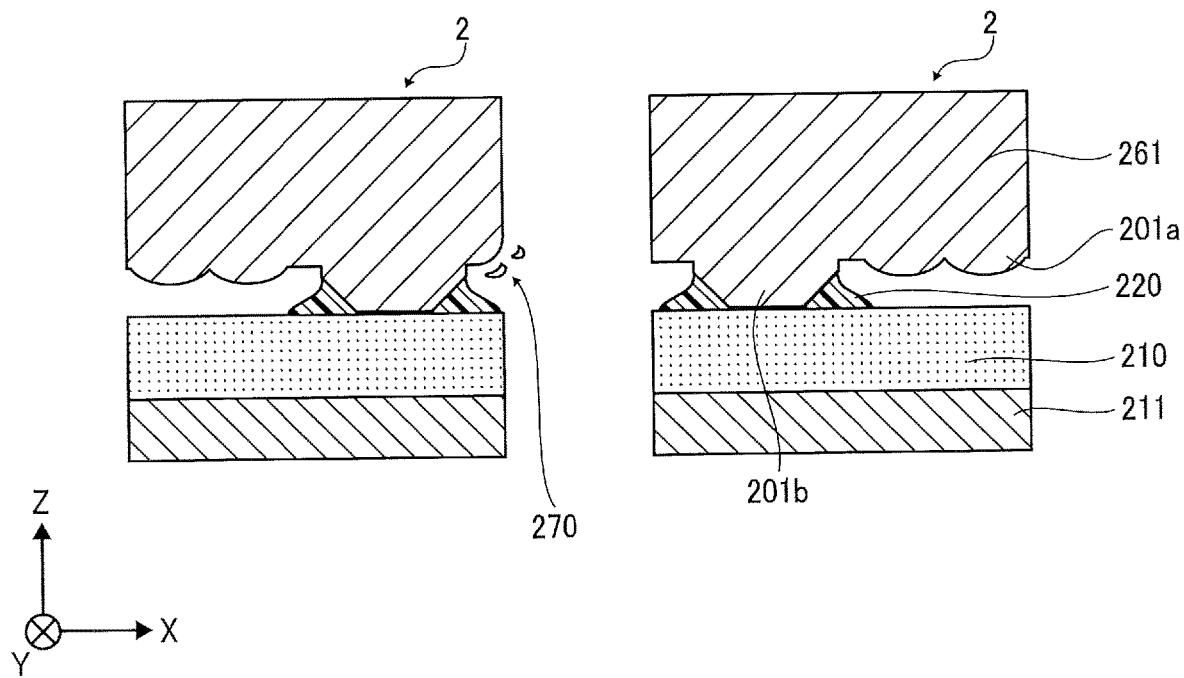
FIG. 34 is a sectional view illustrating chipping according to the second embodiment of the present disclosure chipping.

FIG. 34 is a sectional view illustrating chipping according to the second embodiment of the present disclosure. chipping When dicing is performed, excessive stress tends to be applied to, for example, some of the corners of the MLA substrate 101, and the chipping 270 is caused by such stress. By contrast, in the third embodiment of the present disclosure, dicing is performed while controlling or reducing the stress that could be applied to, for example, some of the corners of the MLA substrate 101. The optical device 3 according to the third embodiment of the present disclosure, which is produced as above, is different from the optical device of the second embodiment in regard to the structure.

Figure 35:
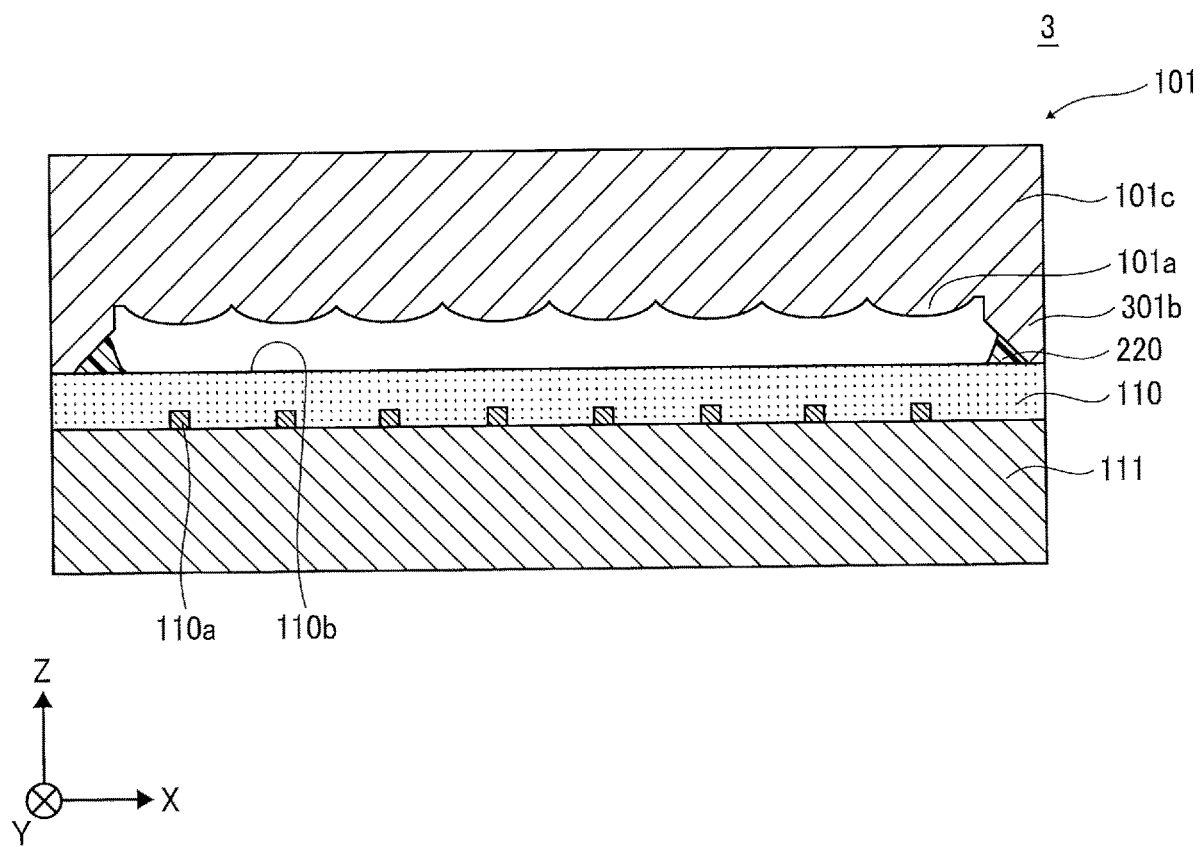
FIG. 35 is a sectional view of an optical device according to a third embodiment of the present disclosure.

FIG. 35 is a sectional view of the optical device 3 according to the third embodiment of the present disclosure.

As illustrated in FIG. 35, in the optical device 3 according to the third embodiment of the present disclosure, spacers 301b are formed as dicing is performed in the center of the width direction of the portion that corresponds to the spacer 201b according to the second embodiment of the present disclosure. Due to this configuration, a bottom side of each of the spacers 301b contacts the top face 110b of the VCSEL array substrate 110 throughout the outer regions of the optical device 3. If there is a point where each of the spacers 301b contacts the top face 110b of the VCSEL array substrate 110 in at least some of the outer regions of the optical device 3, the further spread of chipping can be prevented effectively when chipping occurs at a non-contacting part. It is more desirable if the spacers 301b are arranged such that each of the spacers 301b contacts the top face 110b of the VCSEL array substrate 110 at the corners of the optical device 3 where stress tends to occur. With the optical device 3 according to the third embodiment of the present disclosure, the spacers 301b are arranged such that each of the spacers 301b contacts the top face 110b of the VCSEL array substrate 110 throughout the outer regions of the optical device 3. Due to this configuration, the chances of chipping can be reduced more effectively.

The other aspects of the configuration according to the present embodiment are equivalent to those of the second embodiment of the second embodiment of the present disclosure as described above.

Each of the spacers 301b may have a curved face in cross section, or may have a step in cross section like the spacer 954, as in the control samples of the first embodiment of the present disclosure.

A method of manufacturing the optical device 3 according to the third embodiment of the present disclosure is described below.

Figure 36A:
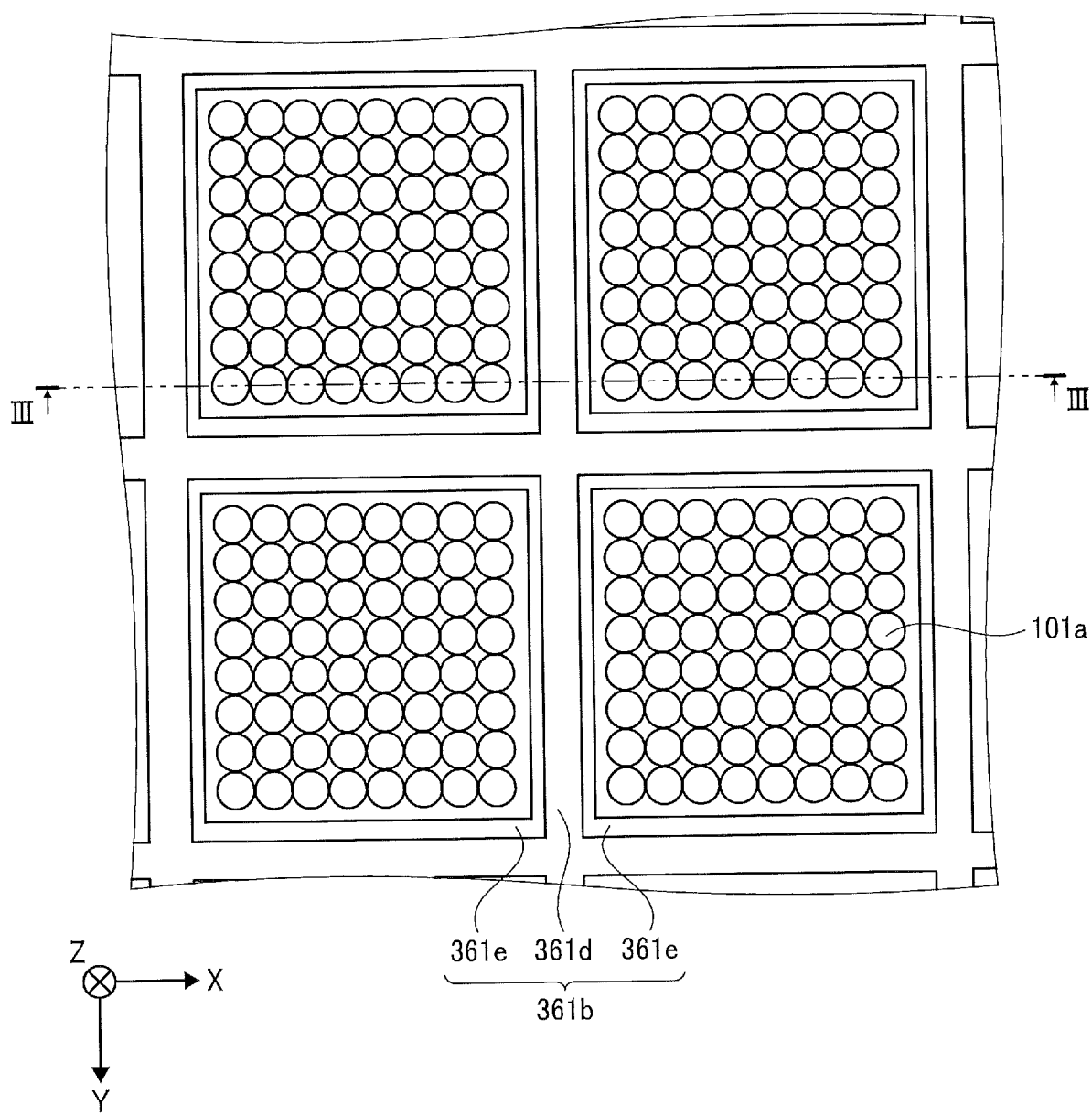
FIG. 36A is a bottom view of a part of a large-format MLA substrate used in the third embodiment of the present disclosure.

FIG. 36A is a bottom view of a part of the large-format MLA substrate 361 used in the third embodiment of the present disclosure.

Figure 36B:
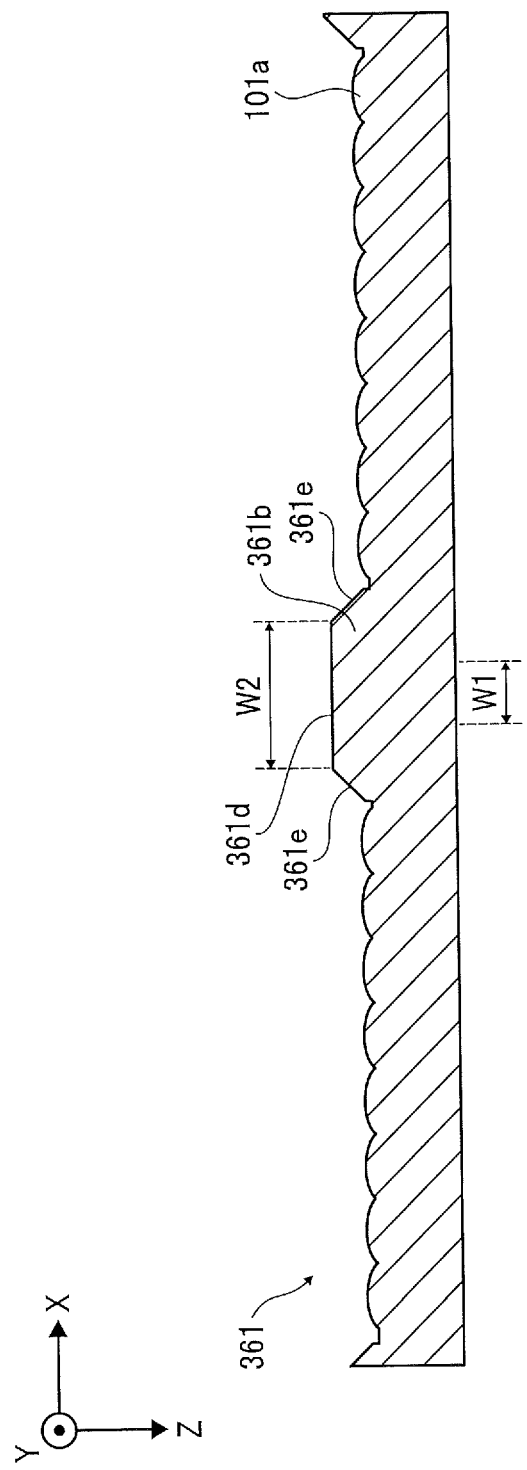
FIG. 36B is a sectional view of a part of a large-format MLA substrate used in the third embodiment of the present disclosure.

FIG. 36B is a sectional view of a part of the large-format MLA substrate 361 used in the third embodiment of the present disclosure.

FIG. 36B is a diagram illustrating a sectional view along line of FIG. 36A.

Figure 37A:
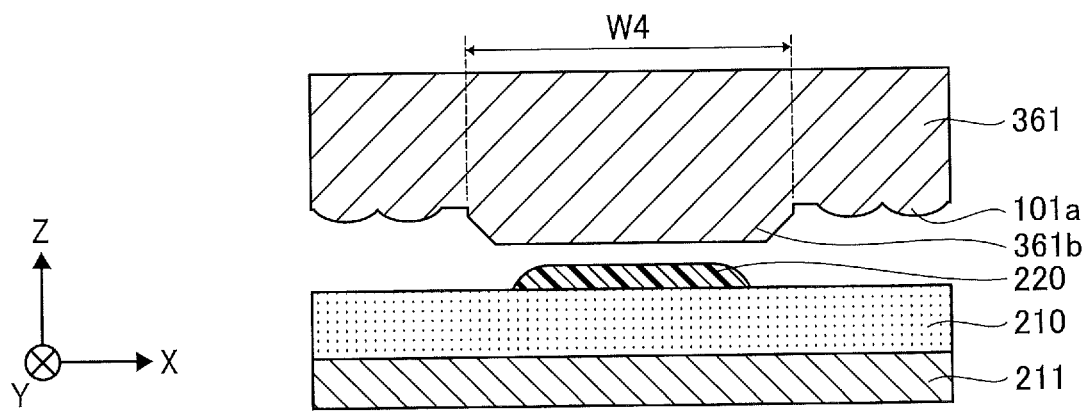
FIG. 37A is a first sectional view illustrating a method of manufacturing an optical device, according to the third embodiment of the present disclosure.
Figure 37B:
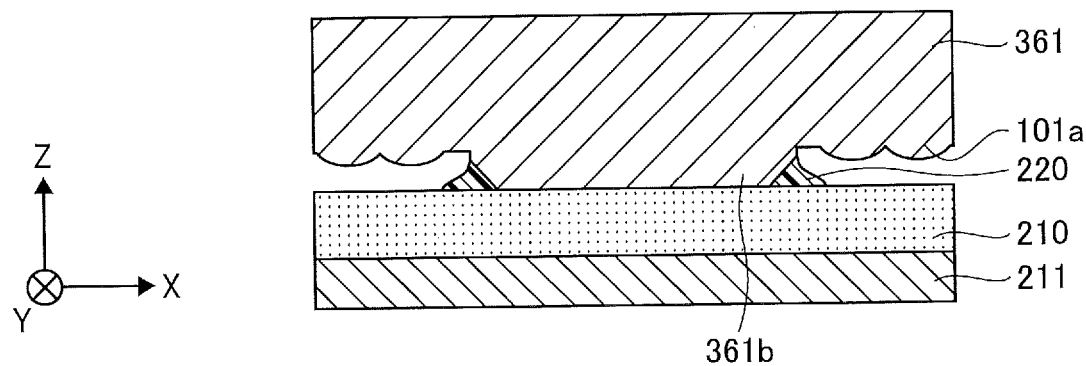
FIG. 37B is a second sectional view illustrating a method of manufacturing an optical device, according to the third embodiment of the present disclosure.
Figure 37C:
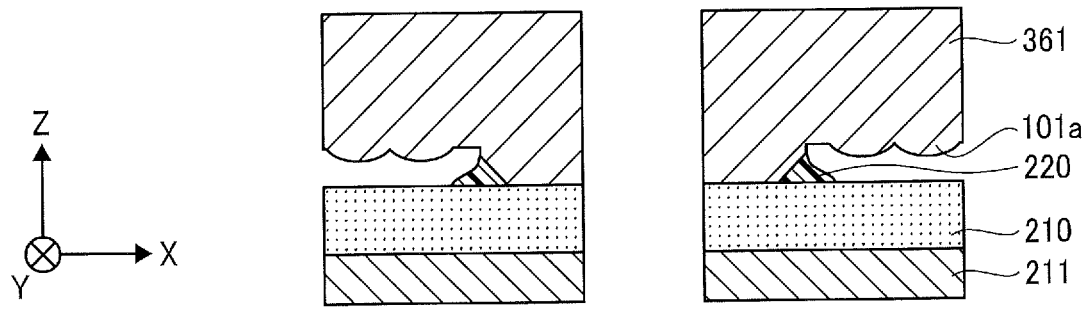
FIG. 37C is a third sectional view illustrating a method of manufacturing an optical device, according to the third embodiment of the present disclosure.

FIG. 37A to FIG. 37C are sectional views illustrating a method of manufacturing the optical device 3 according to the third embodiment of the present disclosure.

As illustrated in FIG. 36A and FIG. 36B, in the large-format MLA substrate 361 used in the third embodiment of the present disclosure, a spacer 361b that is shared by the neighboring MLA substrates 101 is arranged. The spacer 361b is placed on the dicing line, and the width W2 of a bottom face 361d of the spacer 361b is wider than the width W1 of the dicing blade.

In the third embodiment of the present disclosure, the MLA substrate 361 is prepared, and in a similar manner to the second embodiment, the assembly of the VCSEL array substrate 210 and the submount substrate 211 is implemented on a device to be implemented, and the adhesive 220 is applied to such a device to be implemented. Then, as illustrated in FIG. 37A, the relative positions of the MLA substrate 361 and the assembly of the VCSEL array substrate 210 and the submount substrate 211 are adjusted with a high degree of precision. Then, as illustrated in FIG. 37B, the MLA substrate 361 and the assembly of the VCSEL array substrate 210 and the submount substrate 211 are bonded together. Then, as illustrated in FIG. 37C, a composite of the assembly and the MLA substrate 361 is cut into separate pieces, using a dicing machine, along the center of the spacer 361b in the width direction. Finally, the manufacturing of the optical device 3 is complete after the inspection.

In the third embodiment of the present disclosure, an MLA substrate is cut into separate pieces along the center of the spacer 361b in the width direction. Accordingly, the sides of the spacer 361b that appear due to the cutting processes become contiguous with the VCSEL array substrate 110. Due to this configuration, at least, each of the spacers 361b contacts the VCSEL array substrate 110 at some of the corners of the MLA substrate 101, and contacts the VCSEL array substrate 110 at some of the outer region of the MLA substrate 101. Accordingly, the outer region that includes the corners of the MLA substrate 101 is protected by the VCSEL array substrate 110 from the lower side, and the chances of chipping can be reduced.

Modification of Third Embodiment

A modification of the third embodiment of the present disclosure is described below. The modification of the third embodiment of the present disclosure is different from the third embodiment in the respect that the modification of the third embodiment adopts a step cut method to cut an MLA substrate into separate pieces.

Figure 38A:
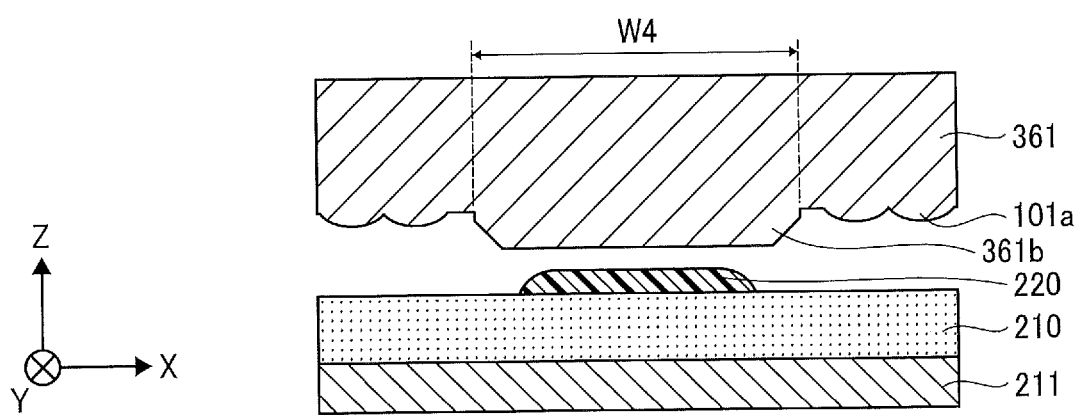
FIG. 38A is a first sectional view illustrating a method of manufacturing an disclosure.
Figure 38B:
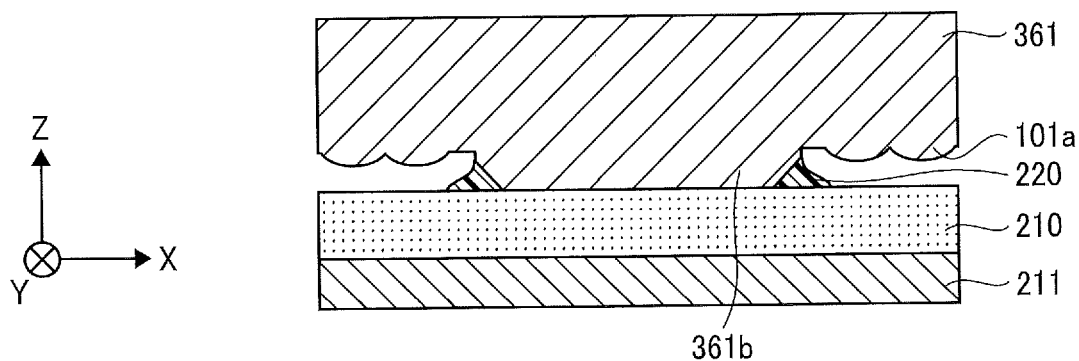
FIG. 38B is a second sectional view illustrating a method of manufacturing an optical device, according to a modification of the third embodiment of the present disclosure.
Figure 38C:
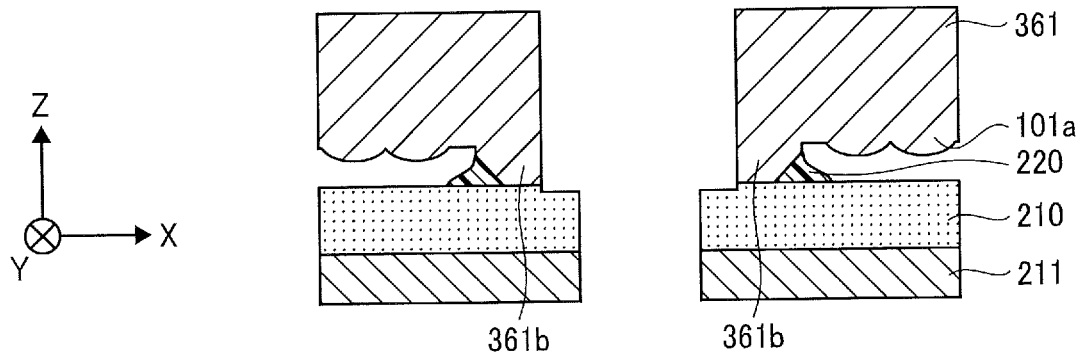
FIG. 38C is a third sectional view illustrating a method of manufacturing an optical device, according to a modification of the third embodiment of the present disclosure.

FIG. 38A to FIG. 38C are sectional views illustrating a method of manufacturing the optical device 3 according to a modification the third embodiment of the present disclosure.

In the modification of the third embodiment of the present disclosure, the MLA substrate 361 is prepared, and in a similar manner to the second embodiment, the assembly of the VCSEL array substrate 210 and the submount substrate 211 is implemented on a device to be implemented, and the adhesive 220 is applied to such a device to be implemented. Then, as illustrated in FIG. 38A, the relative positions of the MLA substrate 361 and the assembly of the VCSEL array substrate 210 and the submount substrate 211 are adjusted with a high degree of precision, and then as illustrated in FIG. 38B, the MLA substrate 361 and the assembly of the VCSEL array substrate 210 and the submount substrate 211 are bonded together. Then, as illustrated in FIG. 37C, a dicing machine is used, and a composite of the assembly and the MLA substrate 361 is cut into separate pieces, using a step cut method, along the center of the spacer 361b in the width direction. In other words, the first dicing blade is used to cut the assembly into separate pieces, and then the second dicing blade whose width is narrower (thinner) than the first dicing blade is used to cut the VCSEL array substrate 110 and the submount substrate 111 into separate pieces. For example, a dicing blade suitable for cutting glass is used as the first dicing blade. For example, a dicing blade suitable for cutting a compound semiconductor is used as the second dicing blade. Finally, the manufacturing of the optical device 3 is complete after the inspection.

In the present modification of the above embodiment, an MLA substrate is cut into separate pieces along the center of the spacer 361b in the width direction. Accordingly, the sides of the spacer 361b that appear due to the cutting processes reach the VCSEL array substrate 110. Due to this configuration, at least, each of the spacers 361b contacts the VCSEL array substrate 110 at some of the corners of the MLA substrate 101, and contacts the VCSEL array substrate 110 at some of the outer region of the MLA substrate 101. Accordingly, the outer region that includes the corners of the MLA substrate 101 is protected by the VCSEL array substrate 110 from the lower side, and the chances of chipping can be reduced. When the VCSEL array substrate 110 and the submount substrate 111 are cut into separate pieces using the second dicing blade, the outer region that includes the corners of the MLA substrate 101 is kept protected by the VCSEL array substrate 110 from the lower side.

When a step cut method is adopted, the first dicing blade can be used to cut the MLA substrate 361, and the second dicing blade can be used to cut the VCSEL array substrate 210 and the submount substrate 211. The dominant materials for the MLA substrate 361 are differences from the dominant materials for the VCSEL array substrate 210 and the submount substrate 211. Due to this configuration, cutting processes can be performed under more desirable conditions, and the chances of chipping can be reduced with even greater reliability.

According to the third embodiment and the modification of the third embodiment of the present disclosure, the spacer 361b is shared by the neighboring MLA substrates 101. Due to this configuration, compared with the configuration according to the second embodiment of the present disclosure, the distance between the neighboring pair of optically-effective regions can be shortened. In other words, the width W4 of the spacer 361b at the base (see FIG. 37A and FIG. 38A) can be made shorter than the distance W3 between the outer edges of the neighboring pair of spacers 201b on the optically-effective region side (see, for example, FIG. 33A) in the second embodiment of the present disclosure. Due to such a configuration, the chip size of the optical device can be reduced, or the number of chips that can be obtained from one wafer can be increased. Moreover, the cost can be reduced as the number of obtainable chips increases.

Fourth Embodiment

A fourth embodiment of the present disclosure is described below. The planar shape of the spacer according to the fourth embodiment of the present disclosure is different from the planar shape of the spacer according to the second embodiment of the present disclosure.

Figure 39A:
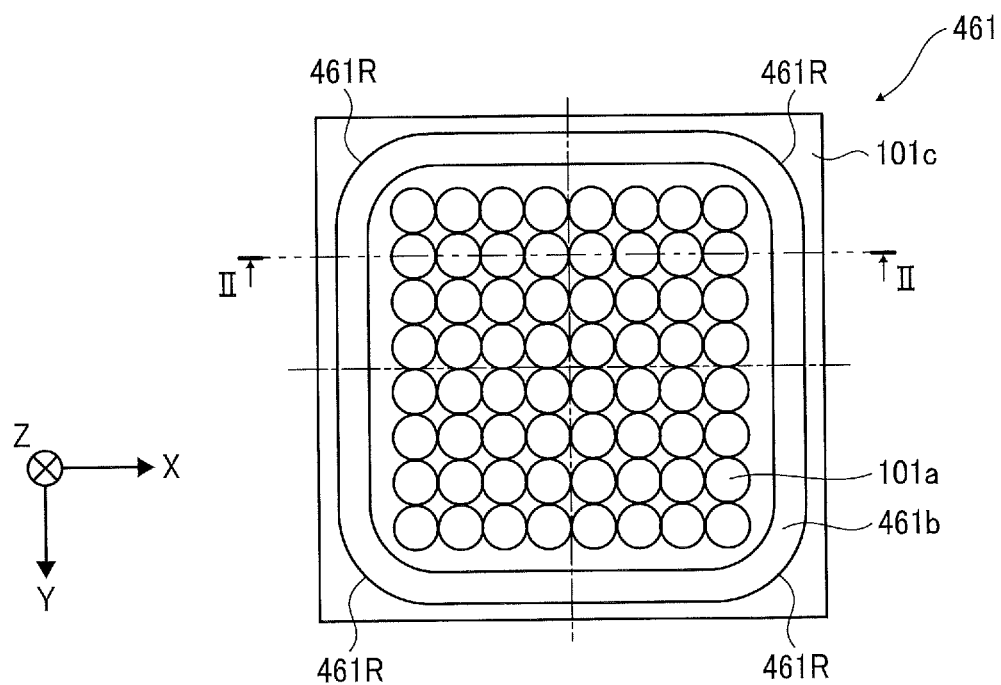
FIG. 39A is a bottom view of an MLA substrate according to a fourth embodiment of the present disclosure.

FIG. 39A is a bottom view of the MLA substrate 101 according to the fourth embodiment of the present disclosure.

Figure 39B:
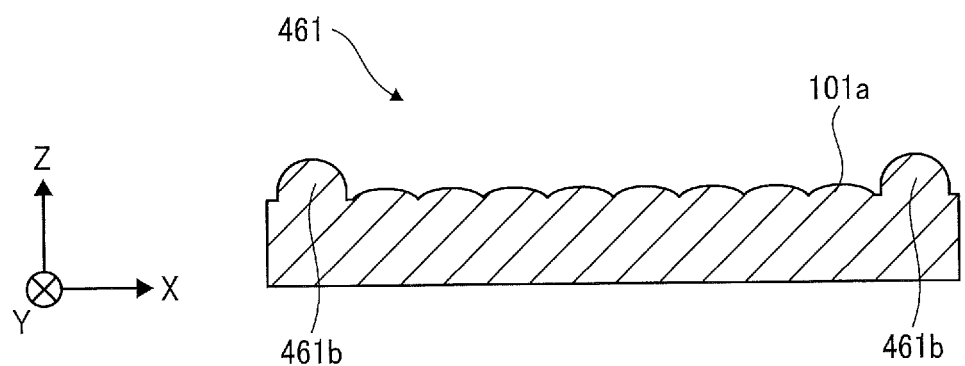
FIG. 39B is a sectional view of an MLA substrate according to the fourth embodiment of the present disclosure.

FIG. 39B is a sectional view of the MLA substrate 101 according to the fourth embodiment of the present disclosure.

More specifically, FIG. 39B is a diagram illustrating a cross-sectional view along line II-II of FIG. 39A.

The optical device according to the fourth embodiment of the present disclosure includes an MLA substrate 461 in place of the MLA substrate 101 according to the second embodiment of the present disclosure provided with the spacers 101b whose planar shape is square-shaped. The MLA substrate 461 is provided with a spacer 461b that continuously surrounds a microlens array composed of a plurality of microlenses 101a. The spacer 461b has a square shape in a planar view where the four corners are rounded. In other words, the planar shape of the outer edge of the spacer 461b is rounder than the planar shape of the MLA substrate 461.

In a similar manner to the modification of the first embodiment described above, the spacer 461b has a curved face on the bottom side. However, no limitation is indicated thereby, and an oblique face may be formed like the first embodiment of the present disclosure, or a step may be formed like the spacer 954.

The other aspects of the configuration according to the present embodiment are equivalent to those of the second embodiment of the second embodiment of the present disclosure as described above.

Also with the fourth embodiment of the present disclosure, advantageous effects similar to those of the second embodiment as described above can be achieved.

As known in the art, the expansion rate of an MLA substrate is different from the expansion rate of a VCSEL array substrate. For this reason, when the temperature changes in a state where these elements are combined together, the force that prevents the expansion and contraction of these elements is caused near the joint. Thermal expansion or thermal contraction is caused, for example, when bonding processes are performed at high temperature and when the completed optical device is used under high-temperature environments of 100 degrees Celsius ° C. or low-temperature environments of −40 degrees Celsius ° C. Moreover, at a portion where the distance to the center of the optical device is longer, the amount of displacement due to thermal expansion or thermal contraction in the relative positions of the MLA substrate and the VCSEL array substrate is greater, and the force that prevents the displacement, which is caused near the joint, is greater.

In the fourth embodiment of the present disclosure, the four corners of the spacer 461b are rounded. For this reason, the distance between the center of the MLA substrate 461 and the four corners is shorter than the distance between the center of the MLA substrate 101 and the four corners according to the second embodiment of the present disclosure. Accordingly, the maximum stress that could be applied to the joint when the temperature changes can be reduced, and the chances of exfoliation or peeling off due to thermal stress can be reduced.

First Modification of Fourth Embodiment

A first modification of the fourth embodiment of the present disclosure is described below. The planar shape of the spacer 101b according to the first modification of the fourth modification of the present disclosure is different from the planar shape of the spacer 101b according to the fourth embodiment of the present disclosure.

Figure 40A:
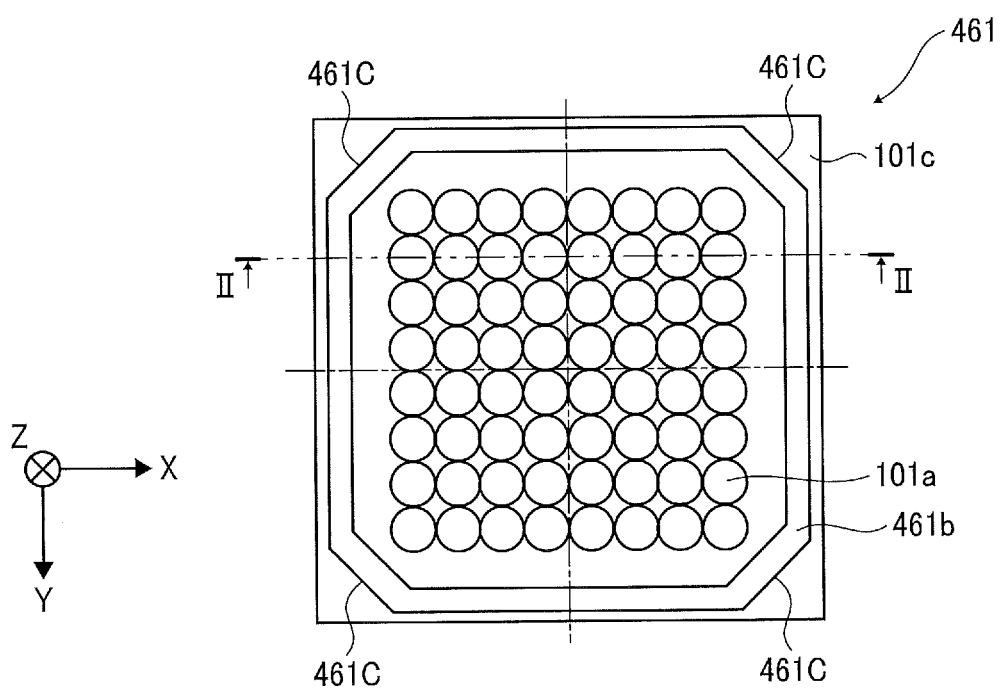
FIG. 40A is a bottom view of an MLA substrate according to a first modification of the fourth embodiment of the present disclosure.

FIG. 40A is a bottom view of the MLA substrate 461 according to the first modification of the fourth embodiment of the present disclosure.

Figure 40B:
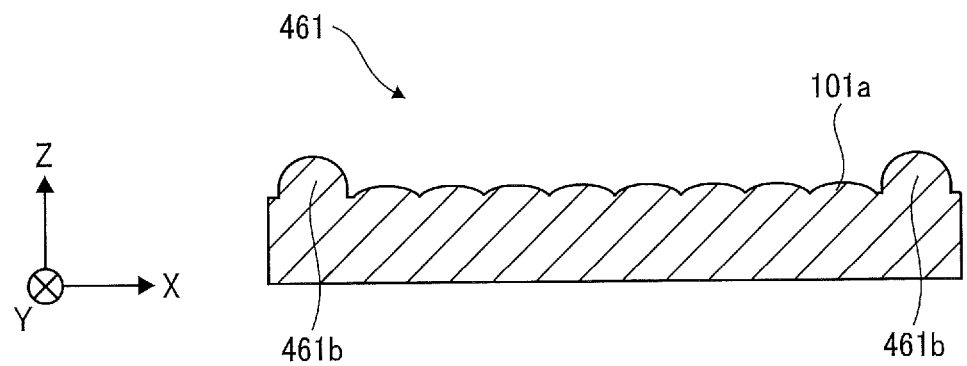
FIG. 40B is a sectional view of an MLA substrate according to the first modification of the fourth embodiment of the present disclosure.

FIG. 40B is a sectional view of the MLA substrate 461 according to the first modification of the fourth embodiment of the present disclosure.

More specifically, FIG. 40B is a diagram illustrating a cross-sectional view along line II-II of FIG. 40A.

In the first modification of the fourth embodiment of the present disclosure, the spacer 461b has a square shape in a planar view where the four corners are, for example, chamfered. In other words, also in the first modification of the first embodiment of the present disclosure, the planar shape of the outer edge of the spacer 461b is rounder than the planar shape of the MLA substrate 461.

In the first modification of the fourth embodiment of the present disclosure, the four corners of the spacer 461b are, for example, chamfered. For this reason, the distance between the center of the MLA substrate 461 and the four corners is shorter than the distance between the center of the MLA substrate 101 and the four corners according to the second embodiment of the present disclosure. Accordingly, the maximum stress that could be applied to the joint when the temperature changes can be reduced, and the chances of exfoliation or peeling off due to thermal stress can be reduced.

Second Modification of Fourth Embodiment

A second modification of the fourth embodiment of the present disclosure is described below. The planar shape of the spacer according to the second modification of the fourth embodiment of the present disclosure is different from the planar shape of the spacer according to the fourth embodiment of the present disclosure.

Figure 41A:
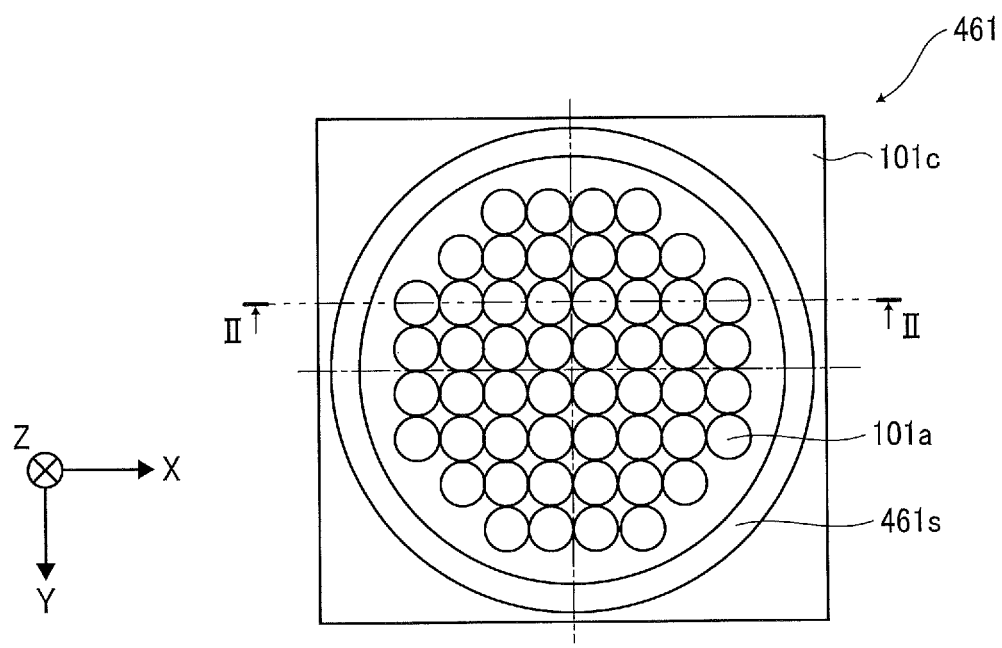
FIG. 41A is a bottom view of an MLA substrate according to a second modification of the fourth embodiment of the present disclosure.

FIG. 41A is a bottom view of the MLA substrate 461 according to the second modification of the fourth embodiment of the present disclosure.

Figure 41B:
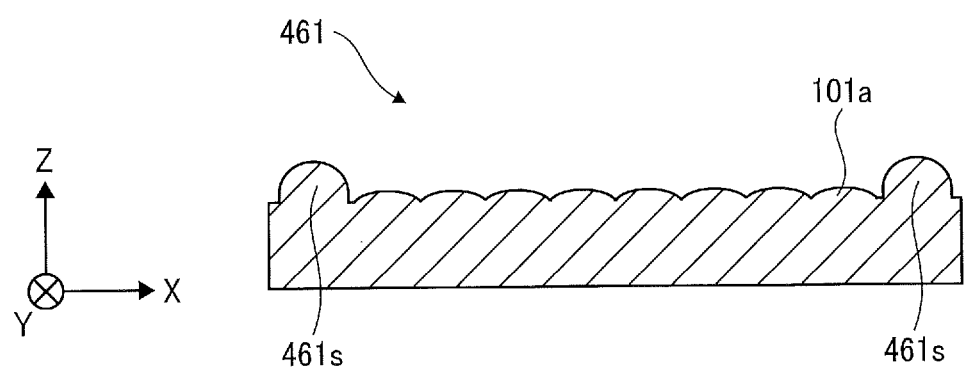
FIG. 41B is a sectional view of an MLA substrate according to the second modification of the fourth embodiment of the present disclosure.

FIG. 41B is a sectional view of the MLA substrate 101 according to the second modification of the fourth embodiment of the present disclosure.

More specifically, FIG. 41B is a diagram illustrating a cross-sectional view along line II-II of FIG. 41A.

In the second modification of the fourth embodiment of the present disclosure, the spacer 461b has a perfectly-circular doughnut-shaped planar shape. In other words, also in the second modification of the fourth embodiment of the present disclosure, the planar shape of the outer edge of the spacer 461b is rounder than the planar shape of the MLA substrate 461. The number of the microlenses 101a and the number of the VCSEL devices 110a may be smaller than those of the second embodiment of the present disclosure. The spacer 461b may have an elliptical doughnut-shaped planar shape.

In the second modification of the embodiments of the present disclosure, the spacer 461b has a doughnut-shaped planar shape. For this reason, the distances from the center of the MLA substrate 461 to each part of the spacer 461b is shorter than the distance between the center of the MLA substrate 101 and the four corners according to the second embodiment of the present disclosure. Accordingly, the maximum stress that could be applied to the joint when the temperature changes can be reduced, and the chances of exfoliation or peeling off due to thermal stress can be reduced.

The photo-electric element is not limited to a light-emitting element, but a light receiver such as a solid-state image sensing device may be used as a photo-electric element.

Fifth Embodiment

A fifth embodiment of the present disclosure is described below. The fifth embodiment of the present disclosure relates to the light-source device 11 provided with an optical device (laser-beam source module) according to one of the first to fourth embodiments (and modifications of these embodiments) of the present disclosure and a detector.

Figure 42:
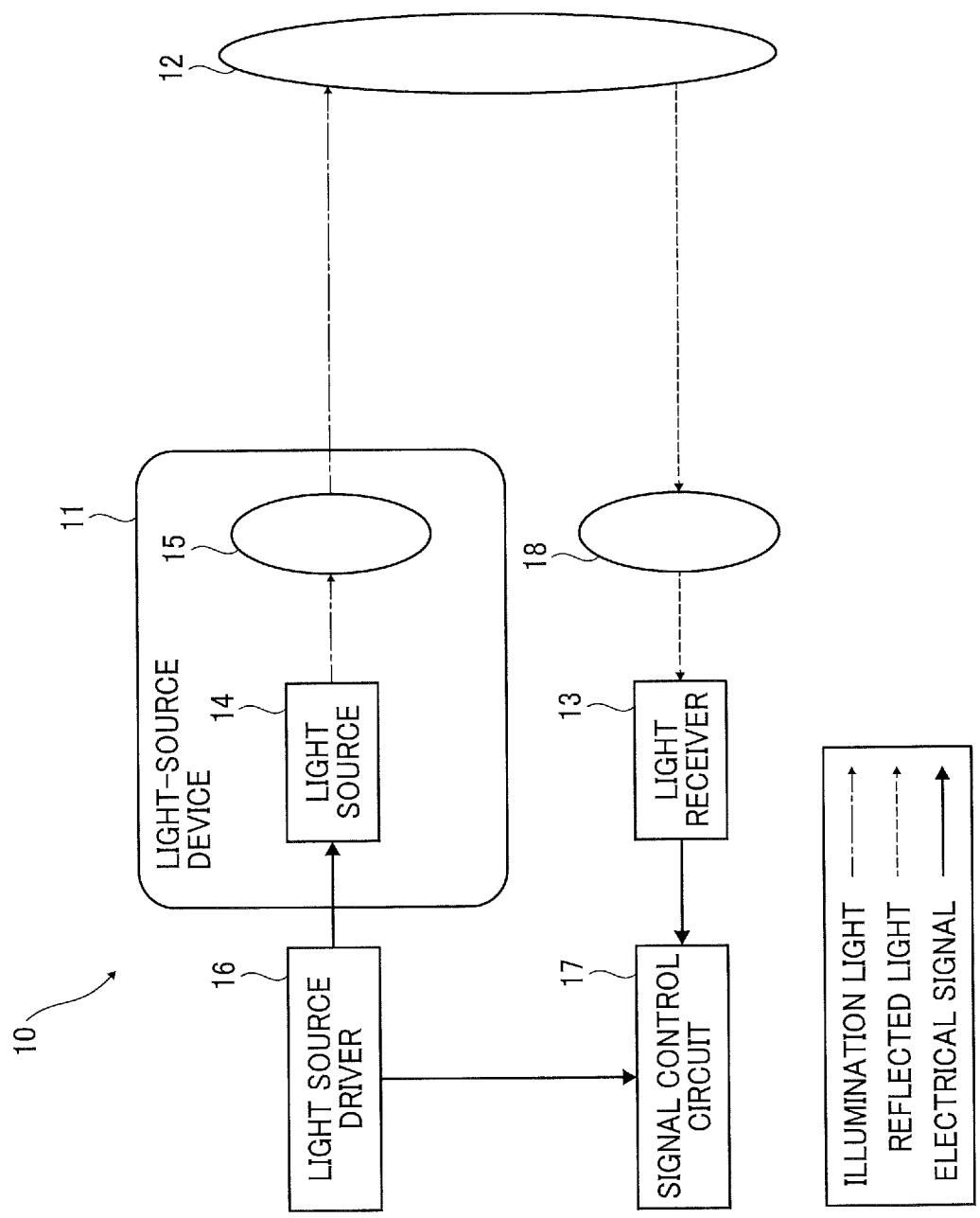
FIG. 42 is a diagram illustrating a schematic configuration of a distance-measuring apparatus as an example of detector.

FIG. 42 is a diagram illustrating a schematic configuration of the distance-measuring apparatus 10 as an example of detector.

The distance-measuring apparatus 10 includes a light-source device 11. The distance-measuring apparatus 10 is a distance detector that adopts a time-of-flight (TOF) method. More specifically, the distance-measuring apparatus 10 controls the light-source device 11 to emit pulsed light towards an object to be detected 12, and uses a light receiver 13 to receive the light reflected from the object to be detected 12. Then, the distance-measuring apparatus 10 measures the distance to the object to be detected 12 based on the length of time it took to receive the reflected light As illustrated in FIG. 42, the light-source device 11 includes a light source 14 and an optical system 15. The light source 14 is provided with a surface-emitting laser device according to one of the first to fourth embodiments of the present disclosure, and its light emission is controlled as an electric current is sent from the light source driver 16. When the light source 14 is controlled to emit light, the light source driver 16 sends a signal to the signal control circuit 17. The optical system 15 includes an optical element such as a lens, a diffractive-optical element, and a prism that adjusts the divergence angle or direction of the light emitted from the light source 14, and irradiates an object to be detected 12 with the light.

The light that is emitted from the light-source device 11 and then reflected by the object to be detected 12 is guided to the light receiver 13 through the light-receptive optical system 18 that has a light-concentrating function. The light receiver 13 includes a photoelectric conversion element. The light that is received by the light receiver 13 is photoelectrically converted by the photoelectric conversion element, and the photoelectrically-converted light is sent to the signal control circuit 17 as an electrical signal. The signal control circuit 17 calculates the distance to the object to be detected 12 based on the time difference between the timing of light emission (i.e., the timing at which a flash signal is input from the light source driver 16) and the timing of light reception (i.e., the timing at which a light signal is input from the light receiver 13). Accordingly, in the distance-measuring apparatus 10, the light-receptive optical system 18 and the light receiver 13 serve as a detection system on which the light that is emitted from the light-source device 11 and then reflected by the object to be detected 12 is incident. The signal control circuit 17 may be configured so as to obtain, for example, the information about the presence or absence of the object to be detected 12 and the relative velocity of the object to be detected 12, based on a signal sent from the light receiver 13.

Sixth Embodiment

A sixth embodiment of the present disclosure is described below. The sixth embodiment relates to a distance-measuring apparatus 400. The distance-measuring apparatus 400 is an example of optical device.

Figure 43:
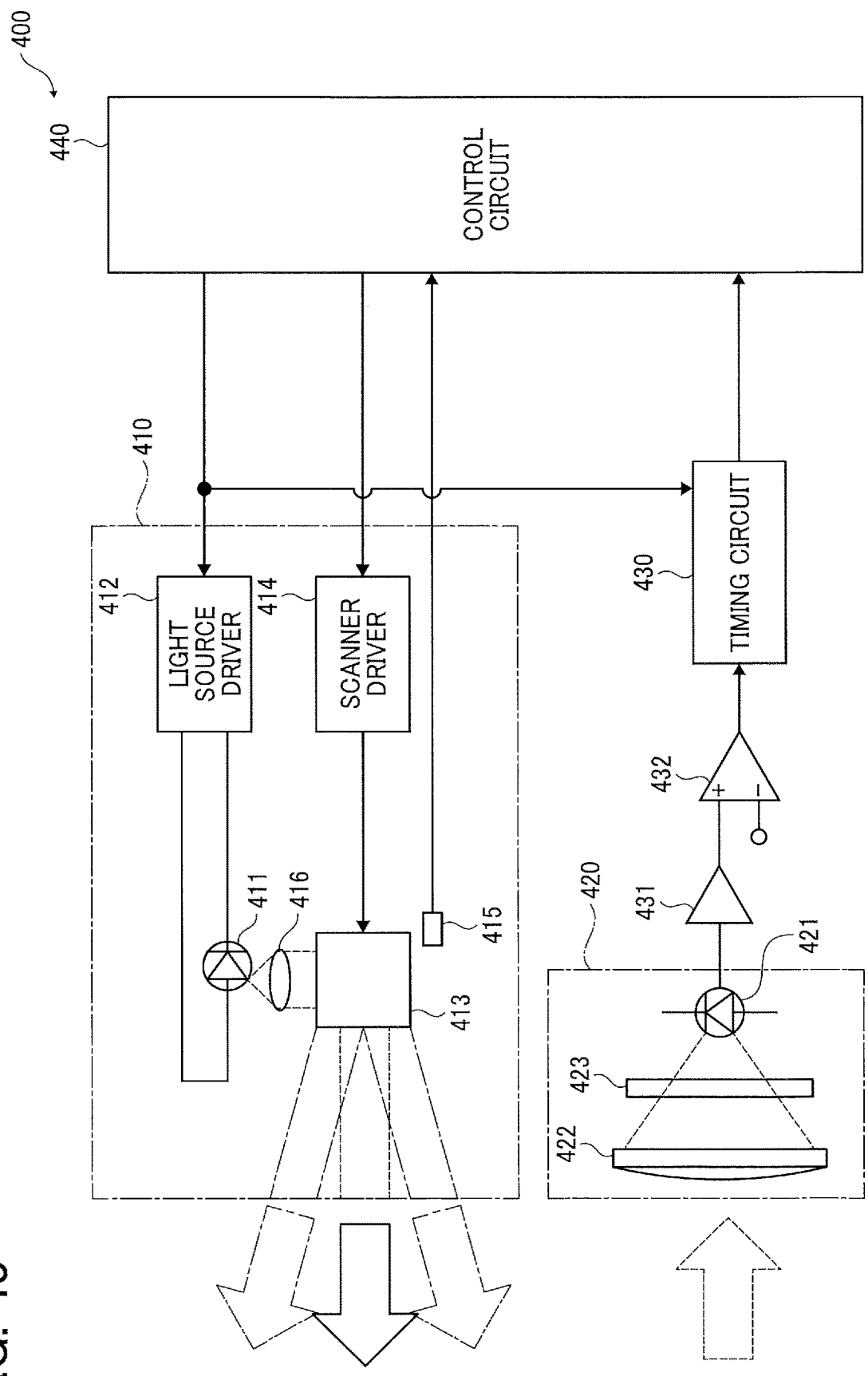
FIG. 43 is a diagram illustrating a configuration of a distance-measuring apparatus according to a sixth embodiment of the present disclosure.

FIG. 43 is a diagram illustrating a configuration of the distance-measuring apparatus 400 according to the sixth embodiment of the present disclosure.

The distance-measuring apparatus 400 according to the sixth embodiment of the present disclosure includes a light-emitting unit 410, a light receiver 420, a timing circuit 430, and a control circuit 440.

For example, the light-emitting unit 410 includes a light source 411, a light source driver 412, an optical scanner 413, a scanner driver 414, a scanning-angle monitor 415, and a projection lens 416. The light source 411 is provided with an optical device (laser-beam source module) according to one of the first to fourth embodiments (and modifications of these embodiments) of the present disclosure. The light source driver 412 drives the light source 411 based on the driving signal output from the control circuit 440. The optical scanner 413 includes, for example, a micro-electromechanical systems (MEMS) mirror or a polygon mirror. The scanner driver 414 drives the optical scanner 413 based on the driving signal output from the control circuit 440. The vertical-cavity surface-emitting lasers (VCSEL) module of the light source 411 includes a plurality of sub-light-emitting areas. Each one of the multiple sub-light-emitting areas includes at least one VCSEL device, and the VCSEL devices of each one of the multiple sub-light-emitting areas are electrically connected to each other in parallel. The multiple sub-light-emitting areas are one-dimensionally arranged in the sub-scanning direction of the optical scanner 413, and can be driven in an individual manner. For example, the light source driver 412 drives the vertical-cavity surface-emitting lasers (VCSEL) module of the light source 411 with pulse current on the order of nanoseconds (ns). The laser beams that are emitted from the VCSEL device are converted into the light of desired beam profile, where appropriate, by the projection lens 416 or the like. Then, the irradiation direction of the light is determined by the optical scanner 413, and the light is emitted to the outside of the distance-measuring apparatus 400. The scanning angle of the optical scanner 413 is measured by the scanning-angle monitor 415, and the result of such measurement is output to the control circuit 440. Each one of the optical scanner 413 and the projection lens 416 is an example of a second optical element.

The laser beams that are emitted to the outside of the distance-measuring apparatus 400 are reflected by an object, and return to the distance-measuring apparatus 400 and reaches the light receiver 420.

For example, the light receiver 420 includes a light receiver 421, a light-receptive lens 422, and a band-pass filter 423. The light receiver 421 includes an avalanche photodiode (APD) device made of silicon (Si). The light-receptive lens 422 makes the light that has reached the light receiver 420 converge to the light receiver 421. The band-pass filter 423 includes a dielectric multilayer, and is designed to let only the light of oscillation wavelength of the light source 411 pass Due to the band-pass filter 423, the signal-to-noise (SN) ratio of signals can be improved.

The light that has reached the light receiver 421 is converted into an electrical signal by the light receiver 421, and is input to the timing circuit 430 through an amplifier and a comparator 432. The electrical signal may be processed by the amplifier 431 or the comparator 432 on an as-needed basis.

A driving signal for the light source 411 that is output from the control circuit 440 and a signal that is sent from the light receiver 421 are input to the timing circuit 430. The timing circuit 430 calculates the delay time between these two kinds of signals, and outputs the result of calculation to the control circuit 440.

The control circuit 440 obtains the information about the distance to an object to be detected, based on a result of conversion performed on the delay time sent from the timing circuit 430.

According to the distance-measuring apparatus 400 as described above, the distance to the object is measured, and laser beams are sequentially emitted to the sub-light-emitting areas of a VCSEL module and the regions of space that are split by the optical scanner 413. Due to this configuration, two-dimensional distance information can be obtained. For example, this distance-measuring apparatus 400 may be used for light detection and ranging (LiDAR).

An electronic device may be controlled based on the information obtained from a detector according to at least one of the above embodiments of the present disclosure. For example, such an electronic device may be an information terminal, or a movable machine having a movable part. More specifically, user authentication may be performed on an information terminal or the operation of an autonomous robot may be controlled, based on the information obtained from a detector according to at least one of the above embodiments of the present disclosure. Alternatively, the results of detection that are obtained by a detector according to at least one of the above embodiments of the present disclosure, which are the information about the situation inside or outside a mobile object such as a vehicle, may be used for a driver-assistance system.

The optical device according to the embodiments or their modifications of the present disclosure may be used for a pump source or excitation light source of solid-state laser, instead of the light source of a distance-measuring apparatus. Moreover, the optical device according to the embodiments or their modifications of the present disclosure may be used as a light-source device such as a projector, in combination with an optical element that converts the wavelength of the light exiting from a surface-emitting laser module such as a fluorescent material.

Note that numerous additional modifications and variations are possible in light of the above teachings. It is therefore to be understood that within the scope of the appended claims, the disclosure of the present disclosure may be practiced otherwise than as specifically described herein. For example, elements and/or features of different illustrative embodiments may be combined with each other and/or substituted for each other within the scope of this disclosure and appended claims.

What is claimed is:

1. An optical device comprising:
a first substrate having a first plane and a plurality of elements, the plurality of elements being disposed on the first substrate to emit or receive light in a direction intersecting with the first plane; and
a second substrate having a second face that faces the first plane, the second substrate being provided with a plurality of lenses disposed to correspond to the plurality of elements, the second substrate extending in a first direction parallel to the second face to contact the first plane, the second substrate having a joint used to determine spacing between the first substrate and the second substrate, the joint contacting the first substrate with an area smaller than a maximum size of cross-sectional area parallel to the second face of the joint,
wherein the joint includes a first part contacting the first substrate, and a second part apart from the first substrate and intersecting with a normal to the second face, said second part being provided on both of opposite sides of the first part, and
wherein the joint and the first substrate are attached together through an adhesive.

2. The optical device according to claim 1, wherein the adhesive is disposed between the first plane and the second part.

3. The optical device according to claim 1, wherein the joint continuously surrounds the plurality of lenses in a planar view of the second face.

4. The optical device according to claim 3, wherein the joint has a rounder shape at an outer edge in the planar view than another part of the second substrate.

5. The optical device according to claim 1, wherein the joint contacts the first substrate through at least some of an outer region of the second substrate.

6. The optical device according to claim 1, wherein the joint is made of a same material as the second substrate.

7. The optical device according to claim 1, wherein the second part has an oblique face that is oblique relative to the first plane and oblique relative to a direction that is perpendicular to the first plane.

8. A light-source device comprising:
an optical device including
a first substrate having a first plane and a plurality of elements, the plurality of elements being disposed on the first substrate to emit or receive light in a direction intersecting with the first plane, and
a second substrate having a second face that faces the first plane, the second substrate being provided with a plurality of lenses disposed to correspond to the plurality of elements, the second substrate extending in a first direction parallel to the second face to contact the first plane, the second substrate having a joint used to determine spacing between the first substrate and the second substrate, the joint contacting the first substrate with an area smaller than a maximum size of cross-sectional area parallel to the second face of the joint; and
a driver configured to drive the optical device,
wherein each one of the plurality of elements is an element to emit light,
wherein the joint includes a first part contacting the first substrate, and a second part apart from the first substrate and intersecting with a normal to the second face, said second part being provided on both of opposite sides of the first part, and
wherein the joint and the first substrate are attached together through an adhesive.

9. A detector comprising:
the light-source device according to claim 8; and
a detection system to which light emitted from the light-source device and reflected by an object is incident.

10. An electronic device comprising a controller configured to control the electronic device based on information obtained from the detector according to claim 9.

* * * * *